United States Patent
Ogami et al.

(10) Patent No.: US 7,844,437 B1
(45) Date of Patent: Nov. 30, 2010

(54) SYSTEM AND METHOD FOR PERFORMING NEXT PLACEMENTS AND PRUNING OF DISALLOWED PLACEMENTS FOR PROGRAMMING AN INTEGRATED CIRCUIT

(75) Inventors: Kenneth Y. Ogami, Bothell, WA (US); Frederick R. Hood, III, Auburn, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1120 days.

(21) Appl. No.: 09/989,762

(22) Filed: Nov. 19, 2001

(51) Int. Cl.
G06F 17/50 (2006.01)
(52) U.S. Cl. ........................................ 703/14
(58) Field of Classification Search ................ 703/27, 703/14, 13; 716/8, 12, 17; 715/824, 835, 715/781
See application file for complete search history.

(56) References Cited

U.S. PATENT DOCUMENTS

| | | |
|---|---|---|
| 3,600,690 A | 8/1971 | White |
| 3,725,804 A | 4/1973 | Langan |
| 3,740,588 A | 6/1973 | Stratton et al. |
| 3,805,245 A | 4/1974 | Brooks et al. |
| 3,810,036 A | 5/1974 | Bloedorn |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,475,151 A | 10/1984 | Philipp |
| 4,497,575 A | 2/1985 | Philipp |
| 4,604,363 A | 8/1986 | Newhouse et al. |

(Continued)

FOREIGN PATENT DOCUMENTS

DE  19710829 A1  9/1998

(Continued)

OTHER PUBLICATIONS

PSOC Designer: Integrated Development Environment, User Guide Revision 1.09, Cypress MicroSystems, Inc, May 30, 2001.*

(Continued)

*Primary Examiner*—Paul Rodriguez
*Assistant Examiner*—Luke Osborne

(57) ABSTRACT

A system and method for matching the hardware resource requirements of a user module with the available resources of an underlying integrated circuit is shown. Databases are utilized to describe the requirements of a particular user module and the resources of a particular chip. A graphical interface is utilized to relate a selected user module with potentially appropriate resources, and to illustrate alternative placements. This graphical interface utilizes highlights of both the module and the associated resource in patterns, grayscales, or colors to graphically illustrate the relationship between the module and the associated resource.

32 Claims, 11 Drawing Sheets

U.S. PATENT DOCUMENTS

| | | | |
|---|---|---|---|
| 4,608,502 A | 8/1986 | Dijkmans et al. | |
| 4,656,603 A * | 4/1987 | Dunn | 715/835 |
| 4,670,838 A | 6/1987 | Kawata | |
| 4,689,740 A | 8/1987 | Moelands et al. | |
| 4,692,718 A | 9/1987 | Roza et al. | |
| 4,701,907 A | 10/1987 | Collins | |
| 4,727,541 A | 2/1988 | Mori et al. | |
| 4,736,097 A | 4/1988 | Philipp | |
| 4,740,966 A | 4/1988 | Goad | |
| 4,755,766 A | 7/1988 | Metz | |
| 4,773,024 A | 9/1988 | Faggin et al. | |
| 4,794,558 A | 12/1988 | Thompson | |
| 4,802,103 A | 1/1989 | Faggin et al. | |
| 4,802,119 A | 1/1989 | Heene et al. | |
| 4,807,183 A | 2/1989 | Kung et al. | |
| 4,809,345 A | 2/1989 | Tabata et al. | |
| 4,812,664 A | 3/1989 | Borden | |
| 4,813,013 A | 3/1989 | Dunn | |
| 4,827,401 A | 5/1989 | Hrustich et al. | |
| 4,831,546 A | 5/1989 | Mitsuta et al. | |
| 4,833,418 A | 5/1989 | Quintus et al. | |
| 4,868,525 A | 9/1989 | Dias | |
| 4,876,466 A | 10/1989 | Kondou et al. | |
| 4,876,534 A | 10/1989 | Mead et al. | |
| 4,878,200 A | 10/1989 | Asghar et al. | |
| 4,879,461 A | 11/1989 | Philipp | |
| 4,879,688 A | 11/1989 | Turner et al. | |
| 4,885,484 A | 12/1989 | Gray | |
| 4,907,121 A | 3/1990 | Hrassky | |
| 4,935,702 A | 6/1990 | Mead et al. | |
| 4,939,637 A | 7/1990 | Pawloski | |
| 4,942,540 A | 7/1990 | Black et al. | |
| 4,947,169 A | 8/1990 | Smith et al. | |
| 4,953,928 A | 9/1990 | Anderson et al. | |
| 4,962,342 A | 10/1990 | Mead et al. | |
| 4,964,074 A | 10/1990 | Suzuki et al. | |
| 4,969,087 A | 11/1990 | Tanagawa et al. | |
| 4,970,408 A | 11/1990 | Hanke et al. | |
| 4,972,372 A | 11/1990 | Ueno | |
| 4,977,381 A | 12/1990 | Main | |
| 4,980,652 A | 12/1990 | Tarusawa et al. | |
| 4,999,519 A | 3/1991 | Kitsukawa et al. | |
| 5,043,674 A | 8/1991 | Bonaccio et al. | |
| 5,049,758 A | 9/1991 | Mead et al. | |
| 5,050,168 A | 9/1991 | Paterson | |
| 5,053,949 A | 10/1991 | Allison et al. | |
| 5,055,827 A | 10/1991 | Philipp | |
| 5,059,920 A | 10/1991 | Anderson et al. | |
| 5,068,622 A | 11/1991 | Mead et al. | |
| 5,073,759 A | 12/1991 | Mead et al. | |
| 5,083,044 A | 1/1992 | Mead et al. | |
| 5,095,284 A | 3/1992 | Mead | |
| 5,097,305 A | 3/1992 | Mead et al. | |
| 5,099,191 A | 3/1992 | Galler et al. | |
| 5,107,146 A | 4/1992 | El-Ayat | |
| 5,107,149 A | 4/1992 | Platt et al. | |
| 5,109,261 A | 4/1992 | Mead et al. | |
| 5,119,038 A | 6/1992 | Anderson et al. | |
| 5,120,996 A | 6/1992 | Mead et al. | |
| 5,122,800 A | 6/1992 | Philipp | |
| 5,126,685 A | 6/1992 | Platt et al. | |
| 5,127,103 A | 6/1992 | Hill et al. | |
| 5,128,871 A | 7/1992 | Schmitz | |
| 5,136,188 A | 8/1992 | Ha et al. | |
| 5,140,197 A | 8/1992 | Grider | |
| 5,142,247 A | 8/1992 | Lada et al. | |
| 5,144,582 A | 9/1992 | Steele | |
| 5,146,106 A | 9/1992 | Anderson et al. | |
| 5,150,079 A | 9/1992 | Williams et al. | |
| 5,155,836 A | 10/1992 | Jordan et al. | |
| 5,159,292 A | 10/1992 | Canfield et al. | |
| 5,159,335 A | 10/1992 | Veneruso | |
| 5,160,899 A | 11/1992 | Anderson et al. | |
| 5,161,124 A | 11/1992 | Love | |
| 5,165,054 A | 11/1992 | Platt et al. | |
| 5,166,562 A | 11/1992 | Allen et al. | |
| 5,175,884 A | 12/1992 | Suarez | |
| 5,179,531 A | 1/1993 | Yamaki | |
| 5,184,061 A | 2/1993 | Lee et al. | |
| 5,198,817 A | 3/1993 | Walden et al. | |
| 5,200,751 A | 4/1993 | Smith | |
| 5,202,687 A | 4/1993 | Distinti | |
| 5,204,549 A | 4/1993 | Platt et al. | |
| 5,206,582 A | 4/1993 | Ekstedt et al. | |
| 5,220,512 A | 6/1993 | Watkins et al. | |
| 5,225,991 A | 7/1993 | Dougherty | |
| 5,230,000 A | 7/1993 | Mozingo et al. | |
| 5,235,617 A | 8/1993 | Mallard, Jr. | |
| 5,241,492 A | 8/1993 | Girardeau, Jr. | |
| 5,243,554 A | 9/1993 | Allen et al. | |
| 5,245,262 A | 9/1993 | Moody et al. | |
| 5,248,843 A | 9/1993 | Billings | |
| 5,248,873 A | 9/1993 | Allen et al. | |
| 5,258,760 A | 11/1993 | Moody et al. | |
| 5,260,592 A | 11/1993 | Mead et al. | |
| 5,260,979 A | 11/1993 | Parker et al. | |
| 5,270,963 A | 12/1993 | Allen et al. | |
| 5,276,407 A | 1/1994 | Mead et al. | |
| 5,276,890 A | 1/1994 | Arai | |
| 5,280,199 A | 1/1994 | Itakura | |
| 5,280,202 A | 1/1994 | Chan et al. | |
| 5,289,023 A | 2/1994 | Mead | |
| 5,303,329 A | 4/1994 | Mead et al. | |
| 5,304,955 A | 4/1994 | Atriss et al. | |
| 5,305,017 A | 4/1994 | Gerpheide | |
| 5,305,312 A | 4/1994 | Fornek et al. | |
| 5,307,381 A | 4/1994 | Ahuja | |
| 5,313,618 A | 5/1994 | Pawloski | |
| 5,317,202 A | 5/1994 | Waizman | |
| 5,319,370 A | 6/1994 | Signore et al. | |
| 5,319,771 A | 6/1994 | Takeda | |
| 5,321,828 A | 6/1994 | Phillips et al. | |
| 5,324,958 A | 6/1994 | Mead et al. | |
| 5,325,512 A | 6/1994 | Takahashi | |
| 5,329,471 A | 7/1994 | Swoboda et al. | |
| 5,331,215 A | 7/1994 | Allen et al. | |
| 5,331,315 A | 7/1994 | Crosette | |
| 5,331,571 A | 7/1994 | Aronoff et al. | |
| 5,334,952 A | 8/1994 | Maddy et al. | |
| 5,335,342 A | 8/1994 | Pope et al. | |
| 5,336,936 A | 8/1994 | Allen et al. | |
| 5,339,213 A | 8/1994 | O'Callaghan | |
| 5,339,262 A | 8/1994 | Rostoker et al. | |
| 5,341,044 A | 8/1994 | Ahanin et al. | |
| 5,341,267 A | 8/1994 | Whitten et al. | |
| 5,345,195 A | 9/1994 | Cordoba et al. | |
| 5,349,303 A | 9/1994 | Gerpheide | |
| 5,355,097 A | 10/1994 | Scott et al. | |
| 5,357,626 A | 10/1994 | Johnson et al. | |
| 5,361,290 A | 11/1994 | Akiyama | |
| 5,371,524 A | 12/1994 | Herczeg et al. | |
| 5,371,860 A | 12/1994 | Mura et al. | |
| 5,371,878 A | 12/1994 | Coker | |
| 5,371,883 A | 12/1994 | Gross et al. | |
| 5,374,787 A | 12/1994 | Miller et al. | |
| 5,377,333 A | 12/1994 | Nakagoshi et al. | |
| 5,378,935 A | 1/1995 | Korhonen et al. | |
| 5,381,515 A | 1/1995 | Platt et al. | |
| 5,381,524 A | 1/1995 | Lewis et al. | |
| 5,384,467 A | 1/1995 | Plimon et al. | |
| 5,384,745 A | 1/1995 | Konishi et al. | |
| 5,384,910 A | 1/1995 | Torres | |
| 5,390,173 A | 2/1995 | Spinney et al. | |
| 5,392,784 A | 2/1995 | Gudaitis | |

| | | | | | | |
|---|---|---|---|---|---|---|
| 5,394,522 A | 2/1995 | Sanchez-Frank et al. | 5,574,678 A | 11/1996 | Gorecki | |
| 5,396,245 A | 3/1995 | Rempfer | 5,574,852 A | 11/1996 | Bakker et al. | |
| 5,398,261 A | 3/1995 | Marbot | 5,574,892 A | 11/1996 | Christensen | |
| 5,399,922 A | 3/1995 | Kiani et al. | 5,579,353 A | 11/1996 | Parmenter et al. | |
| 5,408,194 A | 4/1995 | Steinbach et al. | 5,587,945 A | 12/1996 | Lin et al. | |
| 5,414,308 A | 5/1995 | Lee et al. | 5,587,957 A | 12/1996 | Kowalczyk et al. | |
| 5,414,380 A | 5/1995 | Floyd et al. | 5,590,354 A | 12/1996 | Klapproth et al. | |
| 5,416,895 A | 5/1995 | Anderson et al. | 5,594,388 A | 1/1997 | O'Shaughnessy et al. | |
| 5,422,823 A | 6/1995 | Agrawal et al. | 5,594,734 A | 1/1997 | Worsley et al. | |
| 5,424,689 A | 6/1995 | Gillig et al. | 5,594,876 A | 1/1997 | Getzlaff et al. | |
| 5,426,378 A | 6/1995 | Ong | 5,594,890 A | 1/1997 | Yamaura et al. | |
| 5,426,384 A | 6/1995 | May | 5,600,262 A | 2/1997 | Kolze | |
| 5,428,319 A | 6/1995 | Marvin et al. | 5,604,466 A | 2/1997 | Dreps et al. | |
| 5,430,395 A | 7/1995 | Ichimaru | 5,608,892 A | 3/1997 | Wakerly | |
| 5,430,687 A | 7/1995 | Hung et al. | 5,614,861 A | 3/1997 | Harada | |
| 5,430,734 A | 7/1995 | Gilson | 5,625,316 A | 4/1997 | Chambers et al. | |
| 5,432,476 A | 7/1995 | Tran | 5,629,857 A | 5/1997 | Brennan | |
| 5,438,672 A | 8/1995 | Dey | 5,629,891 A | 5/1997 | LeMoncheck et al. | |
| 5,440,305 A | 8/1995 | Signore et al. | 5,630,052 A | 5/1997 | Shah | |
| 5,451,887 A | 9/1995 | El-Avat et al. | 5,630,057 A | 5/1997 | Hait | |
| 5,453,904 A | 9/1995 | Higashiyama et al. | 5,630,102 A | 5/1997 | Johnson et al. | |
| 5,455,525 A | 10/1995 | Ho et al. | 5,631,577 A | 5/1997 | Freidin et al. | |
| 5,455,731 A | 10/1995 | Parkinson | 5,633,766 A | 5/1997 | Hase et al. | |
| 5,455,927 A | 10/1995 | Huang | 5,642,295 A | 6/1997 | Smayling | |
| 5,457,410 A | 10/1995 | Ting | 5,646,544 A | 7/1997 | Iadanza | |
| 5,457,479 A | 10/1995 | Cheng | 5,646,901 A | 7/1997 | Sharpe-Geisler et al. | |
| 5,463,591 A | 10/1995 | Aimoto et al. | 5,648,642 A | 7/1997 | Miller et al. | |
| 5,479,603 A | 12/1995 | Stone et al. | 5,651,035 A | 7/1997 | Tozun et al. | |
| 5,479,643 A | 12/1995 | Bhaskar et al. | 5,663,900 A | 9/1997 | Bhandari et al. | |
| 5,479,652 A | 12/1995 | Dreyer et al. | 5,663,965 A | 9/1997 | Seymour | |
| 5,481,471 A | 1/1996 | Naglestad et al. | 5,664,199 A | 9/1997 | Kuwahara | |
| 5,488,204 A | 1/1996 | Mead et al. | 5,666,480 A | 9/1997 | Leung et al. | |
| 5,491,458 A | 2/1996 | McCune, Jr. et al. | 5,670,915 A | 9/1997 | Cooper et al. | |
| 5,493,246 A | 2/1996 | Anderson | 5,673,198 A * | 9/1997 | Lawman et al. | 716/11 |
| 5,493,723 A | 2/1996 | Beck et al. | 5,675,825 A | 10/1997 | Dreyer et al. | |
| 5,495,077 A | 2/1996 | Miller et al. | 5,677,691 A | 10/1997 | Hosticka et al. | |
| 5,495,593 A | 2/1996 | Elmer et al. | 5,680,070 A | 10/1997 | Anderson et al. | |
| 5,495,594 A | 2/1996 | MacKenna et al. | 5,682,032 A | 10/1997 | Philipp | |
| 5,497,119 A | 3/1996 | Tedrow et al. | 5,684,434 A | 11/1997 | Mann et al. | |
| 5,499,192 A | 3/1996 | Knapp et al. | 5,684,952 A | 11/1997 | Stein | |
| 5,500,823 A | 3/1996 | Martin et al. | 5,686,844 A | 11/1997 | Hull et al. | |
| 5,517,198 A | 5/1996 | McEwan | 5,687,325 A | 11/1997 | Chang | |
| 5,519,854 A | 5/1996 | Watt | 5,689,195 A | 11/1997 | Cliff et al. | |
| 5,521,529 A | 5/1996 | Agrawal et al. | 5,689,196 A | 11/1997 | Schutte | |
| 5,530,444 A | 6/1996 | Tice et al. | 5,691,664 A | 11/1997 | Anderson et al. | |
| 5,530,673 A | 6/1996 | Tobita et al. | 5,691,898 A | 11/1997 | Rosenberg et al. | |
| 5,530,813 A | 6/1996 | Paulsen et al. | 5,694,063 A | 12/1997 | Burlison et al. | |
| 5,537,057 A | 7/1996 | Leong et al. | 5,696,952 A | 12/1997 | Pontarelli | |
| 5,541,878 A | 7/1996 | LeMoncheck et al. | 5,699,024 A | 12/1997 | Manlove et al. | |
| 5,542,055 A | 7/1996 | Amini et al. | 5,703,871 A | 12/1997 | Pope et al. | |
| 5,543,588 A | 8/1996 | Bisset et al. | 5,706,453 A | 1/1998 | Cheng et al. | |
| 5,543,590 A | 8/1996 | Gillespie et al. | 5,708,589 A | 1/1998 | Beauvais | |
| 5,543,591 A | 8/1996 | Gillespie et al. | 5,708,798 A | 1/1998 | Lynch et al. | |
| 5,544,067 A | 8/1996 | Rostoker et al. | 5,710,906 A | 1/1998 | Ghosh et al. | |
| 5,544,311 A | 8/1996 | Harenberg et al. | 5,712,969 A | 1/1998 | Zimmermann et al. | |
| 5,546,433 A | 8/1996 | Tran et al. | 5,721,931 A | 2/1998 | Gephardt et al. | |
| 5,546,562 A | 8/1996 | Patel | 5,724,009 A | 3/1998 | Collins et al. | |
| 5,552,725 A | 9/1996 | Ray et al. | 5,727,170 A | 3/1998 | Mitchell et al. | |
| 5,552,748 A | 9/1996 | O'Shaughnessy | 5,729,704 A | 3/1998 | Stone et al. | |
| 5,554,951 A | 9/1996 | Gough | 5,730,165 A | 3/1998 | Philipp | |
| 5,555,452 A | 9/1996 | Callaway, Jr. et al. | 5,732,277 A | 3/1998 | Kodosky et al. | |
| 5,555,907 A | 9/1996 | Philipp | 5,734,272 A | 3/1998 | Belot et al. | |
| 5,557,762 A | 9/1996 | Okuaki et al. | 5,734,334 A | 3/1998 | Hsieh et al. | |
| 5,559,502 A | 9/1996 | Schutte | 5,737,557 A | 4/1998 | Sullivan | |
| 5,559,996 A | 9/1996 | Fujioka | 5,737,760 A | 4/1998 | Grimmer, Jr. et al. | |
| 5,563,526 A | 10/1996 | Hastings et al. | 5,745,011 A | 4/1998 | Scott | |
| 5,563,529 A | 10/1996 | Seltzer et al. | 5,748,048 A | 5/1998 | Moyal | |
| 5,564,010 A | 10/1996 | Henry et al. | 5,748,875 A | 5/1998 | Tzori | |
| 5,564,108 A | 10/1996 | Hunsaker et al. | 5,752,013 A | 5/1998 | Christensen et al. | |
| 5,565,658 A | 10/1996 | Gerpheide et al. | 5,754,552 A | 5/1998 | Allmond et al. | |
| 5,566,702 A | 10/1996 | Philipp | 5,754,826 A | 5/1998 | Gamal et al. | |
| 5,572,665 A | 11/1996 | Nakabayashi | 5,757,368 A | 5/1998 | Gerpheide et al. | |
| 5,572,719 A | 11/1996 | Biesterfeldt | 5,758,058 A | 5/1998 | Milburn | |

| | | | | | | |
|---|---|---|---|---|---|---|
| 5,761,128 | A | 6/1998 | Watanabe | 5,914,708 | A | 6/1999 | LaGrange et al. |
| 5,763,909 | A | 6/1998 | Mead et al. | 5,917,356 | A | 6/1999 | Casal et al. |
| 5,764,714 | A | 6/1998 | Stansell et al. | 5,920,310 | A | 7/1999 | Faggin et al. |
| 5,767,457 | A | 6/1998 | Gerpheide et al. | 5,923,264 | A | 7/1999 | Lavelle et al. |
| 5,774,704 | A | 6/1998 | Williams | 5,926,566 | A | 7/1999 | Wang et al. |
| 5,777,399 | A | 7/1998 | Shibuya | 5,929,710 | A | 7/1999 | Bien |
| 5,781,030 | A | 7/1998 | Agrawal et al. | 5,930,148 | A | 7/1999 | Bjorksten et al. |
| 5,781,747 | A | 7/1998 | Smith et al. | 5,930,150 | A | 7/1999 | Cohen et al. |
| 5,784,545 | A | 7/1998 | Anderson et al. | 5,931,959 | A | 8/1999 | Kwiat |
| 5,790,957 | A | 8/1998 | Heidari | 5,933,023 | A | 8/1999 | Young |
| 5,796,183 | A | 8/1998 | Hourmand | 5,933,356 | A | 8/1999 | Rostoker et al. |
| 5,799,176 | A | 8/1998 | Kapusta et al. | 5,933,816 | A | 8/1999 | Zeanah et al. |
| 5,802,073 | A | 9/1998 | Platt | 5,935,233 | A | 8/1999 | Jeddeloh |
| 5,802,290 | A | 9/1998 | Casselman | 5,935,266 | A | 8/1999 | Thurnhofer et al. |
| 5,805,792 | A | 9/1998 | Swoboda et al. | 5,939,904 | A | 8/1999 | Fetterman et al. |
| 5,805,897 | A | 9/1998 | Glowny | 5,939,949 | A | 8/1999 | Olgaard et al. |
| 5,808,883 | A | 9/1998 | Hawkes | 5,941,991 | A | 8/1999 | Kageshima |
| 5,811,987 | A | 9/1998 | Ashmore, Jr. et al. | 5,942,733 | A | 8/1999 | Allen et al. |
| 5,812,698 | A | 9/1998 | Platt et al. | 5,943,052 | A | 8/1999 | Allen et al. |
| 5,818,254 | A | 10/1998 | Agrawal et al. | 5,945,878 | A | 8/1999 | Westwick et al. |
| 5,818,444 | A | 10/1998 | Alimpich et al. | 5,949,632 | A | 9/1999 | Barreras, Sr. et al. |
| 5,819,028 | A | 10/1998 | Manghirmalani et al. | 5,952,888 | A | 9/1999 | Scott |
| 5,822,387 | A | 10/1998 | Mar | 5,956,279 | A | 9/1999 | Mo et al. |
| 5,822,531 | A | 10/1998 | Gorczyca et al. | 5,959,871 | A | 9/1999 | Pierzchala et al. |
| 5,828,693 | A | 10/1998 | Mays et al. | 5,963,075 | A | 10/1999 | Hiiragizawa |
| 5,838,583 | A * | 11/1998 | Varadarajan et al. ........... 716/9 | 5,963,105 | A | 10/1999 | Nguyen |
| 5,841,078 | A | 11/1998 | Miller et al. | 5,963,503 | A | 10/1999 | Lee |
| 5,841,996 | A | 11/1998 | Nolan et al. | 5,964,893 | A | 10/1999 | Circello et al. |
| 5,844,404 | A | 12/1998 | Caser et al. | 5,966,027 | A | 10/1999 | Kapusta et al. |
| 5,848,285 | A | 12/1998 | Kapusta et al. | 5,966,532 | A | 10/1999 | McDonald et al. |
| 5,850,156 | A | 12/1998 | Wittman | 5,968,135 | A | 10/1999 | Teramoto et al. |
| 5,852,733 | A | 12/1998 | Chien et al. | 5,969,513 | A | 10/1999 | Clark |
| 5,854,625 | A | 12/1998 | Frisch et al. | 5,969,632 | A | 10/1999 | Diamant et al. |
| 5,857,109 | A | 1/1999 | Taylor | 5,973,368 | A | 10/1999 | Pearce et al. |
| 5,861,583 | A | 1/1999 | Schediwy et al. | 5,974,235 | A | 10/1999 | Nunally et al. |
| 5,861,875 | A | 1/1999 | Gerpheide | 5,977,791 | A | 11/1999 | Veenstra |
| 5,864,242 | A | 1/1999 | Allen et al. | 5,978,584 | A | 11/1999 | Nishibata et al. |
| 5,864,392 | A | 1/1999 | Winklhofer et al. | 5,978,937 | A | 11/1999 | Miyamori et al. |
| 5,867,046 | A | 2/1999 | Sugasawa | 5,982,105 | A | 11/1999 | Masters |
| 5,867,399 | A | 2/1999 | Rostoker et al. | 5,982,229 | A | 11/1999 | Wong et al. |
| 5,869,979 | A | 2/1999 | Bocchino | 5,982,241 | A | 11/1999 | Nguyen et al. |
| 5,870,004 | A | 2/1999 | Lu | 5,983,277 | A | 11/1999 | Heile et al. |
| 5,870,309 | A | 2/1999 | Lawman | 5,986,479 | A | 11/1999 | Mohan |
| 5,870,345 | A | 2/1999 | Stecker | 5,987,246 | A | 11/1999 | Thomsen et al. |
| 5,872,464 | A | 2/1999 | Gradinariu | 5,988,902 | A | 11/1999 | Holehan |
| 5,874,958 | A | 2/1999 | Ludolph | 5,994,939 | A | 11/1999 | Johnson et al. |
| 5,875,293 | A | 2/1999 | Bell et al. | 5,996,032 | A | 11/1999 | Baker |
| 5,877,656 | A | 3/1999 | Mann et al. | 5,999,725 | A | 12/1999 | Barbier et al. |
| 5,878,425 | A | 3/1999 | Redpath | 6,002,268 | A | 12/1999 | Sasaki et al. |
| 5,880,411 | A | 3/1999 | Gillespie et al. | 6,002,398 | A | 12/1999 | Wilson |
| 5,880,598 | A | 3/1999 | Duong | 6,003,054 | A | 12/1999 | Oshima et al. |
| 5,883,623 | A | 3/1999 | Cseri | 6,003,107 | A | 12/1999 | Ranson et al. |
| 5,886,582 | A | 3/1999 | Stansell | 6,003,133 | A | 12/1999 | Moughanni et al. |
| 5,887,189 | A | 3/1999 | Birns et al. | 6,005,814 | A | 12/1999 | Mulholland et al. |
| 5,889,236 | A | 3/1999 | Gillespie et al. | 6,005,904 | A | 12/1999 | Knapp et al. |
| 5,889,723 | A | 3/1999 | Pascucci | 6,008,685 | A | 12/1999 | Kunst |
| 5,889,936 | A | 3/1999 | Chan | 6,008,703 | A | 12/1999 | Perrott et al. |
| 5,889,988 | A | 3/1999 | Held | 6,009,270 | A | 12/1999 | Mann |
| 5,894,226 | A | 4/1999 | Koyama | 6,009,496 | A | 12/1999 | Tsai |
| 5,894,243 | A | 4/1999 | Hwang | 6,011,407 | A | 1/2000 | New |
| 5,894,565 | A | 4/1999 | Furtek et al. | 6,012,835 | A | 1/2000 | Thompson et al. |
| 5,895,494 | A | 4/1999 | Scalzi et al. | 6,014,135 | A | 1/2000 | Fernandes |
| 5,896,068 | A | 4/1999 | Moyal | 6,014,509 | A | 1/2000 | Furtek et al. |
| 5,896,330 | A | 4/1999 | Gibson | 6,014,723 | A | 1/2000 | Tremblay et al. |
| 5,898,345 | A | 4/1999 | Namura et al. | 6,016,554 | A | 1/2000 | Skrovan et al. |
| 5,900,780 | A | 5/1999 | Hirose et al. | 6,016,563 | A | 1/2000 | Fleisher |
| 5,901,062 | A | 5/1999 | Burch et al. | 6,018,559 | A | 1/2000 | Azegami et al. |
| 5,903,718 | A | 5/1999 | Marik | 6,023,422 | A | 2/2000 | Allen et al. |
| 5,905,398 | A | 5/1999 | Todsen et al. | 6,023,565 | A | 2/2000 | Lawman et al. |
| 5,909,544 | A | 6/1999 | Anderson, II et al. | 6,026,134 | A | 2/2000 | Duffy et al. |
| 5,911,059 | A | 6/1999 | Profit, Jr. | 6,026,501 | A | 2/2000 | Hohl et al. |
| 5,914,465 | A | 6/1999 | Allen et al. | 6,028,271 | A | 2/2000 | Gillespie et al. |
| 5,914,633 | A | 6/1999 | Comino et al. | 6,028,959 | A | 2/2000 | Wang et al. |

| | | | | | | |
|---|---|---|---|---|---|---|
| 6,031,365 A | 2/2000 | Sharpe-Geisler | | 6,185,703 B1 | 2/2001 | Guddat et al. |
| 6,032,268 A | 2/2000 | Swoboda et al. | | 6,185,732 B1 | 2/2001 | Mann et al. |
| 6,034,538 A | 3/2000 | Abramovici | | 6,188,228 B1 | 2/2001 | Philipp |
| 6,037,807 A | 3/2000 | Wu et al. | | 6,188,241 B1 | 2/2001 | Gauthier et al. |
| 6,038,551 A | 3/2000 | Barlow et al. | | 6,188,381 B1 | 2/2001 | van der Wal et al. |
| 6,041,406 A | 3/2000 | Mann | | 6,188,391 B1 | 2/2001 | Seely et al. |
| 6,043,695 A | 3/2000 | O'Sullivan | | 6,188,975 B1 | 2/2001 | Gay |
| 6,043,719 A | 3/2000 | Lin et al. | | 6,191,603 B1 | 2/2001 | Muradali et al. |
| 6,049,223 A | 4/2000 | Lytle et al. | | 6,191,660 B1 | 2/2001 | Mar et al. |
| 6,049,225 A | 4/2000 | Huang et al. | | 6,191,998 B1 | 2/2001 | Reddy et al. |
| 6,051,772 A | 4/2000 | Cameron et al. | | 6,192,431 B1 | 2/2001 | Dabral et al. |
| 6,052,035 A | 4/2000 | Nolan et al. | | 6,198,303 B1 | 3/2001 | Rangasayee |
| 6,052,524 A | 4/2000 | Pauna | | 6,201,407 B1 | 3/2001 | Kapusta et al. |
| 6,055,584 A | 4/2000 | Bridges et al. | | 6,201,829 B1 | 3/2001 | Schneider |
| 6,057,705 A | 5/2000 | Wojewoda et al. | | 6,202,044 B1 | 3/2001 | Tzori |
| 6,058,263 A | 5/2000 | Voth | | 6,204,687 B1 | 3/2001 | Schultz et al. |
| 6,058,452 A | 5/2000 | Rangasayee et al. | | 6,205,574 B1 | 3/2001 | Dellinger et al. |
| 6,061,511 A | 5/2000 | Marantz et al. | | 6,208,572 B1 | 3/2001 | Adams et al. |
| 6,066,961 A | 5/2000 | Lee et al. | | 6,211,708 B1 | 4/2001 | Klemmer |
| 6,070,003 A | 5/2000 | Gove et al. | | 6,211,715 B1 | 4/2001 | Terauchi |
| 6,072,803 A | 6/2000 | Allmond et al. | | 6,211,741 B1 | 4/2001 | Dalmia |
| 6,075,941 A | 6/2000 | Itoh et al. | | 6,215,352 B1 | 4/2001 | Sudo |
| 6,079,985 A | 6/2000 | Wohl et al. | | 6,219,729 B1 | 4/2001 | Keats et al. |
| 6,081,140 A | 6/2000 | King | | 6,222,528 B1 | 4/2001 | Gerpheide et al. |
| 6,094,730 A | 7/2000 | Lopez et al. | | 6,223,144 B1 | 4/2001 | Barnett et al. |
| 6,097,211 A | 8/2000 | Couts-Martin et al. | | 6,223,147 B1 | 4/2001 | Bowers |
| 6,097,432 A | 8/2000 | Mead et al. | | 6,223,272 B1 | 4/2001 | Coehlo et al. |
| 6,101,457 A | 8/2000 | Barch et al. | | RE37,195 E | 5/2001 | Kean |
| 6,101,617 A | 8/2000 | Burckhartt et al. | | 6,225,866 B1 | 5/2001 | Kubota et al. |
| 6,104,217 A | 8/2000 | Magana | | 6,236,242 B1 | 5/2001 | Hedberg |
| 6,104,325 A | 8/2000 | Liaw et al. | | 6,236,275 B1 | 5/2001 | Dent |
| 6,107,769 A | 8/2000 | Saylor et al. | | 6,236,278 B1 | 5/2001 | Olgaard |
| 6,107,826 A | 8/2000 | Young et al. | | 6,236,593 B1 | 5/2001 | Hong et al. |
| 6,107,882 A | 8/2000 | Gabara et al. | | 6,236,389 B1 | 5/2001 | Allen et al. |
| 6,110,223 A | 8/2000 | Southgate et al. | | 6,239,798 B1 | 5/2001 | Ludolph et al. |
| 6,111,431 A | 8/2000 | Estrada | | 6,240,375 B1 | 5/2001 | Sonoda |
| 6,112,264 A | 8/2000 | Beasley et al. | | 6,246,258 B1 | 6/2001 | Lesea |
| 6,121,791 A | 9/2000 | Abbott | | 6,246,410 B1 | 6/2001 | Bergeron et al. |
| 6,121,805 A | 9/2000 | Thamsirianunt et al. | | 6,249,167 B1 | 6/2001 | Oguchi et al. |
| 6,121,965 A | 9/2000 | Kenney et al. | | 6,249,447 B1 | 6/2001 | Boylan et al. |
| 6,125,416 A | 9/2000 | Warren | | 6,253,250 B1 | 6/2001 | Evans et al. |
| 6,130,548 A | 10/2000 | Koifman | | 6,262,717 B1 | 7/2001 | Donohue et al. |
| 6,130,551 A | 10/2000 | Agrawal et al. | | 6,263,302 B1 | 7/2001 | Hellestrand et al. |
| 6,130,552 A | 10/2000 | Jefferson et al. | | 6,263,339 B1 | 7/2001 | Hirsch |
| 6,133,773 A | 10/2000 | Garlepp et al. | | 6,263,484 B1 | 7/2001 | Yang |
| 6,134,181 A | 10/2000 | Landry | | 6,271,679 B1 | 8/2001 | McClintock et al. |
| 6,134,516 A | 10/2000 | Wang et al. | | 6,272,646 B1 | 8/2001 | Rangasayee et al. |
| 6,137,308 A | 10/2000 | Nayak | | 6,275,117 B1 | 8/2001 | Abugharbieh et al. |
| 6,140,853 A | 10/2000 | Lo | | 6,278,568 B1 | 8/2001 | Cloke et al. |
| 6,141,376 A | 10/2000 | Shaw | | 6,280,391 B1 | 8/2001 | Olson et al. |
| 6,141,764 A | 10/2000 | Ezell | | 6,281,753 B1 | 8/2001 | Corsi et al. |
| 6,144,327 A | 11/2000 | Distinti et al. | | 6,282,547 B1 | 8/2001 | Hirsch |
| 6,148,104 A | 11/2000 | Wang et al. | | 6,282,551 B1 | 8/2001 | Anderson et al. |
| 6,148,441 A | 11/2000 | Woodward | | 6,286,127 B1 | 9/2001 | King et al. |
| 6,149,299 A | 11/2000 | Aslan et al. | | 6,288,707 B1 | 9/2001 | Philipp |
| 6,150,866 A | 11/2000 | Eto et al. | | 6,289,300 B1 | 9/2001 | Brannick et al. |
| 6,154,064 A | 11/2000 | Proebsting | | 6,289,478 B1 | 9/2001 | Kitagaki |
| 6,157,024 A | 12/2000 | Chapdelaine et al. | | 6,289,489 B1 | 9/2001 | Bold et al. |
| 6,157,270 A | 12/2000 | Tso | | 6,292,028 B1 | 9/2001 | Tomita |
| 6,161,199 A | 12/2000 | Szeto et al. | | 6,294,932 B1 | 9/2001 | Watarai |
| 6,166,367 A | 12/2000 | Cho | | 6,294,962 B1 | 9/2001 | Mar |
| 6,166,960 A | 12/2000 | Marneweck et al. | | 6,298,320 B1 | 10/2001 | Buckmaster et al. |
| 6,167,077 A | 12/2000 | Ducaroir et al. | | 6,304,014 B1 | 10/2001 | England et al. |
| 6,167,559 A | 12/2000 | Furtek et al. | | 6,304,101 B1 | 10/2001 | Nishihara |
| 6,172,571 B1 | 1/2001 | Moyal et al. | | 6,304,790 B1 | 10/2001 | Nakamura et al. |
| 6,173,419 B1 | 1/2001 | Barnett | | 6,307,413 B1 | 10/2001 | Dalmia et al. |
| 6,175,914 B1 | 1/2001 | Mann | | 6,310,521 B1 | 10/2001 | Dalmia |
| 6,175,949 B1 | 1/2001 | Gristede et al. | | 6,310,611 B1 | 10/2001 | Caldwell |
| 6,181,163 B1 | 1/2001 | Agrawal et al. | | 6,311,149 B1 | 10/2001 | Ryan et al. |
| 6,183,131 B1 | 2/2001 | Holloway et al. | | 6,314,530 B1 | 11/2001 | Mann |
| 6,185,127 B1 | 2/2001 | Myers et al. | | 6,320,184 B1 | 11/2001 | Winklhofer et al. |
| 6,185,450 B1 | 2/2001 | Seguine et al. | | 6,320,282 B1 | 11/2001 | Caldwell |
| 6,185,522 B1 | 2/2001 | Bakker | | 6,321,369 B1 | 11/2001 | Heile et al. |

| | | | | | |
|---|---|---|---|---|---|
| 6,323,846 B1 | 11/2001 | Westerman et al. | 6,466,898 B1 | 10/2002 | Chan |
| 6,324,628 B1 | 11/2001 | Chan | 6,473,069 B1 | 10/2002 | Gerpheide |
| 6,326,859 B1 | 12/2001 | Goldman et al. | 6,473,825 B1 | 10/2002 | Worley et al. |
| 6,332,137 B1 | 12/2001 | Hori et al. | 6,477,691 B1 | 11/2002 | Bergamashi/Rab et al. |
| 6,332,201 B1 | 12/2001 | Chin et al. | 6,480,921 B1 | 11/2002 | Mansoorian et al. |
| 6,337,579 B1 | 1/2002 | Mochida | 6,483,343 B1 | 11/2002 | Faith et al. |
| 6,338,109 B1 | 1/2002 | Snyder et al. | 6,487,700 B1 | 11/2002 | Fukushima |
| 6,339,815 B1 | 1/2002 | Feng et al. | 6,489,899 B1 | 12/2002 | Ely et al. |
| 6,342,907 B1 | 1/2002 | Petty et al. | 6,490,213 B1 | 12/2002 | Mu et al. |
| 6,345,383 B1 | 2/2002 | Ueki | 6,492,834 B1 | 12/2002 | Lytle et al. |
| 6,347,395 B1 | 2/2002 | Payne et al. | 6,496,971 B1 | 12/2002 | Lesea et al. |
| 6,351,789 B1 | 2/2002 | Green | 6,498,720 B2 | 12/2002 | Glad |
| 6,353,452 B1 * | 3/2002 | Hamada et al. ............. 715/825 | 6,499,134 B1 | 12/2002 | Buffet et al. |
| 6,355,980 B1 | 3/2002 | Callahan | 6,499,359 B1 | 12/2002 | Washeleski et al. |
| 6,356,862 B2 | 3/2002 | Bailey | 6,504,403 B2 | 1/2003 | Bangs et al. |
| 6,356,958 B1 | 3/2002 | Lin | 6,507,214 B1 | 1/2003 | Snyder |
| 6,356,960 B1 | 3/2002 | Jones et al. | 6,507,215 B1 | 1/2003 | Piasecki et al. |
| 6,359,950 B2 | 3/2002 | Gossmann et al. | 6,507,857 B1 | 1/2003 | Yalcinalp |
| 6,362,697 B1 | 3/2002 | Pulvirenti | 6,509,758 B2 | 1/2003 | Piasecki et al. |
| 6,366,174 B1 | 4/2002 | Berry et al. | 6,512,395 B1 | 1/2003 | Lacey et al. |
| 6,366,300 B1 | 4/2002 | Ohara et al. | 6,516,428 B2 | 2/2003 | Wenzel et al. |
| 6,366,874 B1 | 4/2002 | Lee et al. | 6,516,452 B2 | 2/2003 | Meding |
| 6,366,878 B1 | 4/2002 | Grunert | 6,522,128 B1 | 2/2003 | Ely et al. |
| 6,369,660 B1 | 4/2002 | Wei et al. | 6,523,416 B2 | 2/2003 | Takagi et al. |
| 6,371,878 B1 | 4/2002 | Bowen | 6,525,593 B1 | 2/2003 | Mar |
| 6,373,954 B1 | 4/2002 | Malcolm, Jr. et al. | 6,526,556 B1 | 2/2003 | Stoica et al. |
| 6,374,370 B1 | 4/2002 | Bockhaus et al. | 6,529,791 B1 | 3/2003 | Takagi |
| 6,377,009 B1 | 4/2002 | Philipp | 6,530,065 B1 | 3/2003 | McDonald et al. |
| 6,377,575 B1 | 4/2002 | Mullaney et al. | 6,534,970 B1 | 3/2003 | Ely et al. |
| 6,377,646 B1 | 4/2002 | Sha | 6,535,061 B2 | 3/2003 | Darmawaskita et al. |
| 6,380,811 B1 | 4/2002 | Zarubinsky et al. | 6,535,200 B2 | 3/2003 | Philipp |
| 6,380,929 B1 | 4/2002 | Platt | 6,535,946 B1 | 3/2003 | Bryant et al. |
| 6,380,931 B1 | 4/2002 | Gillespie et al. | 6,536,028 B1 * | 3/2003 | Katsioulas et al. ............ 716/17 |
| 6,384,947 B1 | 5/2002 | Ackerman et al. | 6,539,534 B1 | 3/2003 | Bennett |
| 6,385,742 B1 | 5/2002 | Kirsch et al. | 6,542,025 B1 | 4/2003 | Kutz et al. |
| 6,388,109 B1 | 5/2002 | Schwarz et al. | 6,542,844 B1 | 4/2003 | Hanna |
| 6,388,464 B1 | 5/2002 | Lacey et al. | 6,542,845 B1 | 4/2003 | Grucci et al. |
| 6,396,302 B2 | 5/2002 | New et al. | 6,552,933 B2 | 4/2003 | Roohparvar |
| 6,397,232 B1 | 5/2002 | Cheng-Hung et al. | 6,553,057 B1 | 4/2003 | Sha et al. |
| 6,404,204 B1 | 6/2002 | Farruggia et al. | 6,554,469 B1 | 4/2003 | Thomson et al. |
| 6,404,445 B1 | 6/2002 | Galea et al. | 6,557,149 B2 | 4/2003 | Morrise et al. |
| 6,407,953 B1 | 6/2002 | Cleeves | 6,557,164 B1 | 4/2003 | Faustini |
| 6,408,432 B1 | 6/2002 | Herrmann et al. | 6,559,685 B2 | 5/2003 | Green |
| 6,411,665 B1 | 6/2002 | Chan et al. | 6,560,306 B1 | 5/2003 | Duffy et al. |
| 6,411,974 B1 | 6/2002 | Graham et al. | 6,560,699 B1 | 5/2003 | Konkle |
| 6,414,671 B1 | 7/2002 | Gillespie et al. | 6,563,391 B1 | 5/2003 | Mar |
| 6,417,872 B2 | 7/2002 | Zimmerman et al. | 6,564,179 B1 | 5/2003 | Belhaj |
| 6,421,698 B1 | 7/2002 | Hong | 6,566,961 B2 | 5/2003 | Dasgupta et al. |
| 6,425,109 B1 | 7/2002 | Choukalos et al. | 6,567,426 B1 | 5/2003 | van Hook et al. |
| 6,429,882 B1 | 8/2002 | Abdelnur et al. | 6,567,932 B2 | 5/2003 | Edwards et al. |
| 6,430,305 B1 | 8/2002 | Decker | 6,570,557 B1 | 5/2003 | Westerman et al. |
| 6,433,645 B1 | 8/2002 | Mann et al. | 6,571,331 B2 | 5/2003 | Henry et al. |
| 6,434,187 B1 | 8/2002 | Beard et al. | 6,571,373 B1 | 5/2003 | Devins et al. |
| 6,437,805 B1 | 8/2002 | Sojoodi et al. | 6,574,590 B1 | 6/2003 | Kershaw et al. |
| 6,438,565 B1 | 8/2002 | Ammirato et al. | 6,574,739 B1 | 6/2003 | Kung et al. |
| 6,438,735 B1 | 8/2002 | McElvain et al. | 6,575,373 B1 | 6/2003 | Nakano |
| 6,438,738 B1 | 8/2002 | Elayda | 6,577,258 B2 | 6/2003 | Ruha et al. |
| 6,441,073 B1 | 8/2002 | Tanaka et al. | 6,580,329 B2 | 6/2003 | Sander |
| 6,445,211 B1 | 9/2002 | Saripella | 6,581,191 B1 | 6/2003 | Schubert et al. |
| 6,449,628 B1 | 9/2002 | Wasson | 6,587,093 B1 | 7/2003 | Shaw et al. |
| 6,449,755 B1 | 9/2002 | Beausang et al. | 6,587,995 B1 | 7/2003 | Duboc et al. |
| 6,449,761 B1 | 9/2002 | Greidinger et al. | 6,588,004 B1 | 7/2003 | Southgate et al. |
| 6,452,437 B1 | 9/2002 | Takeuchi et al. | 6,590,422 B1 | 7/2003 | Dillon |
| 6,452,514 B1 | 9/2002 | Philipp | 6,590,517 B1 | 7/2003 | Swanson |
| 6,453,175 B2 | 9/2002 | Mizell et al. | 6,591,369 B1 | 7/2003 | Edwards et al. |
| 6,453,461 B1 | 9/2002 | Chaiken | 6,592,626 B1 | 7/2003 | Bauchot et al. |
| 6,456,304 B1 | 9/2002 | Angiulo et al. | 6,594,799 B1 | 7/2003 | Robertson et al. |
| 6,457,355 B1 | 10/2002 | Philipp | 6,597,212 B1 | 7/2003 | Wang et al. |
| 6,457,479 B1 | 10/2002 | Zhuang et al. | 6,597,824 B2 | 7/2003 | Newberg et al. |
| 6,460,172 B1 | 10/2002 | Insenser Farre et al. | 6,598,178 B1 | 7/2003 | Yee et al. |
| 6,463,488 B1 | 10/2002 | San Juan | 6,600,346 B1 | 7/2003 | Macaluso |
| 6,466,036 B1 | 10/2002 | Philipp | 6,600,351 B2 | 7/2003 | Bisanti et al. |
| 6,466,078 B1 | 10/2002 | Stiff | 6,600,575 B1 | 7/2003 | Kohara |

| | | |
|---|---|---|
| 6,601,189 B1 | 7/2003 | Edwards et al. |
| 6,601,236 B1 | 7/2003 | Curtis |
| 6,603,330 B1 | 8/2003 | Snyder |
| 6,603,348 B1 | 8/2003 | Preuss et al. |
| 6,604,179 B2 | 8/2003 | Volk et al. |
| 6,606,731 B1 | 8/2003 | Baum et al. |
| 6,608,472 B1 | 8/2003 | Kutz et al. |
| 6,610,936 B2 | 8/2003 | Gillespie et al. |
| 6,611,220 B1 | 8/2003 | Snyder |
| 6,611,276 B1 | 8/2003 | Muratori et al. |
| 6,611,856 B1 | 8/2003 | Liao et al. |
| 6,611,952 B1 | 8/2003 | Prakash et al. |
| 6,613,098 B1 | 9/2003 | Sorge et al. |
| 6,614,260 B1 | 9/2003 | Welch et al. |
| 6,614,320 B1 | 9/2003 | Sullam et al. |
| 6,614,374 B1 | 9/2003 | Gustavsson et al. |
| 6,614,458 B1 | 9/2003 | Lambert et al. |
| 6,615,167 B1 | 9/2003 | Devins et al. |
| 6,617,888 B2 | 9/2003 | Volk |
| 6,618,854 B1 | 9/2003 | Mann |
| 6,621,356 B2 | 9/2003 | Gotz et al. |
| 6,624,640 B2 | 9/2003 | Lund et al. |
| 6,625,765 B1 | 9/2003 | Krishnan |
| 6,628,163 B2 | 9/2003 | Dathe et al. |
| 6,628,311 B1 | 9/2003 | Fang |
| 6,631,508 B1 | 10/2003 | Williams |
| 6,634,008 B1 | 10/2003 | Dole |
| 6,636,096 B2 | 10/2003 | Schaffer et al. |
| 6,637,015 B1 | 10/2003 | Ogami et al. |
| 6,639,586 B2 | 10/2003 | Gerpheide |
| 6,642,857 B1 | 11/2003 | Schediwy et al. |
| 6,643,151 B1 | 11/2003 | Nebrigic et al. |
| 6,643,810 B2 | 11/2003 | Whetsel |
| 6,649,924 B1 | 11/2003 | Philipp et al. |
| 6,650,581 B2 | 11/2003 | Hong et al. |
| 6,658,498 B1 | 12/2003 | Carney et al. |
| 6,658,633 B2 | 12/2003 | Devins et al. |
| 6,661,288 B2 | 12/2003 | Morgan et al. |
| 6,661,410 B2 | 12/2003 | Casebolt et al. |
| 6,661,724 B1 | 12/2003 | Snyder et al. |
| 6,664,978 B1 | 12/2003 | Kekic et al. |
| 6,664,991 B1 | 12/2003 | Chew et al. |
| 6,667,642 B1 | 12/2003 | Moyal |
| 6,667,740 B2 | 12/2003 | Ely et al. |
| 6,670,852 B1 | 12/2003 | Hauck |
| 6,673,308 B2 | 1/2004 | Hino et al. |
| 6,677,814 B2 | 1/2004 | Low et al. |
| 6,677,932 B1 | 1/2004 | Westerman |
| 6,678,645 B1 | 1/2004 | Rajsuman et al. |
| 6,678,877 B1 | 1/2004 | Perry et al. |
| 6,680,632 B1 | 1/2004 | Meyers et al. |
| 6,680,731 B2 | 1/2004 | Gerpheide et al. |
| 6,681,280 B1 | 1/2004 | Miyake et al. |
| 6,681,359 B1 | 1/2004 | Au et al. |
| 6,683,462 B2 | 1/2004 | Shimizu |
| 6,683,930 B1 | 1/2004 | Dalmia |
| 6,686,787 B2 | 2/2004 | Ling |
| 6,686,860 B2 | 2/2004 | Gulati et al. |
| 6,690,224 B1 | 2/2004 | Moore |
| 6,691,193 B1 | 2/2004 | Wang et al. |
| 6,691,301 B2 | 2/2004 | Bowen |
| 6,697,754 B1 | 2/2004 | Alexander |
| 6,701,340 B1 | 3/2004 | Gorecki et al. |
| 6,701,487 B1 | 3/2004 | Ogami et al. |
| 6,701,508 B1 | 3/2004 | Bartz et al. |
| 6,704,381 B1 | 3/2004 | Moyal et al. |
| 6,704,879 B1 | 3/2004 | Parrish |
| 6,704,889 B2 | 3/2004 | Herrmann et al. |
| 6,704,893 B1 | 3/2004 | Bauwens et al. |
| 6,705,511 B1 | 3/2004 | Dames et al. |
| 6,711,226 B1 | 3/2004 | Williams et al. |
| 6,711,731 B2 | 3/2004 | Weiss |
| 6,713,897 B2 | 3/2004 | Caldwell |
| 6,714,066 B2 | 3/2004 | Gorecki et al. |
| 6,714,817 B2 | 3/2004 | Daynes et al. |
| 6,715,132 B1 | 3/2004 | Bartz et al. |
| 6,717,474 B2 | 4/2004 | Chen et al. |
| 6,718,294 B1 | 4/2004 | Bortfeld |
| 6,718,520 B1 | 4/2004 | Lautzenheiser et al. |
| 6,718,533 B1 | 4/2004 | Schneider et al. |
| 6,724,220 B1 | 4/2004 | Snyder et al. |
| 6,728,900 B1 | 4/2004 | Meli |
| 6,728,902 B2 | 4/2004 | Kaiser et al. |
| 6,730,863 B1 | 5/2004 | Gerpheide et al. |
| 6,731,552 B2 | 5/2004 | Perner |
| 6,732,068 B2 | 5/2004 | Bauer et al. |
| 6,732,347 B1 | 5/2004 | Bixler et al. |
| 6,738,858 B1 | 5/2004 | Fernald et al. |
| 6,744,323 B1 | 6/2004 | Moyal et al. |
| 6,748,569 B1 | 6/2004 | Brooke et al. |
| 6,750,852 B2 | 6/2004 | Gillespie et al. |
| 6,750,889 B1 | 6/2004 | Livingston |
| 6,754,101 B2 | 6/2004 | Terzioglu et al. |
| 6,754,723 B2 | 6/2004 | Kato |
| 6,754,765 B1 | 6/2004 | Chang et al. |
| 6,754,849 B2 | 6/2004 | Tamura |
| 6,757,882 B2 * | 6/2004 | Chen et al. ................ 716/12 |
| 6,765,407 B1 | 7/2004 | Snyder |
| 6,768,337 B2 | 7/2004 | Kohno et al. |
| 6,768,352 B1 | 7/2004 | Maher et al. |
| 6,769,622 B1 | 8/2004 | Tournemille et al. |
| 6,771,552 B2 | 8/2004 | Fujisawa |
| 6,774,644 B2 | 8/2004 | Eberlein |
| 6,781,456 B2 | 8/2004 | Pradhan |
| 6,782,068 B1 | 8/2004 | Wilson et al. |
| 6,784,821 B1 | 8/2004 | Lee |
| 6,785,881 B1 | 8/2004 | Bartz et al. |
| 6,788,116 B1 | 9/2004 | Cook et al. |
| 6,788,221 B1 | 9/2004 | Ely et al. |
| 6,788,521 B2 | 9/2004 | Nishi |
| 6,791,377 B2 | 9/2004 | Ilchmann et al. |
| 6,792,584 B1 | 9/2004 | Eneboe et al. |
| 6,798,218 B2 | 9/2004 | Kasperkovitz |
| 6,798,299 B1 | 9/2004 | Mar et al. |
| 6,799,198 B1 | 9/2004 | Huboi et al. |
| 6,806,771 B1 | 10/2004 | Hildebrant et al. |
| 6,806,782 B2 | 10/2004 | Motoyoshi et al. |
| 6,809,275 B1 | 10/2004 | Cheng et al. |
| 6,809,566 B1 | 10/2004 | Xin-LeBlanc |
| 6,810,442 B1 | 10/2004 | Lin et al. |
| 6,815,979 B2 | 11/2004 | Ooshita |
| 6,816,544 B1 | 11/2004 | Bailey et al. |
| 6,817,005 B2 | 11/2004 | Mason et al. |
| 6,819,142 B2 | 11/2004 | Viehmann et al. |
| 6,823,282 B1 | 11/2004 | Snyder |
| 6,823,497 B2 | 11/2004 | Schubert et al. |
| 6,825,689 B1 | 11/2004 | Snyder |
| 6,825,869 B2 | 11/2004 | Bang |
| 6,828,824 B2 | 12/2004 | Betz et al. |
| 6,829,727 B1 | 12/2004 | Pawloski |
| 6,834,384 B2 | 12/2004 | Fiorella, III et al. |
| 6,836,169 B2 | 12/2004 | Richmond et al. |
| 6,839,774 B1 | 1/2005 | Ahn et al. |
| 6,842,710 B1 | 1/2005 | Gehring et al. |
| 6,847,203 B1 | 1/2005 | Conti et al. |
| 6,850,117 B2 | 2/2005 | Weber et al. |
| 6,850,554 B1 | 2/2005 | Sha et al. |
| 6,853,598 B2 | 2/2005 | Chevallier |
| 6,854,067 B1 | 2/2005 | Kutz et al. |
| 6,856,433 B2 | 2/2005 | Hatano et al. |
| 6,859,884 B1 | 2/2005 | Sullam |
| 6,862,240 B2 | 3/2005 | Burgan |
| 6,864,710 B1 | 3/2005 | Lacey et al. |
| 6,865,429 B1 | 3/2005 | Schneider et al. |
| 6,865,504 B2 | 3/2005 | Larson et al. |
| 6,868,500 B1 | 3/2005 | Kutz et al. |

| Patent | Kind | Date | Inventors |
|---|---|---|---|
| 6,871,253 | B2 | 3/2005 | Greeff et al. |
| 6,871,331 | B1 | 3/2005 | Bloom et al. |
| 6,873,203 | B1 | 3/2005 | Latham, II et al. |
| 6,873,210 | B2 | 3/2005 | Mulder et al. |
| 6,876,941 | B2 | 4/2005 | Nightingale |
| 6,880,086 | B2 | 4/2005 | Kidder et al. |
| 6,888,453 | B2 | 5/2005 | Lutz et al. |
| 6,888,538 | B2 | 5/2005 | Ely et al. |
| 6,892,310 | B1 | 5/2005 | Kutz et al. |
| 6,892,322 | B1 | 5/2005 | Snyder |
| 6,893,724 | B2 | 5/2005 | Lin et al. |
| 6,894,928 | B2 | 5/2005 | Owen |
| 6,895,373 | B2 | 5/2005 | Garcia et al. |
| 6,897,390 | B2 | 5/2005 | Caldwell et al. |
| 6,898,703 | B1 | 5/2005 | Ogami et al. |
| 6,900,663 | B1 | 5/2005 | Roper et al. |
| 6,901,563 | B1 | 5/2005 | Ogami et al. |
| 6,903,402 | B2 | 6/2005 | Miyazawa |
| 6,903,613 | B1 | 6/2005 | Mitchell et al. |
| 6,904,570 | B2 | 6/2005 | Foote et al. |
| 6,910,126 | B1 | 6/2005 | Mar et al. |
| 6,911,857 | B1 | 6/2005 | Stiff |
| 6,917,661 | B1 | 7/2005 | Scott et al. |
| 6,922,821 | B1 | 7/2005 | Nemecek |
| 6,924,668 | B2 | 8/2005 | Muller et al. |
| 6,934,674 | B1 | 8/2005 | Douezy et al. |
| 6,937,075 | B2 | 8/2005 | Lim et al. |
| 6,940,356 | B2 | 9/2005 | McDonald, II et al. |
| 6,941,336 | B1 | 9/2005 | Mar |
| 6,941,538 | B2 | 9/2005 | Hwang et al. |
| 6,944,018 | B1 | 9/2005 | Caldwell |
| 6,949,811 | B2 | 9/2005 | Miyazawa |
| 6,949,984 | B2 | 9/2005 | Siniscalchi |
| 6,950,954 | B1 | 9/2005 | Sullam et al. |
| 6,950,990 | B2 | 9/2005 | Rajarajan et al. |
| 6,952,778 | B1 | 10/2005 | Snyder |
| 6,954,511 | B2 | 10/2005 | Tachimori |
| 6,954,904 | B2 | 10/2005 | White |
| 6,956,419 | B1 | 10/2005 | Mann et al. |
| 6,957,180 | B1 | 10/2005 | Nemecek |
| 6,957,242 | B1 | 10/2005 | Snyder |
| 6,963,233 | B2 | 11/2005 | Puccio et al. |
| 6,963,908 | B1 | 11/2005 | Lynch et al. |
| 6,966,039 | B1 | 11/2005 | Bartz et al. |
| 6,967,511 | B1 | 11/2005 | Sullam |
| 6,967,960 | B1 | 11/2005 | Bross et al. |
| 6,968,514 | B2 | 11/2005 | Cooke et al. |
| 6,969,978 | B2 | 11/2005 | Dening |
| 6,970,844 | B1 | 11/2005 | Bierenbaum |
| 6,971,004 | B1 | 11/2005 | Pleis et al. |
| 6,973,400 | B2 | 12/2005 | Cahill-O'Brien et al. |
| 6,975,123 | B1 | 12/2005 | Malang et al. |
| 6,980,060 | B2 | 12/2005 | Boerstler et al. |
| 6,981,090 | B1 | 12/2005 | Kutz et al. |
| 6,988,192 | B2 | 1/2006 | Snider |
| 6,996,799 | B1 | 2/2006 | Cismas et al. |
| 7,005,933 | B1 | 2/2006 | Shutt |
| 7,009,444 | B1 | 3/2006 | Scott |
| 7,010,773 | B1 | 3/2006 | Bartz et al. |
| 7,015,735 | B2 | 3/2006 | Kimura et al. |
| 7,017,145 | B2 | 3/2006 | Taylor |
| 7,017,409 | B2 | 3/2006 | Zielinski et al. |
| 7,020,854 | B2 | 3/2006 | Killian et al. |
| 7,023,215 | B2 | 4/2006 | Steenwyk |
| 7,023,257 | B1 | 4/2006 | Sullam |
| 7,024,636 | B2 | 4/2006 | Weed |
| 7,024,654 | B2 | 4/2006 | Bersch et al. |
| 7,026,861 | B2 | 4/2006 | Steenwyk |
| 7,030,513 | B2 | 4/2006 | Caldwell |
| 7,030,656 | B2 | 4/2006 | Lo et al. |
| 7,030,688 | B2 | 4/2006 | Dosho et al. |
| 7,030,782 | B2 | 4/2006 | Ely et al. |
| 7,034,603 | B2 | 4/2006 | Brady et al. |
| 7,042,301 | B2 | 5/2006 | Sutardja |
| 7,047,166 | B2 | 5/2006 | Dancea |
| 7,055,035 | B2 | 5/2006 | Allison et al. |
| 7,058,921 | B1 | 6/2006 | Hwang et al. |
| 7,073,158 | B2 | 7/2006 | McCubbrey |
| 7,076,420 | B1 | 7/2006 | Snyder et al. |
| 7,079,166 | B1 | 7/2006 | Hong |
| 7,086,014 | B1 | 8/2006 | Bartz et al. |
| 7,088,166 | B1 | 8/2006 | Reinschmidt et al. |
| 7,089,175 | B1 | 8/2006 | Nemecek et al. |
| 7,091,713 | B2 | 8/2006 | Erdélyi et al. |
| 7,092,980 | B1 | 8/2006 | Mar et al. |
| 7,098,414 | B2 | 8/2006 | Caldwell |
| 7,099,818 | B1 | 8/2006 | Nemecek et al. |
| 7,103,108 | B1 | 9/2006 | Beard |
| 7,109,978 | B2 | 9/2006 | Gillespie et al. |
| 7,117,485 | B2 | 10/2006 | Wilkinson et al. |
| 7,119,550 | B2 | 10/2006 | Kitano et al. |
| 7,119,602 | B2 | 10/2006 | Davis |
| 7,124,376 | B2 | 10/2006 | Zaidi et al. |
| 7,127,630 | B1 | 10/2006 | Snyder |
| 7,129,793 | B2 | 10/2006 | Gramegna |
| 7,129,873 | B2 | 10/2006 | Kawamura |
| 7,132,835 | B1 | 11/2006 | Arcus |
| 7,133,140 | B2 | 11/2006 | Lukács et al. |
| 7,133,793 | B2 | 11/2006 | Ely et al. |
| 7,138,841 | B1 | 11/2006 | Li et al. |
| 7,138,868 | B2 | 11/2006 | Sanchez et al. |
| 7,139,530 | B2 | 11/2006 | Kusbel |
| 7,141,968 | B2 | 11/2006 | Hibbs et al. |
| 7,141,987 | B2 | 11/2006 | Hibbs et al. |
| 7,149,316 | B1 | 12/2006 | Kutz et al. |
| 7,150,002 | B1 | 12/2006 | Anderson et al. |
| 7,151,528 | B2 | 12/2006 | Taylor et al. |
| 7,152,027 | B2 | 12/2006 | Andrade et al. |
| 7,154,294 | B2 | 12/2006 | Liu et al. |
| 7,161,936 | B1 | 1/2007 | Barrass et al. |
| 7,162,410 | B1 | 1/2007 | Nemecek et al. |
| 7,171,455 | B1 | 1/2007 | Gupta et al. |
| 7,176,701 | B2 | 2/2007 | Wachi et al. |
| 7,178,096 | B2 | 2/2007 | Rangan et al. |
| 7,180,342 | B1 | 2/2007 | Shutt et al. |
| 7,185,162 | B1 | 2/2007 | Snyder |
| 7,185,321 | B1 | 2/2007 | Roe et al. |
| 7,188,063 | B1 | 3/2007 | Snyder |
| 7,193,901 | B2 | 3/2007 | Ruby et al. |
| 7,200,507 | B2 | 4/2007 | Chen et al. |
| 7,206,733 | B1 | 4/2007 | Nemecek |
| 7,212,189 | B2 | 5/2007 | Shaw et al |
| 7,221,187 | B1 | 5/2007 | Snyder et al. |
| 7,227,389 | B2 | 6/2007 | Gong et al. |
| 7,236,921 | B1 | 6/2007 | Nemecek et al. |
| 7,250,825 | B2 | 7/2007 | Wilson et al. |
| 7,256,588 | B2 | 8/2007 | Howard et al. |
| 7,265,633 | B1 | 9/2007 | Stiff |
| 7,281,846 | B2 | 10/2007 | McLeod |
| 7,282,905 | B2 | 10/2007 | Chen et al. |
| 7,283,151 | B2 | 10/2007 | Nihei et al. |
| 7,287,112 | B1 | 10/2007 | Pleis et al. |
| 7,288,977 | B2 | 10/2007 | Stanley |
| 7,290,244 | B2 | 10/2007 | Peck et al. |
| 7,295,049 | B1 | 11/2007 | Moyal et al. |
| 7,298,124 | B2 | 11/2007 | Kan et al. |
| 7,301,835 | B2 | 11/2007 | Joshi et al. |
| 7,305,510 | B2 | 12/2007 | Miller |
| 7,307,485 | B1 | 12/2007 | Snyder et al. |
| 7,308,608 | B1 | 12/2007 | Pleis et al. |
| 7,312,616 | B2 | 12/2007 | Snyder |
| 7,323,879 | B2 | 1/2008 | Kuo et al. |
| 7,342,405 | B2 | 3/2008 | Eldridge et al. |
| 7,358,714 | B2 | 4/2008 | Watanabe et al. |
| 7,367,017 | B2 | 4/2008 | Maddocks et al. |
| 7,373,437 | B2 | 5/2008 | Seigneret et al. |

| Patent/Pub No. | Date | Inventor |
|---|---|---|
| 7,376,001 B2 | 5/2008 | Joshi et al. |
| 7,376,904 B2 | 5/2008 | Cifra et al. |
| 7,386,740 B2 | 6/2008 | Kutz et al. |
| 7,400,183 B1 | 7/2008 | Sivadasan et al. |
| 7,406,674 B1 | 7/2008 | Ogami et al. |
| 7,421,251 B2 | 9/2008 | Westwick et al. |
| 7,466,307 B2 | 12/2008 | Trent, Jr. et al. |
| 7,542,533 B2 | 6/2009 | Jasa et al. |
| 7,554,847 B2 | 6/2009 | Lee |
| 7,616,509 B2 | 11/2009 | Qureshi et al. |
| 2001/0002129 A1 | 5/2001 | Zimmerman et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Karniewicz |
| 2001/0045861 A1 | 11/2001 | Bloodworth et al. |
| 2002/0010716 A1 | 1/2002 | McCartney et al. |
| 2002/0016706 A1* | 2/2002 | Cooke et al. .................. 703/20 |
| 2002/0023110 A1 | 2/2002 | Fortin et al. |
| 2002/0052729 A1 | 5/2002 | Kyung et al. |
| 2002/0059543 A1 | 5/2002 | Cheng et al. |
| 2002/0063688 A1 | 5/2002 | Shaw et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0080186 A1 | 6/2002 | Frederiksen |
| 2002/0085020 A1 | 7/2002 | Carroll, Jr. |
| 2002/0091739 A1 | 7/2002 | Ferlitsch et al. |
| 2002/0099863 A1 | 7/2002 | Comeau et al. |
| 2002/0109722 A1 | 8/2002 | Rogers et al. |
| 2002/0116168 A1 | 8/2002 | Kim |
| 2002/0121679 A1 | 9/2002 | Bazarjani et al. |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0144099 A1 | 10/2002 | Muro, Jr. et al. |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156929 A1* | 10/2002 | Hekmatpour ............... 709/310 |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174134 A1 | 11/2002 | Goykhman |
| 2002/0174411 A1 | 11/2002 | Feng et al. |
| 2002/0188910 A1 | 12/2002 | Zizzo |
| 2002/0191029 A1 | 12/2002 | Gillespie et al. |
| 2003/0011639 A1 | 1/2003 | Webb |
| 2003/0014447 A1 | 1/2003 | White |
| 2003/0025734 A1 | 2/2003 | Boose et al. |
| 2003/0041235 A1 | 2/2003 | Meyer |
| 2003/0056071 A1 | 3/2003 | Triece et al. |
| 2003/0058469 A1 | 3/2003 | Buis et al. |
| 2003/0061572 A1 | 3/2003 | McClannahan et al. |
| 2003/0062889 A1 | 4/2003 | Ely et al. |
| 2003/0080755 A1 | 5/2003 | Kobayashi |
| 2003/0097640 A1 | 5/2003 | Abrams et al. |
| 2003/0105620 A1 | 6/2003 | Bowen |
| 2003/0126947 A1 | 7/2003 | Margaria |
| 2003/0135842 A1 | 7/2003 | Frey et al. |
| 2003/0149961 A1 | 8/2003 | Kawai et al. |
| 2003/0229482 A1 | 12/2003 | Cook et al. |
| 2004/0018711 A1 | 1/2004 | Madurawe |
| 2004/0054821 A1 | 3/2004 | Warren et al. |
| 2004/0153802 A1 | 8/2004 | Kudo et al. |
| 2004/0205553 A1 | 10/2004 | Hall et al. |
| 2004/0205617 A1 | 10/2004 | Light |
| 2004/0205695 A1 | 10/2004 | Fletcher |
| 2005/0024341 A1 | 2/2005 | Gillespie et al. |
| 2005/0066152 A1 | 3/2005 | Garey |
| 2005/0143968 A9 | 6/2005 | Odom et al. |
| 2005/0240917 A1 | 10/2005 | Wu |
| 2005/0248534 A1 | 11/2005 | Kehlstadt |
| 2005/0280453 A1 | 12/2005 | Hsieh |
| 2006/0015862 A1 | 1/2006 | Odom et al. |
| 2006/0031768 A1 | 2/2006 | Shah et al. |
| 2006/0032680 A1 | 2/2006 | Elias et al. |
| 2006/0097991 A1 | 5/2006 | Hotelling et al. |
| 2006/0273804 A1 | 12/2006 | Delorme et al. |
| 2007/0139074 A1 | 6/2007 | Reblewski |
| 2007/0258458 A1 | 11/2007 | Kapoor |
| 2008/0095213 A1 | 4/2008 | Lin et al. |
| 2008/0186052 A1 | 8/2008 | Needham et al. |
| 2008/0259998 A1 | 10/2008 | Venkataraman et al. |
| 2008/0294806 A1 | 11/2008 | Swindle et al. |
| 2009/0322305 A1 | 12/2009 | De Cremoux |

FOREIGN PATENT DOCUMENTS

| | | |
|---|---|---|
| EP | 0308583 A1 | 3/1989 |
| EP | 0308583 A2 | 3/1989 |
| EP | 0308583 A2 | 3/1989 |
| EP | 368398 A1 | 5/1990 |
| EP | 0450863 A1 | 10/1991 |
| EP | 0450863 A2 | 10/1991 |
| EP | 0450863 A2 | 10/1991 |
| EP | 0499383 A2 | 8/1992 |
| EP | 063916 A2 | 2/1995 |
| EP | 1170671 A1 | 1/2002 |
| EP | 1170671 A1 | 1/2002 |
| EP | 1205848 A1 | 5/2002 |
| EP | 1191423 A2 | 2/2003 |
| JP | 404083405 A1 | 3/1992 |
| JP | 405055842 A1 | 3/1993 |
| JP | 06021732 A1 | 1/1994 |
| JP | 404095408 A1 | 3/2002 |
| WO | 9532478 | 11/1995 |
| WO | 9532478 A1 | 11/1995 |
| WO | PCT/US96/17305 A1 | 6/1996 |
| WO | PCT/US98/34376 A1 | 8/1998 |
| WO | PCT/US99/09712 A1 | 2/1999 |

OTHER PUBLICATIONS

PSOC Designer: Integrated Development Environment, May 30, 2001: Cypress Microsystems, Inc. 92 pages.

Kory Hopkins; "Definition"; Jan. 16, 1997; http://www.cs.sfu.ca/cs/people/GradStuden...sonal/papers/graph_isomorphism/node2.html 1 page.

C. Ebeling et al.; Validating VLSI Circuit Layout by Wirelist Comparison; Sep. 1983; in proceedings of the IEEE International Conference on Computer Aided Design (ICCAD-83), pp. 172-173.

Ohlrich et al.; "Sub-Gemini: Identifying Subcircuits Using a Fast Subgraph Isomorphism Algorithm"; Jun. 1993; in proceedings of the 30th IEEE/ACM Design Automation Conference 7 pages.

Ebeling; "Gemini II: A Second Generation Layout Validation Program"; 1988; In proceedings of the IEEE International Conference on Computer Aided Design (ICCAD-88), pp. 322-325.

CYPR-CD00169; "Programmable Microcontroller Architecture (Mixedanalog/Digital)"; Aug. 7, 2001; U.S. Appl. No. 09/924,734; Snyder et al. 28 pages.

CYPR-CD00170; "Digital Configurable Macro Architecture"; Jul. 18, 2001; U.S. Appl. No. 09/909,045; W. Snyder 37 pages.

CYPR-CD00172; "Configuring Digital Functions in a Digital Configurable Macro Architecture"; Jul. 18, 2001; U.S. Appl. No. 09/909,109; W. Snyder 28 pages.

CYPR-CD00173; " A Programmable Analog System Architecture (As Amended)"; Jul. 18, 2001; U.S. Appl. No. 09/909,047; M. Mar 87 pages.

CYPR-CD00174; "Programming Methodology and Architecture for a Programmable Analog System (As Amended)"; Aug. 14, 2001; U.S. Appl. No. 09/930,021; Mar et al. 60 pages.

CYPR-CD00175; "Method for Synchronizing and Resetting Clock Signals Supplied to Multiple Programmable Analog Blocks (As Amended)"; Oct. 1, 2001; U.S. Appl. No. 09/969,311; B. Sullam 57 pages.
CYPR-CD00180; "Method and Apparatus for Programming a Flash Memory"; Jun. 5, 2001; U.S. Appl. No. 09/875;599; W. Snyder 23 pages.
CYPR-CD00182; "In-System Chip Emulator Architecture"; Oct. 10, 2001; U.S. Appl. No. 09/975,115; Synder et al. 38 pages.
CYPR-CD00199; "Multiple Use of Microcontroller Pad"; Jun. 26, 2001; U.S. Appl. No. 09/893,050; Kutz et al. 21 pages.
CYPR-CD00226; "Programming Archecture fora programmable Analog System"; Aug. 14, 2001; U.S. Appl. No. 09/929,891; Mar et al. 82 pages.
CYPR-CD00227; "Architecture for Synchronizing and Resetting Clock Signals Supplied to Multiple analog Programmable Analog Blocks"; Oct. 1, 2001; U.S. Appl. No. 09/969,313; B. Sullam 50 pages.
Goodenough, F., "Analog Counterparts of FPGAS ease System Design"Electronic Design, Penton Publishing Cleveland, OH, US vol. 42, No. 21, Oct. 14, 1994, pp. 63-66, 68, 7 XP000477345 ISSN: 0013-4872 the whole document.
Harbaum, T. et al.: "Design of a Flexable Coprocessor Unit" Proceedings of the euromicro Conference, XX XX, Sep. 1999, pp. 335-342, XP000879556, p. 3 right-hand column, line 13-page 338, left hand column, line 4; figure 1.
PSOC Designer: Integrated Development Environment, User Guide Revision 1.09, Cypress Microsystems, Inc, May 30, 2001.
USPTO Final Rejection Dated Feb. 13, 2006 for U.S. Appl. No. 09/994,600.
USPTO Final Rejection Dated May 4, 2005 for U.S. Appl. No. 09/994,600.
USPTO Final Rejection Dated Oct. 17, 2007 for U.S. Appl. No. 09/994,600.
USPTO Final Rejection Dated Dec. 8, 2006 for U.S. Appl. No. 09/994,600.
USPTO Notice of Improper Request for RCE Dated Nov. 6, 2006 for U.S. Appl. No. 09/994,600.
USPTO Non-Final Rejection Dated Jul. 17, 2006 for U.S. Appl. No. 09/994,600.
USPTO Non-Final Rejection Dated May 15, 2007 for U.S. Appl. No. 09/994,600.
USPTO Non-Final Rejection Dated Aug. 23, 2005 for U.S. Appl. No. 09/994,600.
USPTO Non-Final Rejection Dated Oct. 21, 2004 for U.S. Appl. No. 09/994,600.
USPTO Non-Final Rejection Dated May 15, 2008 for U.S. Appl. No. 09/994,600.
USPTO Non-Final Rejection Dated Nov. 12, 2008 for U.S. Appl. No. 09/994,600.
USPTO Final Rejection Dated Jun. 30, 2008 for U.S. Appl. No. 10/001,477.
USPTO Final Rejection Dated Jul. 23, 2007 for U.S. Appl. No. 10/001,477.
USPTO Final Rejection Dated Aug. 24, 2006 for U.S. Appl. No. 10/001,477.
USPTO Final Rejection Dated Oct. 24, 2005 for U.S. Appl. No. 10/001,477.
USPTO Non-Final Rejection Dated Jan. 22, 2007 for U.S. Appl. No. 10/001,477.
USPTO Non-Final Rejection Dated Mar. 2, 2006 for U.S. Appl. No. 10/001,477.
USPTO Non-Final Office Action Dated May 11, 2005 for U.S. Appl. No. 10/001,477.
USPTO Non-Final Office Action Dated Dec. 6, 2007 for U.S. Appl. No. 10/001,477.
USPTO Non-Final Office Action Dated Nov. 10, 2008 for U.S. Appl. No. 10/001,477.
USPTO Non-Final Office Action Dated Feb. 6, 2006 for U.S. Appl. No. 10/002,217.
USPTO Non-Final Office Action Dated Mar. 7, 2007 for U.S. Appl. No. 10/002,217.
USPTO Non-Final Office Action Dated Nov. 17, 2005 for U.S. Appl. No. 10/002,217.
USPTO Non-Final Office Action Dated Apr. 3, 2006 for U.S. Appl. No. 10/002,217.
USPTO Non-Final Office Action Dated May 19, 2005 for U.S. Appl. No. 10/002,217.
USPTO Non-Final Office Action Dated Aug. 3, 2007 for U.S. Appl. No. 10/002,217.
USPTO Non-Final Office Action Dated Oct. 2, 2006 for U.S. Appl. No. 10/002,217.
USPTO Notice of Allowance Dated Jun. 6, 2008 for U.S. Appl. No. 10/002,217.
USPTO Notice of Allowance Dated Oct. 14, 2008 for U.S. Appl. No. 10/002,217.
USPTO Final Office Action Dated Jan. 30, 2008 for U.S. Appl. No. 09/989,777.
USPTO Final Office Action Dated Mar. 13, 2007 for U.S. Appl. No. 09/989,777.
USPTO Final Office Action Dated Dec. 21, 2005 for U.S. Appl. No. 09/989,777.
USPTO Non-Final Office Action Dated Apr. 11, 2006 for U.S. Appl. No. 09/989,777.
USPTO Non-Final Office Action Dated Jul. 5, 2005 for U.S. Appl. No. 09/989,777.
USPTO Non-Final Office Action Dated Sep. 11, 2007 for U.S. Appl. No. 09/989,777.
USPTO Non-Final Office Action Dated Sep. 13, 2006 for U.S. Appl. No. 09/989,777.
USPTO Advisory Action Dated May 23, 2006 for U.S. Appl. No. 09/994,601.
USPTO Final Rejection Dated Mar. 8, 2006 for U.S. Appl. No. 09/994,601.
USPTO Final Rejection Dated Mar. 24, 2005 for U.S. Appl. No. 09/994,601.
USPTO Final Rejection Dated Apr. 17, 2008 for U.S. Appl. No. 09/994,601.
USPTO Final Rejection Dated May 18, 2007 for U.S. Appl. No. 09/994,601.
USPTO Non-Final Rejection Dated Jul. 29, 2004 for U.S. Appl. No. 09/994,601.
USPTO Notice of Allowance Dated Jul. 7, 2007 for U.S. Appl. No. 09/989,777.
USPTO Notice of Allowance Dated Sep. 15, 2008 for U.S. Appl. No. 09/989,777.
USPTO Notice of Allowance Dated Nov. 4, 2008 for U.S. Appl. No. 09/989,777.
USPTO Ex Parte Qualyle Dated Jun. 18, 2007 for U.S. Appl. No. 09/992,076.
USPTO Final Rejection Dated Jan. 30, 2007 for U.S. Appl. No. 09/992,076.
USPTO Final Rejection Dated Mar. 17, 2006 for U.S. Appl. No. 09/992,076.
USPTO Non-Final Rejection Dated Jun. 1, 2005 for U.S. Appl. No. 09/992,076.
USPTO Non-Final Rejection Dated Aug. 10, 2006 for U.S. Appl. No. 09/992,076.
USPTO Non-Final Rejection Dated Nov. 21, 2005 for U.S. Appl. No. 09/992076.
USPTO Notice of Allowance Dated Mar. 26, 2008 for U.S. Appl. No. 09/992,076.
USPTO Notice of Allowance Dated Jul. 29, 2008 for U.S. Appl. No. 09/992,076.
USPTO Notice of Allowance Dated Nov. 13, 2008 for U.S. Appl. No. 09/992,076.
USPTO Notice of Allowance Dated Nov. 29, 2007 for U.S. Appl. No. 09/992,076.
USPTO Non-Final Rejection Dated Sep. 21, 2005 for U.S. Appl. No. 09/946,601.
USPTO Non-Final Rejection Dated Oct. 4, 2007 for U.S. Appl. No. 09/946,601.
USPTO Non-Final Rejection Dated Nov. 14, 2006 for U.S. Appl. No. 09/946,601.

USPTO Notice of Allowance Dated Dec. 22, 2008 for U.S. Appl. No. 09/946,601.
USPTO Advisory Action Dated May 15, 2006 for U.S. Appl. No. 09/989,778.
USPTO Final Rejection Dated Jan. 8, 2009 for U.S. Appl. No. 09/989,778.
USPTO Final Rejection Dated Feb. 5, 2007 for U.S. Appl. No. 09/989,778.
USPTO Final Rejection Dated Feb. 15, 2006 for U.S. Appl. No. 09/989,778.
USPTO Final Rejection dated Dec. 20, 2007 for U.S. Appl. No. 09/989,778.
USPTO Non-Final Rejection Dated Mar. 29, 2005 for U.S. Appl. No. 09/989,778.
USPTO Non-Final Rejection Dated Jul. 14, 2008 for U.S. Appl. No. 09/989,778.
USPTO Non-Final Rejection Dated Jul. 19, 2007 for U.S. Appl. No. 09/989,778.
USPTO Non-Final Rejection Dated Sep. 1, 2005 for U.S. Appl. No. 09/989,778.
USPTO Non-Final Rejection Dated Sep. 18, 2006 for U.S. Appl. No. 09/989,778.
USPTO Final Rejection Dated Jun. 14, 2005 for U.S. Appl. No. 09/998,848.
USPTO Final Rejection Dated Jul. 25, 2006 for U.S. Appl. No. 09/998,848.
USPTO Final Rejection Dated Aug. 10, 2007 for U.S. Appl. No. 09/998,848.
USPTO Final Rejection Dated Nov. 24, 2008 for U.S. Appl. No. 09/998,848.
USPTO Non-Final Rejection Dated Jan. 26, 2006 for U.S. Appl. No. 09/998,848.
USPTO Non-Final Rejection Dated Jan. 29, 2007 for U.S. Appl. No. 09/998,848.
USPTO Non-Final Rejection Dated Feb. 22, 2008 for U.S. Appl. No. 09/998,848.
USPTO Non-Final Rejection Dated Dec. 21, 2004 for U.S. Appl. No. 09/998,848.
USPTO Final Rejection Dated Jan. 11, 2007 for U.S. Appl. No. 09/989,767.
USPTO Final Rejection Dated Jan. 15, 2009 for U.S. Appl. No. 09/989,767.
USPTO Final Rejection Dated Mar. 6, 2006 for U.S. Appl. No. 09/989,767.
USPTO Final Rejection Dated Apr. 6, 2005 for U.S. Appl. No. 09/989,767.
USPTO Final Rejection Dated Dec. 27, 2007 for U.S. Appl. No. 09/989,767.
USPTO Non-Final Rejection Dated Jul. 17, 2006 for U.S. Appl. No. 09/989,767.
USPTO Non-Final Rejection Dated Jul. 2, 2007 for U.S. Appl. No. 09/989,767.
USPTO Non-Final Rejection Dated Jul. 24, 2008 for U.S. Appl. No. 09/989,767.
USPTO Non-Final Rejection Dated Oct. 6, 2004 for U.S. Appl. No. 09/989,767.
USPTO Final Rejection Dated Feb. 27, 2007 for U.S. Appl. No. 09/989,771.
USPTO Final Rejection Dated Mar. 28, 2006 for U.S. Appl. No. 09/989,771.
USPTO Final Rejection Dated Apr. 6, 2005 for U.S. Appl. No. 09/989,771.
USPTO Final Rejection Dated Dec. 10, 2008 for U.S. Appl. No. 09/989,771.
USPTO Final Rejection Dated Dec. 27, 2007 for Appl. No. 09/989,771.
USPTO Non-Final Rejection Dated May 28, 2008 for U.S. Appl. No. 09/989,771.
USPTO Non-Final Rejection Dated Jul. 16, 2007 for U.S. Appl. No. 09/989,771.
USPTO Non-Final Rejection Dated Aug. 23, 2006 for U.S. Appl. No. 09/989,771.
USPTO Non-Final Rejection Dated Sep. 12, 2005 for U.S. Appl. No. 09/989,771.
USPTO Non-Final Rejection Dated Sep. 22, 2004 for U.S. Appl. No. 09/989,771.
USPTO Final Rejection Dated Apr. 3, 2007, for U.S. Appl. No. 09/989,765.
USPTO Final Rejection Dated Apr. 4, 2008 for U.S. Appl. No. 09/989,765.
USPTO Final Rejection Dated Apr. 17, 2006 for U.S. Appl. No. 09/989,765.
USPTO Non-Final Rejection Dated Sep. 19, 2007 for U.S. Appl. No. 09/989,765.
USPTO Non-Final Rejection Dated Sep. 26, 2008 for U.S. Appl. No. 09/989,765.
USPTO Non-Final Rejection Dated Oct. 2, 2006 for U.S. Appl. No. 09/989,765.
USPTO Non-Final Rejection Dated Oct. 5, 2005 for U.S. Appl. No. 09/989,765.
USPTO Final Rejection Dated Jul. 9, 2008 for U.S. Appl. No. 09/989,782.
USPTO Final Rejection Dated Jul. 24, 2007 for U.S. Appl. No. 09/989,782.
USPTO Final Rejection Dated Sep. 21, 2006 for U.S. Appl. No. 09/989,782.
USPTO Final Rejection Dated Nov. 3, 2005 for U.S. Appl. No. 09/989,782.
USPTO Non-Final Rejection Dated Jan. 29, 2007 for U.S. Appl. No. 09/989,782.
USPTO Non-Final Rejection Dated Mar. 28, 2006 for U.S. Appl. No. 09/989,782.
USPTO Non-Final rejection Dated Apr. 29, 2005 for U.S. Appl. No. 09/989,782.
USPTO Non-Final Rejection Dated Oct. 6, 2004 for U.S. Appl. No. 09/989,782.
USPTO Non-Final Rejection Dated Nov. 26, 2008 for U.S. Appl. No. 09/989,782.
USPTO Non-Final Rejection Dated Dec. 14, 2007 for U.S. Appl. No. 09/989,782.
USPTO Final Rejection Dated Feb. 10, 2005 for U.S. Appl. No. 10/008,096.
USPTO Final Rejection Dated Jun. 16, 2008 for U.S. Appl. No. 10/008,096.
USPTO Final Rejection Dated Sep. 4, 2007 for U.S. Appl. No. 10/008,096.
USPTO Final Rejection Dated Oct. 13, 2006 for U.S. Appl. No. 10/008,096.
USPTO Final Rejection Dated Nov. 25, 2005 for U.S. Appl. No. 10/008,096.
USPTO Non-Final Rejection Dated Mar. 7, 2007 for U.S. Appl. No. 10/008,096.
USPTO Non-Final Rejection Dated Apr. 17, 2006 for U.S. Appl. No. 10/008,096.
USPTO Non-Final Rejection Dated Jun. 14, 2004 for U.S. Appl. No. 10/008,096.
USPTO Non-Final Rejection Dated Jun. 24, 2005 for U.S. Appl. No. 10/008,096.
USPTO Non-Final Rejection Dated Dec. 12, 2007 for U.S. Appl. No. 10/008,096.
USPTO Notice of Allowance Dated Dec. 22, 2008 for U.S. Appl. No. 10/008,096.
USPTO Final Rejection Dated Jun. 4, 2008 for U.S. Appl. No. 10/001,478.
USPTO Final Rejection Dated Sep. 5, 2006 for U.S. Appl. No. 10/001,478.
USPTO Final Rejection Dated Sep. 17, 2007 for U.S. Appl. No. 10/001,478.
USPTO Final Rejection Dated Oct. 24, 2005 for U.S. Appl. No. 10/001,478.
USPTO Final Rejection Dated Jan. 30, 2008 for U.S. Appl. No. 10/001,478.
USPTO Non-Final Rejection Dated Mar. 15, 2006 for U.S. Appl. No. 10/001,478.

USPTO Non-Final Rejection Dated Apr. 2, 2007 for U.S. Appl. No. 10/001,478.
USPTO Non-Final Rejection Dated May. 16, 2005 for U.S. Appl. No. 10/001,476.
USPTO Non-Final Rejection Dated Oct. 20, 2008 for U.S. Appl. No. 10/001,478.
USPTO Notice of Allowance for U.S. Appl. No. 10/238,966, Dated Jan. 27, 2009; 4 pages.
USPTO Non-Final Rejection for U.S. Appl. No. 10/238,966, dated Jun. 30, 2008; 12 pages.
USPTO Non-Final Rejection for U.S. Appl. No. 10/238,966, dated Dec. 26, 2007; 12 pages.
USPTO Final Rejection for U.S. Appl. No. 10/238,966, dated Sep. 27, 2007; 9 pages.
USPTO Non-Final Rejection for U.S. Appl. No. 10/238,966, dated Apr. 19, 2007; 7 pages.
USPTO Non-Final Rejection for U.S. Appl. No. 10/238,966 dated Oct. 20, 2006; 8 pages.
USPTO Non-Final Rejection for U.S. Appl. No. 10/238,966 dated Apr. 6, 2006; pages 8.
USPTO Notice of Allowance for U.S. Appl. No. 10/033,027 dated Mar. 31, 2009; 7 pages.
USPTO Non-Final Rejection for U.S. Appl. No. 10/033,027 dated Dec. 18, 2008; 5 pages.
USPTO Final Rejection for U.S. Appl. No. 10/033,027 dated Jun. 8, 2007; 8 pages.
USPTO Non-Final Rejection for U.S. Appl. No. 10/033,027 dated Dec. 21, 2006;p 31 pages.
USPTO Final Rejection for U.S. Appl. No. 10/033,027 dated Aug. 9, 2006; 6 pages.
USPTO Non-Final Rejection for U.S. Appl. No. 10/033,027 dated Apr. 26, 2006; 26 pages.
USPTO Final Rejection for U.S. Appl. No. 10/033,027 dated Oct. 31, 2005; 24 pages.
USPTO Non-Final Rejection for U.S. Appl. No. 10/033,027 dated Apr. 20, 2005; 20 pages.
USPTO Non-Final Rejection for U.S. Appl. No. 10/033,027 dated Oct. 18, 2004; 17 pages.
USPTO Notice of Allowance for U.S. Appl. No. 10/001,477 dated Nov. 10, 2008, 7 pages.
USPTO Advisory Action for U.S. Appl. No. 10/001,477 dated Oct. 10, 2008; 3 pages.
USPTO Final Rejection for U.S. Appl. No. 10/001,477 dated Jun. 30, 2008; 15 pages.
USPTO Non-Final Rejection for U.S. Appl. No. dated Dec. 6, 2007; 13 pages.
USPTO Final Rejection for U.S. Appl. No. dated Jul. 23, 2007; 16 pages.
USPTO Non-Final Rejection for U.S. Appl. No. 10/001,477 dated Jan. 22, 2007; 15 pages.
USPTO Final Rejection for U.S. Appl. No. 10/001,477 dated Aug. 24, 2006; 13 pages.
USPTO Non-Final Rejection for U.S. Appl. No. 10/001,477 dated Mar. 2, 2006; 14 pages.
USPTO Final Rejection for U.S. Appl. No. 10/001,477 dated Oct. 24, 2005; 13 pages.
USPTO Non-Final Rejection for U.S. Appl. No. 10/001,477 dated May 11, 2005; 10 pages.
USPTO Notice of Allowance for U.S. Appl. No. 10/002,217 dated Jan. 28, 2009; 4 pages.
USPTO Final Rejection for U.S. Appl. No. 10/002,217 dated Feb. 6, 2008; 10 pages.
"Micropower CMOS Temperature Sensor with Digital Output;"Bakker et al., IEEE Journal of Solid-State Circuits, 1996; 3 pages.
"WP 3.5: An Integrated Time Reference;" Blauschild, Digest of Technical Papers, 1994; 4 pages.
"An Analog PPL-Based Clock and Data Recovery Circuit with High Input Jitter Tolerance;" Sun, Reprinted from IEEE Journal of Solid-State Circuits, 1989; 4 pages.
U.S. App. No. 09/842,966: "Precision Crystal Oscillator Circuit Used in Microcontroller," Mar. 28 pages.

U.S. Appl. No. 09/964,991: "A Novel Band-Gap Circuit for Providing an Accurate Reference Voltage Compensated for Process State, Process Variations and Temperature," Kutz et al.; 25 pages.
ITO, Sergio Akira and Carro, Luigi; "A Comparison of Microcontrollers Targeted to FPGA-Based Embedded Applications", Sep. 2000, Proceedings of 13th Symposium on Integrated Circuits and Systems Design, 18-24 Sep. 2000; 6 pages.
Julio Faura et al.; "A Novel Mixed Signal Programmable Device With On-Chip Microprocessor", 1997, IEEE 1997 Custom Integrated Circuits Conference; 4 pages.
Monte Mar, Bert Sullam, Eric Blom; "An architecture for a configurable Mixed-signal device", 2003, IEEE Journal of Solid-State Circuits, vol. 3; 4 pages.
Robinson, Gordon D; "Why 1149.1 (JTAG) Really Works", May 1994, Conference Proceedings Electro/94 International, May 10-12, 1994, Combined Volumes; 6 pages.
"PSOC designer: Integrated development environment, getting started 25-minute tutorial, version 1.0", Cypress Microsystems., Cypress Microsystems, Inc. CMS10006A, Jul. 3, 2001; 25 pages.
"PSOC technology complete changes 8-bit MCU system design", Cypress Microsystems, Inc. retrieved from <http>://www.archive.org/web/20010219005250/http://cypressmicro.com- /t...>, Feb. 19, 2001; 21 pages.
Specks et al., "A Mixed Digital-Analog 16B Microcontroller with 0.5MB Flash Memory, On-Chip Power Supply, Physical Nework Interface, and 40V I/O for Automotive Single-Chip Mechatronics, " IEEE, Feb. 9, 2000; 1 page.
Hsieh et al., "Modeling Micro-Controller Peripherals for High Level Co-Simulation and Synthesis," IEEE, 1997; 4 pages.
U.S. Appl. No. 10/803,030: "Programmable Microcontroller Architecture (Mixed Analog/Digital);", 13 pages.
U.S. Appl. No. 10/033,027: "Microcontrollable Programmable System on a Chip;" Synder; 117 pages.
USPTO Advisory Action for U.S. Appl. No. 11/200,619 dated May 11, 2009; 3pp.
USPTO Final Rejection for U.S. Appl. No. 11/200,619 dated Mar. 3, 2009; 14 pages.
USPTO Non-Final Rejection for U.S. Appl. No. 11/200,619 dated Aug. 27, 2008; 13 pages.
U.S. Appl. No. 11/200,619: "Providing hardware independence to automate code generation of processing device firmware," Snyder et al.; 41 pages.
USPTO Notice of Allowance for U.S. Appl. No. 11/201,922 dated Apr. 9, 2009; 4 pages.
USPTO Non-Final Rejection for U.S. Appl. No. 11/201,922 dated Oct. 21, 2008; 12 pages.
USPTO Final Rejection for U.S. Appl. No. 11/201,922 dated Apr. 30, 2008; 10 pages.
USPTO Non-Final Rejection for U.S. Appl. No. 11/201,922 dated Oct. 15, 2007; 10 pages.
U.S. Appl. No. 11/201,922 : "Design model for a hardware device-independent method of defining embedded firmware for programmable systems," McDonald et al.; 31 pages.
USPTO Non-Final Rejection for U.S. Appl. No. 11/201,627 dated Dec. 12, 2008; 17 pages.
USPTO Final Rejection for U.S. Appl. No. 11/201,627 dated Apr. 29, 2008; 21 pages.
USPTO Non-Final Rejection for U.S. Appl. No. 11/201,627 dated Nov. 16, 2007; 16 pages.
U.S. Appl. No. 11/201,627: "Method and an apparatus to design a processing system using a graphicasl user interface, "Ogami et al.; 37 pages.
USPTO Notice of Allowance for U.S. Appl. No. 09/989,808 dated Feb. 13, 2006; 4 pages.
USPTO Non-Final Rejection for U.S. Appl. No. 09/989,808 dated Oct. 19, 2005; 8 pages.
USPTO Non-Final Rejection for U.S. Appl. No. 09/989,808 dated Apr. 14, 2005; 8 pages.
U.S. Appl. No. 09/989,808: "Automatic generation of application program interfaces, source code, interrupts, and data sheets fro microcontroller programming,"Bartz et al.; 62 pages.
USPTO Notice of Allowance for U.S. Appl. No. 10/109,979 dated Mar. 14, 2006; 6 pages.

USPTO Non-Final Rejection for U.S. Appl. No. 10/109,979 dated Jun. 30, 2005; 6 pages.
U.S. Appl. No. 10/109,979: "Graphical user interface with logic unifying functions," Anderson et al.; 100 pages.
U.S. Appl. No. 09/979,781: "System and method for decoupling and iterating resources associated with a module," Ogami et al.; 40 pages.
U.S. Appl. No. 09/989,775: "User defined names for registers in memory banks derived from configurations," Ogami et al.; 29 pages.
USPTO Notice of Allowance for U.S. Appl. No. 09/989,819 dated Jan. 11, 2005; 7 pages.
USPTO Non-Final Rejection for U.S. Appl. No. 09/989,819 dated Jul. 13, 2004; 4 pages.
USPTO Miscellaneous Action for U.S. Appl. No. 09/989,819 dated Dec. 14, 2001; 1 page.
U.S. Appl. No. 09/989,819: "System and method for creating a boot file utilizing a boot template," Ogami et al.; 43 pages.
USPTO Notice of Allowance for U.S. Appl. No. 09/989,761 dated Jan. 14, 2005; 6 pages.
USPTO Final Rejection for U.S. Appl. No. 09/989,761 dated Aug. 26, 2004; 7 pages.
USPTO Non-Final Rejection for U.S. Appl. No. 09/989,761 dated Mar. 10, 2004; 6 pages.
USPTO Final Rejection for U.S. Appl. No. 09/989,761 dated Oct. 3, 2003; 7 pages.
USPTO Non-Final Rejection for U.S. Appl. No. 09/989,761 dated Apr. 18, 2003; 5 pages.
U.S. Appl. No. 09/989,761: "Storing of global parameter defaults and using them over two or more design projects," Ogami et al.; 37 pages.
Wang, et al. "Synthesizing Operating System Based Device Drivers in Embedded Systems," 2003, ACM; 8 pages.
Lutovac et al. "Symbolic Computation of Digital Filter Transfer Function Using Matlab," Proceedings of 23rd International Conference on Microelectronics (MIEL 2002), vol. 2 NIS, Yugoslavia; 4 pages.
Nouta et al. "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.
Xilinx, Virtex-II Pro Platform FPGA Developer's Kit, "How Data2BRAM Fits in with Hardware and Software Flows," Chapter 2: Using Data2BRAM; Jan. 2003 Release; 2 pages.
PCT Preliminary Report on Patentability (Chapter 1 of the Patent Cooperation Treaty), PCT/US2005/028793, filed Aug. 12, 2005, mailed Dec. 21, 2007; 2 pages.
PCT Written Opinion of the International Searching Authority for PCT/US2005/028793, filed Aug. 12, 2005, mailed Nov. 19, 2007; 7 pages.
PCT International Search Report of the International Searching Authority for PCT/US05/28793, filed Aug. 12, 2005, mailed Nov. 19, 2007; 5 pages.
International Search Report and Written Opinion of the International Searching Authority for PCT/US05/28898, filed Aug. 12, 2005, mailed Mar. 6, 2007; 6 pages.
Burogs et al., "Power Converter Analysis and Design using Matlab: A Transfer Function Approach," Proceedings of IEEE International Symposium on Industrial Electronics 1998, vol. 2; 6 pages.
Efstathiou, "Analog Electronics: Basic Circuits of Operational Amplifiers," <http://web.archive.org/ web/20021231045232> Dec. 31, 2002, version, retrieved from the Internet Archives; 10 pages.
PCT International Search Report for PCT/US05/28791, filed Aug. 12, 2005, mailed Mar. 31, 2008; 4 pages.
PCT International Written Opinion for PCT/US05/28791, filed Aug. 12, 2005, mailed Mar. 31, 2008; 8 pages.
"The Gemini Netlist Comparison Project;" <http://wvvw.cs.washington.edu/research/projects/lis/www/gemini/gemini. html> larry@cs.washington.edu; 2 pages Mar. 19, 2002.
U.S. Appl. No. 12/132,527: "System and Method for Performing Next Placements and Pruning of Disallowed Placements for Programming an Integrated Circuit;" Ogami et al.; 44 pages.
U.S. Appl. No. 11/850,260: "Circuit and Method for Improving the Accuracy of a Crystal-less Oscillator Having Dual-Frequency Modes;" Wright et al.; 33 pages.

USPTO Non-Final Rejection for U.S. Appl. No. 11/850,260 dated Feb. 25, 2009; 7 pages.
USPTO Non-Final Rejection for U.S. Appl. No. 11/644,100 dated Mar. 9, 2009; 11 pages.
USPTO Advisory Action for U.S. Appl. No. 11/644,100 dated Feb. 9, 2009; 3 pages.
USPTO Final Rejection for U.S. Appl. No. 11/644,100 dated Nov. 18, 2008; 12 pages.
USPTO Non-Final Rejection for U.S. Appl. No. 11/644,100 dated Apr. 14, 2008; 10 pages.
USPTO Notice of Allowance for U.S. Appl. No. 11/415,588 dated Mar. 11, 2008; 6 pages.
USPTO Advisory Action for U.S. Appl. No. 11/415,588 dated Jan. 14, 2008; 3 pages.
USPTO Final Rejection for U.S. Appl. No. 11/415,588 dated Oct. 19, 2007; 8 pages.
USPTO Non-Final Rejection for U.S. Appl. No. 11/415,588 dated Jun. 13, 2007; 8 pages.
USPTO Notice of Allowance for U.S. Appl. No. 12/218,404 dated Mar. 19, 2009; 7 pages.
USPTO Non-Final Rejection for U.S. Appl. No. 12/218,404 dated Sep. 30, 2008; 8 pages.
U.S. Appl. No. 11/644,100: "Differential-to-single ended signal converter circuit and method," Stiff; 33 pages.
U.S. Appl. No. 11/415,588: "Voltage Controlled Oscillator Delay Cell and Method," 24 pages Sivadasan et al.
U.S. Appl. No. 12/218,404: "Voltage Controlled Oscillator Delay Cell and Method," 23 pages Sivadasan et al.
USPTO Non-Final Rejection for U.S. Appl. No. 11/132,894 dated Apr. 26, 2007; 4 pages.
USPTO Non-Final Rejection for U.S. Appl. No. 11/132,894 dated Dec. 19, 2006; 12 pages.
U.S. Appl. No. 11/132,894: "Open Loop Bandwidth Test Architectire and Method for Phase Locked Loop (PLL),"Stiff; 38 pages.
USPTO Non-Final Rejection for U.S. Appl. No. 11/322,044 dated May 4, 2009; 18 pages.
USPTO Non-Final Rejection for Appl. No. 11/322,044 dated Nov. 25, 2008; 15 pages.
USPTO Non-Final Rejection for U.S. Appl. No. 11/322,044 dated Apr. 11, 2008; 11 pages.
USPTO Advisory Action for U.S. Appl. No. 11/322,044 dated Nov. 30, 2007; 2 pages.
USPTO Final Rejection for U.S. Appl. No. 111322,044 dated Sep. 21, 2007; 14 pages.
USPTO Non-Final Rejection for U.S. Appl. No. 11/322,044 dated Apr. 24, 2007; 13 pages.
U.S. Appl. No. 11/322,044: "Split charge pump PLL architecture,"Stiff; 19 pages.
USPTO Notice of Allowance for U.S. Appl. No. 10/305,589 dated Feb. 4, 2005; 5 pages.
USPTO Final Rejection for U.S. Appl. No. 10/305,589 dated Oct. 21, 2004; 7 pages.
USPTO Non-Final Rejection for U.S. Appl. No. 10/305,589 dated Oct. 7, 2003; 6 pages.
U.S. Appl. No. 10/305,589: "Current Controlled Delay Circuit,"Stiff; 18 pages.
U.S. Appl. No. 09/849,164: "Reduced Static Phase Error CMOS PLL Charge Pump,"Stiff; 30 pages.
Maneatis, "Low-Jitter Process-Independent DLL and PLL Based on Self-Biased Techniques,"IEEE Journal of Solid-State Circuits, vol. 31, No. 11, Nov. 1996; 10 pages.
Larsson, "A Feb. 1600-MHz Cmos Clock Recovery Pll with Low-V dd Capability," IEEE Journal of Solid-State Circuits, Vol. 34, No. 12, December 1999; 10 pages.
USPTO Notice of Allowance for U.S. Appl. No. 10/327,217 dated Aug. 12, 2004; 6 pages.
USPTO Non-Final Rejection for U.S. Appl. No. 10/327,217 dated Apr. 30, 2004; 5 pages.
USPTO Miscellaneous Action for U.S. Appl. No. 10/327,217 dated Feb. 10, 2004; 1 page.
U.S. Appl. No. 10/327,217: "Single Ended Clock Signal Generator Having a Differential Output," Richmond et al.; 27 pages.

USPTO Notice of Allowance for U.S. Appl. No. 10/871,582 dated Mar. 30, 2006; 6 pages.

USPTO Final Rejection for U.S. Appl. No. 10/871,582 dated Feb. 1, 2006; 5 pages.

USPTO Non-Final Rejection for U.S. Appl. No. 10/871,582 dated Sep. 7, 2005; 7 pages.

U.S. Appl. No. 10/871,582: "LVDS input Circuit with Extended Common Mode Range,"Reinschmidt et al.; 25 pages.

USPTO Notice of Allowance for U.S. Appl. No. 09/404,891 dated Mar. 4, 2005; 6 pages.

USPTO Final Rejection for U.S. Appl. No. 09/404,891 dated Dec. 8, 2004; 7 pages.

USPTO Non-Final Rejection for U.S. Appl. No. 09/404,891 dated Jun. 25, 2004; 6 pages.

USPTO Non-Final Rejection for U.S. Appl. No. 09/404,891 dated Jan. 5, 2004; 5 pages.

USPTO Non-Final Rejection for U.S. Appl. No. 09/404,891 dated Jul. 10, 2003; 6 pages.

USPTO Non-Final Rejection for U.S. Appl. No. 09/404,891dated Mar. 5, 2003; 6 pages.

USPTO Non-Final Rejection for U.S. Appl. No. 09/404,891 dated Oct. 11, 2002; 5 pages.

U.S. Appl. No. 09/404,891: "Method, Architecture and Circuitry for Controlling Pulse Width in a Phase and/or Frequency Detector," Scott et al.; 17 pages.

USPTO Notice of Allowance for U.S. Appl. No. 10/226,911 dated Aug. 20, 2004; 4 pages.

USPTO Non-Final Rejection for U.S. Appl. No. 10/226,911 dated Mar. 19, 2004; 6 pages.

U.S. Appl. No. 10/226,911: "Calibration of Integrated Circuit Time Constants," Gehring at al.; 32 pages.

USPTO Notice of Allowance for U.S. Appl. No. 09/943,149 dated Jan. 12, 2004; 7 pages.

USPTO Non-Final Rejection for U.S. Appl. No. 09/943,149 dated Aug. 28, 2003; 9 pages.

USPTO Final Rejection for U.S. Appl. No. 09/943,149 dated May 7, 2003; 10 pages.

USPTO Non-Final Rejection for U.S. Appl. No. 09/943,149 dated Nov. 20, 2002; 7 pages.

U.S. Appl. No. 09/943,149: "method for Phase Lock Loop,"Moyal et al.; 21 pages.

Durham et al., "Integrated Continuous-Time Balanced Filters for 16-bit DSP Interfaces," IEEE, 1993; 6 pages.

Durham et al., "Circuit Architectures for High Linearity Monolithic Continuous-Time Filtering," IEEE, 1992; 7 pages.

Durham et al., "High-Linearity Conitnuous-Time Filter in 5-V VLSI CMOS," IEEE, 1992; 8 pages.

U.S. Appl. No. 09/047,595 1"Roving Range Control to Limit Receive PLL Frequency of Operation," Scott; 35 pages.

U.S. Appl. No. 09/216,460: "Circuit and Method for Controlling an Output of a Ring Oscillator," Abugharbieh et al.; 21 pages.

U.S. Appl. No. 09/471,914: "Reference-Free Clock Generator and Data Recovery PLL," Dalmia et al.; 32 pages.

U.S. Appl. No. 091471,576: "Reference-Free Clock Generation and Data Recovery PLL," Dalmia; 30 pages.

U.S. Appl. No. 10/083,442: "Method/Architecture for a Low Gain PLL with Wide Frequency Range," Meyers et al.; 28 pages.

U.S. Appl. No. 09/470,665: "Digital Phase/Frequency Detector, and Clock Generator and Data Recovery PLL Containing the Same," Dalmia; 26 pages.

U.S. Appl. No. 09/893,161: "Architecture of a PLL with Dynamic Frequency Control on a PLD," Moore; 32 pages.

U.S. Appl. No. 09/608,753: "PLL Lockout Watchdog," Wilson et al.; 24 pages.

U.S. Appl. No. 091398,956 ; "Frequency Acquisition Rate Control in Phase Lock Loop Circuits," Moyal et al.; 35 pages.

U.S. Appl. No. 091747,262: "Linearized Digital Phase-Locked Loop," Williams et al.; 9 pages.

lApplication No. 09/981,448: "Oscillator Tuning Method," Hauck; 28 pages.

U.S. Appl. No. 09/538,989: "Memory Based Phase Locked Loop," Krishnan; 27 pages.

U.S. Appl. No. 09/048,905: "Programmable Clock Generator," Mann et al.; 42 pages.

U.S. Appl. No. 08/865,342: "Programmable Clock Generator," Mann et al.; 41 pages.

USPTO Notice of Allowance for U.S. Appl. No. 10/293,392 dated Mar. 10, 2004; 6 pages.

USPTO Non-Final Rejection for U.S. Appl. No. 10/293,392 dated Oct. 16, 2003; 6 pages.

U.S. Appl. No. 10/293,392: "Low Voltage Receiver Circuit and Method for Shifting the Differential Input Signals of the Receiver Depending on a Common Mode Voltage of the Input Signals," Maher et at ; 20 pages.

USPTO Notice of Allowance for U.S. Appl. No. 10/288,003 dated Jan. 14, 2005; 6 pages.

USPTOFinal Rejection for U.S. Appl. No. 10/288,003 dated Oct. 6, 2004; 6 pages.

USPTO Non-Final Rejection for U.S. Appl. No. 10/288,003 dated Apr. 7, 2004; 9 pages.

U.S. Appl. No. 10/288,003: "Low Voltage Differential Signal Driver Circuit and Method," Roper et al.; 30 pages.

USPTO Notice of Allowance for U.S. Appl. No. 09/989,777 dated Mar. 9, 2009, 7 pages.

USPTO Notice of Allowance for U.S. Appl. No. 09/875,599 dated Oct. 17, 2006; 4 pages.

USPTO Non-Final Rejection for U.S. Appl. No. 09/875,599 dated May 31, 2006; 18 pages.

USPTO Final Rejection for U.S. Appl. No. 09/875,599 dated Feb. 15, 2006; 18 pages.

USPTO Final Rejection for U.S. Appl. No. 09/875,599 dated Nov. 21, 2005; 16 pages.

USPTO Advisory Action for U.S. Appl. No. 09/875,599 dated Jun. 8, 2005; 3 pages.

USPTO Final Rejection for U.S. Appl. No. 09/875,599 dated Mar. 29, 2005; 20 pages.

USPTO Non-Final Rejection for U.S. Appl. No. 09/875,599 dated Dec. 3, 2004; 16 pages.

USPTO Final Rejection for U.S. Appl. No. 09/875,599 dated Aug. 25, 2004; 17 pages.

USPTO Final Rejection for Application No. 09/875,599 dated Apr. 26, 2004; 15 pages.

USPTO Notice of Allowance for Application No. 10/004,197 dated Feb. 09, 2007; 7 pages.

USPTO Notice of Allowance for Application No. 10/004,197 dated Oct. 06, 2006; 7 pages.

USPTO Non-Final Rejection for Application No. 10/004,197 dated Apr. 3, 2006; 13 pages.

USPTO Final Rejection for Application No. 10/004,197 dated Nov. 23, 2005; 17 pages.

USPTO Non-Final Rejection for Appl. No. 09/875,599 dated Oct. 27, 2003; 13 pages.

USPTO Non-Final Rejection for Application No. 10/004,197 dated Jun. 6, 2005; 21 pages.

USPTO Notice of Allowance for Application No. 10/004,039 dated Aug. 15, 2006; 7 pages.

USPTO Non-Final Rejection for Application No. 10/004,039 dated Apr. 11, 2006; 14 pages.

USPTO Final Rejection for Application No. 10/004,039 dated Nov. 22, 2005; 19 pages.

USPTO Non-Final Rejection for Application No. 10/004,039 dated Jun. 6, 2005; 17 pages.

USPTO Notice of Allowance for Application No. 10/001,568 dated Mar. 17, 2006; 9 pages.

USPTO Final Rejection for Application No. 10/001,568 dated Oct. 26, 2005; 16 pages.

USPTO Non-Final Rejection for Application No. 10/001,568 dated May 19, 2005; 16 pages.

USPTO Notice of Allowance for Application No. 09/887,955 dated Oct. 12, 2004; 5 pages.

USPTO Non-Final Rejection for Application No. 09/887,955 dated May 26, 2004; 5 pages.

USPTO Notice of Allowance for Application No. 09/826,397 dated Oct. 7, 2004; 8 pages.

USPTO Non-Final Rejection for Application No. 09/826,397 dated Apr. 21, 2004; 6 pages.
USPTO Notice of Allowance for Application No. 09/893,048 dated Jul. 25, 2006; 4 pages.
USPTO Non-Final Rejection for U.S. Appl. No. 09/893,048 dated Jan. 12, 2005; 6 pages.
USPTO Non-Final Rejection for Application No. 09/893,048 dated Jul. 27, 2005; 6 pages.
USPTO Non-Final Rejection for Appl. No. 09/893,048 dated Oct. 6, 2004; 5 pages.
Uspto Notice of Allowance for Application No. 09/893,050 dated Jul. 05, 2005; 6 pages.
Uspto Non-Final Rejection for Application No. 09/893,050 dated Jan. 05, 2005; 13 pages.
Uspto Final Rejection for Application No. 09/893,050 dated Aug. 30, 2004; 13 pages.
Uspto Non-Final Rejection for Application No. 091893,050 dated 01/1512004; 9 pages.
USPTO Notice of Allowance for Appl. No. 09/909,047 dated May 11, 2005; 25 pages.
Uspto Notice of Allowance for Application No. 09/909,047 dated Feb. 15, 2005; 6 pages.
USPTO Non-Final Rejection for Appl. No. 09/912,768 dated Jul. 6, 2004; 9 pages.
Uspto Notice of Allowance for Application No. 09/912,768 dated Sep. 13, 2005; 5 pages.
USPTO Non-Final Rejection for Appl. No. 09/912,768 dated Apr. 11, 2005; 14 pages.
Uspto Final Rejection for Application No. 09/912,768 dated Nov. 17, 2004; 13 pp.
USPTO Non-Final Rejection for U.S. Appl. No. 091912,768 dated Jun. 22, 2004; 11 pages.
USPTO Notice of Allowance for U.S. Appl. No. 09/922,579 dated Dec. 28, 2004; 6 pages
USPTO Non-Final Rejection for U.S. Appl. No. 09/922,579 dated Aug. 18, 2004; 6 pages.
USPTO Notice of Allowance for U.S. Appl. No. 09/923,461 dated May 12, 2005; 6 pages.
USPTO Non-Final Rejection for U.S. Appl. No. 09/923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 101803,030 dated Jan. 8, 2007; 6 pages.
USPTO Non-Final Rejection for U.S. Appl. No. 10/803,030 dated Jun. 8, 2005; 4 pages.
USPTO Notice of Allowance for U.S. Appl. No. 10/011,214 dated Apr. 11, 2005; 4 pages.
USPTOFinal Rejection for U.S. Appl. No. 10/011,214 dated Jan. 21, 2005; 8 pages.
USPTO Non-Final Rejection for U.S. Appl. No. 10/011,214 dated Aug. 13, 2004; 10 pages.
Hong et al., "Hierarchial System Test by an IEEE 1149.5 Mtm-Bus Slave-Module Interface Core," IEEE, 2000; 14 pages.
Haberl et al., "Self Testable Boards with Standard IEEE 1149.5 Module Test and Maintenance (MTM) Bus Interface," IEEE, 1994; 6 pages.
• Varma et al., "A Structured Test Re-Use Methodology for Core-Based System Chips," IEEE, 1998; 9 pages.
Andrews, "Roadmap for Extending IEEE 1149.1 for Hierarchical Control of Locally-Stored, Standardized command Set, Test Programs," IEEE, 1994; 7 pages.
Adham et al., "Preliminary Outline of the IEEE P1500 Scalable Architecture for Testing Embedded Cores," IEEE; 6 pages.
Ghosh et al., "A Low Overhead Design for Testability and Test Generation Technique for Core-based Systems," IEEE, 1997; 10 pages.
Zorian, "Test Requirements for Embedded Core-based Systems and IEEE P1500," IEEE, 1997; 9 pages.

Zorian et al., "Testing Embedded-Core Based System Chips," IEEE, 1998; 14 pages.
Papachristou et al., "Microprocessor Based Testing for Core-Based System on a Chip," IEEE, 2000; 1999; 6 pages.
Maroufi et al., "Solving the I/O Bandwidth Problem in System on a Chip Testing," IEEE, 2000; 6 pages.
Marsh, "Smart Tools Illuminate Deeply Embedded Systems," Edn, 2000; 7 pages.
York et al., "On-chip Support Needed for SOC Debug," Electronic Engineering Times, 1999; 2 pages.
Atmel Corporation: AT9OSC Summary: "Secure Microcontrollers for Smart Cards," 1999; 7 pages.
Hwang et al., "Integrated circuit for automatically varying resistance in computer system, has pair of transistors connected in parallel with respective resistors such that resistors are bypassed when corresponding transistors are enabled," Derwent Information Ltd; 2002; 2 pages.
Morrison, "IBM Eyes Merchant Packaging Services," Jul. 13, 1998; Electronic News <http://www.findarticles.com>; 4 pages.
Charles, Jr. et al., "Wirebonding: Reinventing the Process for MCMs," April 1998; IEEE 7th International Conference on Multichip Modules and High Density Packaging; 3 pages.
Tran et al., "Fine Pitch and Wirebonding and Reliability of Aluminum Capped Copper Bond Pads," May 2000, IEEE Electronic Components and Technology Conference; 8 pages.
Song et al., "A 50% Power Reduction Scheme for Cmos Relaxation Oscillator," IEEE, 1999; 4 pages.
"Electronic Circuit Protector-Circuit Breaker;" IBM Technical Disclosure Bulletin; vol. 36, Issue 8, August 1, 1993; 1 Page.
USPTO Final Rejection for U.S. Appl. No. 10/001,478 dated Apr. 20, 2009; 16 pages.
USPTO Notice of Allowance for U.S. Appl. No. 09/994,600 dated Apr. 3, 2009; 5 pages.
USPTO Notice of Allowance for U.S. Appl. No. 09/989,777 dated Mar. 9, 2009; 7 pages.
USPTO Notice of Allowance for U.S. Appl. No. 09/992,076 dated Feb. 27, 2009; 6 pages.
USPTO Non-Final Rejection for U.S. Appl. No. 09/989,771 dated Apr. 30, 2009; 11 pages.
USPTO Notice of Allowance for U.S. Appl. No. 09/989,762 dated Mar. 25, 2009; 7 pages.
USPTO Notice of Allowance for U.S. Appl. No. 09/989,762 dated Oct. 24, 2008; 7 pages.
U.S. Appl. No. 09/989,815: "A Data Driven Method and System for Monitoring Hardware Resource Usage for Programming an Electric Device," Bartz et al.; 36 pages.
USPTO Notice of Allowance for U.S. Appl. No. 09/989,762 dated Jun. 2, 2008; 6 pages.
USPTO Notice of Allowance for U.S. Appl. No. 09/989,762 dated Jan. 2, 2008; 6 pages.
USPTO Non-Final Rejection for U.S. Appl. No. 09/989,762 dated Jul. 23, 2007; 15 pages.
USPTO Final Rejection for U.S. Appl. No. 09/989,762 dated Jan. 26, 2007; 13 pages.
USPTO Non-Final Rejection for U.S. Appl. No. 09/989,762 dated Aug. 10, 2006; 18 pages.
USPTO Final Rejection for U.S. Appl. No. 09/989,762 dated Mar. 14, 2006; 19 pages.
USPTO Non-Final Rejection for U.S. Appl. No. 09/989,762 dated Jul. 27, 2005; 15 pages.
U.S. Appl. No. 09/275,336: "Programmable Oscillator Scheme;" Mar et al.; 25 pages.
U.S. Appl. No. 09/721,316: "Programmable Oscillator Scheme;" Mar et al.; 26 pages.
U.S. Appl. No. 10/324,455: "Programmable Oscillator Scheme;" Mar et al.; 23 pages.
U.S. Appl. No. 09/998,859: "A System and a Method for Checking Lock Step Consistency between in Circuit Emulation and a Microcontroller while Debugging Process is in Progress;" Nemecek; 33 pages.
U.S. Appl. No. 09/998,834: "A System and a Method for Communication between and Ice and a Production Microcontroller while in a Halt State:" Nemecek; 33 pages.

U.S. Appl. No. 10/113,065: "System and Method for Automatically Matching Components in a Debugging System:" Nemecek et al.; 32 pages.
U.S. Appl. No. 09/989,574: "Method and System for using a Graphics user Interface for Programming an Electronic Device;" Bartz et at; 43 pages.
U.S. Appl. No. 09/989,816: "Datasheet Browsing and Creation with Data-Driven Datasheet Tabs within a Microcontroller Design Tool:" Bartz et at; 55 pages.
USPTO Notice of Allowance for U.S. Appl. No. 091930,021 dated Nov. 26, 2004; 4 pages.
USPTO Final Rejection for U.S. Appl. No. 09/930,021 dated Aug. 31, 2004; 8 pages.
USPTO Non-Final Rejection for U.S. Appl. No. 09/930,021 dated Apr. 26, 2004; 6 pages.
USPTO Miscellaneous Action with SSP for U.S. Appl. No. 09/930,021 dated Oct. 1, 2001; 1 pages.
USPTO Notice of Allowance for U.S. Appl. No. 09/953,423 dated Jul. 12, 2004; 6 pages.
USPTO Non-Final Rejection for U.S. Appl. No. 09/953,423 dated Feb. 6, 2004; 5 pages.
USPTO Notice of Allowance for U.S. Appl. No. 09/957,084 dated May 18, 2004; 5 pages.
USPTO Final Rejection for U.S. Appl. No. 09/957,084 dated Jan. 29, 2004; 8 pages.
USPTO Non-Final Rejection for U.S. Appl. No. 09/957,084 dated Aug. 27, 2003; 8 pages.
USPTO Final Rejection for Appl. No. 09/957,084 dated Apr. 23, 2003; 8 pages.
USPTO Non-Final Rejection for U.S. Appl. No. 09/957,084dated Aug. 23, 2002; 6 pages.
USPTO Notice of Allowance for U.S. Appl. No. 09/969,313 dated Oct. 4, 2005; 6 pages.
USPTO Non-Final Rejection for U.S. Appl. No.09/969,313 dated May 6, 2005; 9 pages.
USPTO Requirement for Restriction/Election for U.S. Appl. No. 09/969,313 dated Mar. 18, 2005; 6 pages.
USPTO Notice of Allowance for Appl. No. 09/969,311 dated Mar. 1, 2005; 4 pages.
USPTO Non-Final Rejection for U.S. Appl. No. 09/969,311 dated Sep. 21, 2004; 4 pages.
USPTO Advisory Action for U.S. Appl. No. 09/969,311 dated Jul. 21, 2003; 2 pages.
USPTO Final Rejection for U.S. Appl. No. 09/969,311 dated Apr. 7, 2003; 7 pages.
USPTO Non-Final Rejection for U.S. Appl. No. 09/969,311) dated Nov. 6, 2002; 8 pages.
USPTO Notice of Allowance for U.S. Appl. No. 09/972,319 dated Dec. 30, 2004; 4 pages.
USPTONon-Final Rejection for U.S. Appl. No. 09/972,319 dated Sep. 16, 2004; 9 pages.
USPTO Notice of Allowance for U.S. Appl. No. 09/972,003 dated Jul. 14, 2004; 4 pages.
USPTO Requirement for Restriction/Election for U.S. Appl. No. 09/972,003 dated May 6, 2004; 4 pages.
USPTO Non-Final Rejection for U.S. Appl. No. 09/972,003 dated Feb. 2, 2004; 10 pages.
USPTO Non-Final Rejection for U.S. Appl. No. 09/972,003 dated Aug. 19, 2003; 11 pages.
USPTO Notice of Allowance for U.S. Appl. No. 09/972,133 dated Jun. 9, 2006; 6 pages.
USPTO Final Rejection for U.S. Appl. No. 09/972,133 dated Mar. 30, 2006; 8 pages.
USPTO Non-Final Rejection for U.S. Appl. No. 09/972,133 dated Nov. 25, 2005; 9 pages.
USPTO Advisory Action for U.S. Appl. No. 09/972,133 dated Aug. 31, 2005; 3 pages.
USPTO Final Rejection for U.S. Appl. No. 09/972,133 dated Jun. 29, 2005; 10 pages.
USPTO Non-Final Rejection for Appl. No. 09/972,133 dated Mar. 8, 2005; 9 pages.
USPTO Non-Final Rejection for U.S. Appl. No. 09/975,104 dated Jun. 16, 2006; 8 pages.
USPTO Final Rejection for U.S. Appl. No. 09/975,104 dated Feb. 15, 2006; 7 pages.
USPTO Non-Final Rejection for U.S. Appl. No. 09/975,104 dated Aug. 16, 2005; 6 pages.
USPTO Non-Final Rejection for U.S. Appl. No. 09/975,104 dated Mar. 21, 2005; 7 pages.
USPTO Notice of Allowance for U.S. Appl. No. 09/975,030 dated Feb. 6, 2006; 7 pages.
USPTO Non-Final Rejection for U.S. Appl. No. 09/975,030 dated Oct. 20, 2005; 7 pages.
USPTO Non-Final Rejection for U.S. Appl. No. 09/975,030 dated Mar. 29, 2005; 13 pages.
USPTO Notice of Allowance for U.S. Appl. No. 09/977, 111 dated Sep. 28, 2006; 6 pages.
USPTO Notice of Allowance for U.S. Appl. No. 10/272,231 dated Mar. 8, 2004; 6 pages.
USPTO Final Rejection for U.S. Appl. No. 10/272,231 dated Nov. 5, 2003; 5 pages.
USPTO Non-Final Rejection for U.S. Appl. No. 10/272,231 dated Jul. 14, 2003; 6 pages.
USPTO Notice of Allowance for U.S. Appl. No. 11/125,554 dated Feb. 7, 2008; 4 pages.
USPTO Notice of Allowance for U.S. Appl. No. 11/125,554 dated Apr. 24, 2007;7 pages.
USPTO Non-Final Rejection for U.S. Appl. No. 11/125,554 dated Dec. 11, 2006; 9 pages.
USPTO Notice of Allowance for U.S. Appl. No. 09/855,868 dated Apr. 25, 2005; 6 pages.
USPTO Non-Final Rejection for U.S. Appl. No. 09/855,868 dated Aug. 26, 2004; 7 pages.
USPTO Notice of Allowance for U.S. Appl. No. 09/887,923 dated Sep. 27, 2004; 5 pages.
USPTO Non-Final Rejection for U.S. Appl. No. 09/887,923 dated May 25, 2004; 7 pages.
"Pod-Wikipedia, the free encyclopedia"; retrieved on Nov. 14, 2005 from http://en.wikipedia.org/wiki/Pod; 3 pages.
"pod-defintion by dict.die.net"; retrieved on Nov. 14, 2005 from http://dict.die.net/pod; 2 pages.
"In-Curcuit Emulators - descriptions of the major ICEs around"; retrieved on Nov. 14, 2005 from http://www. algonet.se/~staffan-nicieveloper/emulator.htm; 6 pages.
CD00183; "Capturing Test/Emulation and Enabling Real-Time Debugging Using Fpga for In-Circuit Emulation;" Oct. 10,2001; 09/975,104; Snyder; 35 pages.
CD00184; "Host to Fpga Interface in an In-Circuit Emulation System;" 10/10/01; 09/975,105; Nemecek; 44 pages.
Anonymous; "Using Debug"; 1999; Prentice-Hall Publishing; 20 pages.
Harrison et al.; "Xilinx FPGA Design in a Group Environment Using Vhds and Synthesis Tools"; Colloquium on Digital System Design Using Synthesis Techniques; Feb. 15, 1996; 4 pages.
Microsoft Press Computer User's Dictionary; 1998; 3 pages.
Sreeram Duvvuru and Siamak Arya, "Evaluation of a Branch Target Address Cache," 1995; IEEE; 8 pages.
Andrew S. Tanenbaum with contributions from James R. Goodman, "Structured Computer Organization," 1999, Prentice Hall, Fourth Edition; 32 pages.
CD00186; "Method for Breaking Execution of a Test Code in DUT and Emulator Chip Essentially Simultaneously and Handling Complex Breakpoint Events;" Oct. 10, 2001; 09/975,338; Nemecek et al.; 34 pages.
CD00185; "Emulator Chip-Board Architecture for Interface;" Oct. 10, 2001; 09/975,030; Snyder et al.; 37 pages.
Wikipedia .: Main Page, retrieved on Mar. 8, 2006 from http://en.wikipedia.org/wiki/Main_Page and http://en.wikipedia. org/Wikipedia:introduction; 5 pages.
Wikipedia - Processor register, retrieved on Mar. 7, 2006 from http://en.wikipedia.org/wiki/Processor register; 4 pages.
Jonathan B. Rosenburg, "How Debuggers Work" John Wiley & Sons, Inc. 1996; 259 pages.
Dahl, et al.; "Emulation of the Sparcle Microprocessor with the MIT Virtual Wires Emulation System"; 1994; IEEE; 9 pages.

Bauer et al.; "A Reconfigurable Logic Machine for Fast Event-Driven Simulation"; 1998; Design Automation Conference Proceedings; 8 pages.
"New Object Domain R3 Beta Now Available (Build 134)!" Mar. 13, 2001; <http://web.archive.org/ web/200100331202605/wwwobjectdomain.com/domain30/index.html> 2 pages.
"OMG XML Metadata Interchange (XMl) Specifications" 2000; 17 pages.
Electronic Tools Company; E-Studio User Manuel; 2000; retrieved from http://web.archive.org for site http://e-tools.com on Mar. 23, 2005; 77 pages.
Cover Pages Technology Reports; XML and Electronic Design Automation (EDA); Aug. 2000; retrieved from http:// xml.coverpages.org on Mar. 23, 2005; 5 pages.
Microsoft Computer Dictionary "ActiveX" 2002; Microsoft Press; 5th Edition; 3 pages.
Wikipedia "Xlm" retrieved on Jan. 29, 2007 from http-//en.wikipedia.org/wiki/XML; 16 pages.
"VHDL Samples" retrieved on Jan. 29, 2007 from http://www.csee.umbc.edu/help/VHDL/samples/samples.shtrnl; 10 pages.
Anonymous, "Lotus Notes Faq — How do you generate unique document numbers?" Sep. 19, 1999; retrieved from www.keysolutions.com on Jul. 9, 2008; 1 page.
Ashok Bindra, "Programmable SOC Delivers a New Level of System Flexibility"; Electronic Design; Nov. 6, 2000; 11 pages.
Cypress MicroSystem, Inc. "Cypres Customer Forums" retrieved from <http://wvvw.cypress.com/forums/ messageview; 1 page Mar. 21, 2001.
Cypress MicroSystem, In. "PsoC Designer: Integrated Development Environment User Guide"; Rev. 1.18; Sep. 8, 2003; 193 pages.
Hamblen, "Rapid Prototyping Using Field-Programmable Logic Devices" Jun. 2000, IEEE; 9 pages.
USPTO Final Rejection for U.S. Appl. No. 09/943,062 dated Apr. 30, 2004; 9 pages.
Snyder et at, "Xilinx's A-to-Z Systems Platform" Cahrers Microprocessor, the Insider's Guide to Microprocessor Hardware, Feb. 6, 2001; 6-geges 9 pages.
"PSoC Technology Completely Changes 8-bit MCU System Design" Cypress MicroSystem, Inc. Feb. 19, 2001; 21 pages.
USPTO Non-Final Rejection for U.S. Appl. No. 09/943,062 dated Dec. 8, 2003; 9 pages.
USPTO advisory Action for U.S. Appl. No. 09/943,062 dated Sep. 25, 2003; 3 pages.
USPTO Final Rejection for U.S. Appl. No. 09/943,062 { dated Jun. 27, 2003; 8 pages.
USPTO Non-Final Rejection for U.S. Appl. No. 09/943,062 dated Jan. 27, 2003; 7 pages.
USPTO Non-Final Rejection for U.S. Appl. No. 09/943,062 dated Sep. 11, 2002; 9 pages.
"PSoC Designer; Integrated Development Environment" User Guide; Revision 1,11; Last Revised Jul. 17, 2001: 109 pages.
Cypress Microsystems, "Cypress Microsystems Unveils Programmable System-on-a-Chip for Embedded Internet, Communications and Consumer Systems;" 2000, <http://wwvv.cypressmicro.com/corporate/ CY_Announces_nov_13_2000.html>;3 pages.
Huang et al., ICEBERG, An Embedded In-Circuit Emulator Synthesizer for Microcontrollers, Proceedings of the 36th Design Automation Conference 1999; 6 pages.
Yoo et al., "Fast Hardware-Software Co-verification by Optimistic Execution of Real Processor," Proceedings of Design, Automation and Test in Europe Conference and Exhibition 2000; 6 pages.
USPTO Advisory Action for U.S. Appl. No. 09/943,062 dated Mar. 27, 2008; 3 pages.
USPTO Final Rejection for U.S. Appl. No. 09/943,062 dated Jan. 18, 2008; 8 pages.
USPTO Non-Final Rejection for U.S. Appl. No. 09/943,062 dated Jun. 22, 2007; 12 pages.
USPTO Miscellaneous Action for U.S. Appl. No. 09/943,062 dated Jan. 30, 2006; 2 pages.
USPTO Notice of Allowance for U.S. Appl. No. 10/113,064 dated Sep. 21, 2006; 7 pages.
USPTO Non-Final Rejection for U.S. Appl. No. 10/113,064 dated Apr. 6, 2006; 19 pages.
USPTO Final Rejection for U.S. Appl. No. 10/113,064 dated Oct. 18, 2005; 22 pages.
USPTO Non-Final Rejection for U.S. Appl. No. 10/113,064 dated Apr. 25/2005; 15 pages.
U.S. Appl. No. 10/113,064: "Method and System for Debugging through Supervisory Operating Codes and Self Modifying Codes," Roe et al.; 36 pages.
Bursky, "FPGA Combines Multiple Interfaces and Logic," Electronic Design, vol. 48 No. 20, pp. 74-78 (Oct. 2, 2000); 5 pages.
Anonymous, "Warp Nine Engineering - The IEEE 1284 Experts-F/Port Product Sheet," undated web page found at http:/lwww.fapo.com/fport.htm; 2 pages Mar. 3, 2005.
Anonymous, "F/Port:Fast Parallel Port for the PC" Installation Manual Release 7.1, circa 1997, available for download from http://www,fapo,com/fport.htm; 25 pages.
Nam et al.; "Fast Development of Source-Level Debugging System Using Hardware Emulation"; IEEE 2000; 4 pages.
Huang et al.; "Iceberg: an Embedded In-Cicuit Emulator Synthesizer for Microcontrollers"; ACM 1999; 6 pages.
Khan et al.; "Fpga Architectures for Asic Hardware Emulators"; IEEE 1993; 5 pages.
Oh et al.; Emulator Environment Based on an FPGA Prototyping Board; IEEE 21-23; Jun. 2000; 6 pages.
Hong at al.; "An FPGA-Based Hardware Emulator for Fast Fault Emulation"; IEEE 1997; 4 pages.
Ching et al.; "An In-Circuit-Emulator for TMS320C25", IEEE 1994; 6 pages.
Pastermak et al. "In-Circuit-Emulation in ASIC Architecture Core Designs"; IEEE 1989; 4 pages.
Melear; "Using Background Modes for Testing, Debugging and Emulation of Microcontrollers"; IEEE 1997; 8 pages.
Walters, Stephen; "Computer-Aided Prototyping for ASIC-Based Systems", 1991, IEEE Design & Test of Computers; vol. 8, Issue 2; 8 pages.
Anonymous; "Jeeni JTAG EmbeddedICE Ethernet Interface"; Aug 1999; Embedded Performance, Inc.; 3 pages.
Sedory; "A Guide to debug"; 2004; retrieved on May 20, 2005; 7 pages.
"Microsoft Microsoft Files Summary Judgement Motions"; Feb. 1999; Microsoft PressPass; retrieved on May 20, 2005 from http://mont.microsoft.comioresspass/press/1999/feb99/Feb99/Calderaor.asp; 3 pages.
Xerox; "Mesa Debugger Documentation"; April 1979; Xerox Systems Development Department; Version 5.0; 33 pages.
Stallman et al.; "Debugging with GDB The GNU Source-Level Debugger"; Jan. 1994; retrieved on May 2, 2005 from http://www.cs.utah.edu; 4 pages.
Wikipedia.org; "Von Neuman architecture"; retrieved from http://en.wikipedia.org/wiki/Von_Neuman_architecture on Jan. 22, 2007; 4 pages.
Stan Augarten; "The Chip Collection - Introduction - Smithsonian Institute"; "State of the Art"; "The First 256-Bit Static Ram"; retrieved on Nov. 14, 2005 from http://smithsonianchips.si.edu/augarten/p24.htm; 2 pages.
POD - Piece of Data, Plain Old Documentation, Plain Old Dos...; retrieved on Nov. 14, 2005 from http:1/www. auditmypc.com/acronym/POD.asp; 2 pages.
USPTO Final Rejection for 09/989,765 dated Mar. 31, 2009; 18 pages.
USPTO Final Rejection for 09/989,778 dated Mar. 16, 2009; 26 pages.
U.S. Appl. No. 09/922,419: "A Power Supply Pump Circuit for a Microcontroller;"44fitem; 38 pp. Kutz et al.
U.S. Appl. No. 09/912,768: "A Microcontroller having a Dual Mode Relax Oscillator that is Trimmable;" Shutt; 33 pages.
U.S. Appl. No. 09/893,048: "A Microcontroller having an On-Chip High Gain Amplifier;"; 22 pages Kutz et al.
U.S. Appl. No. 09/826,397: "Method and Circuit for Allowing a Microprocessor to Change its Operating Frequency on-the-fly;" Sullam; 24 pages.
U.S. Appl. No. 09/887,955: "Novel Power on Reset Circuit for Microcontroller;"; 42 pages Kutz et al.

U.S. Appl. No. 10/001,478: "In-Circuit Emulator and Pod Synchronized Boot;"146mireeek, 44 pages Nemecek et al.
U.S. Appl. No. 10/001,568: "Combined In-Circuit Emulator and Programmer;" Nemecek et al.
U.S. Appl. No. 10/002,217: "Conditional Branching in an In-Circuit Emulation System;" Nemecek; 43 pages.
U.S. Appl. No. 10/004,039: "In-Circuit Emulator with Gatekeeper for Watchdog Timer;"; 46 pages Nemecek et al.
U.S. Appl. No. 10/004,197; "In-Circuit Emulator with Gatekeeper Based Halt Control;"47 pages Nemecek et al.
From U.S. Appl. No. 10/033,027: "A Configurable Input/Output Interface for a Microcontroller"; Sep. 14, 2001; U.S. Appl. No. 09/953,423; Kutz et al.; 28 pages.
U.S. Appl. No. 10/001,477: "Breakpoint Control in an In-Circuit Emulation System;"; 43 pages Roe et al.
U.S. Appl. No. 10/000,383 "System and Method of Providing a Programmable Clock Architecture for an Advanced Microcontroller;" 34 pages Sullam et al.
U.S. Appl. No. 091887,923: "Novel Method and System for Interacting between a Processor and a Power on Reset to Dynamically Control Power States in a Microcontroller;"; 44 pages Kutz et al.
U.S. Appl. No. 09/923,461: "Non-Interfering Multiply-Mac (Multiply Accumulate) Circuit;" Snyder; 25 pages.
U.S. Appl. No. 09/922,579: "A Method for a Efficient Supply to a Microcontroller;"; 37 pages Kutz et al. .
U.S. Appl. No. 10/011,214:"Method and Circuit for Synchronizing a Write Operation between an On-Chip Frequencies;";49 pages Sullam et al.
Hintz et al.; "Microcontrollers", 1992, McGraw-Hill; 11 pages.
Ganapathy, Gopi, and Narayan, Ram, and Jorden, Glen, and Fernandez, Denzil, and Wang, Ming, and Nishimura, Jim; "Hardware Emulation for Functional Verification of K5", Jun. 1996, 33rd Design Automation Conference Proceedings, 3-7 Jun. 1996; 4 pages.
The Provisional Application 60/243,708 (CD00167P) "Advanced Programmable Microcontroller Device"; 277 pages.
"Webster's Third New International Dictionary", 1996, G. & C. Merriam Company; 3 pages.
USPTO Advisory Action for 09/998,848 dated Sep. 7, 2005; 3 pages.
U.S. Appl. No. 09/957,084: "A Crystal-Less Oscillator with Trimmable Analog Current Control for Increased Stability:"; 28 pages. Mar et al.
U.S. Appl. No. 09/855,865: "Protecting Access to Microcontroller Memory Blocks;" Snyder; 28 pages.
U.S. Appl. No. 09/972,319: "Method for Applying Instructions to Microprocessor in Test Mode;" Snyder, 31 pages.
U.S. Appl. No. 09/972,003: "Test Architecture for Microcontroller Providing for a Serial Communication Interface:" Snyder; 32 pages.
U.S. Appl. No. 09/972,133; "method for Entering Circuit Test Mode;"Snyder, 30 pages.
U.S. Appl. No. 09/973,535; "Architecture for Decimation Algorithm;" Snyder; 26 pages.
U.S. Appl. No. 09/977,111; A Frequency Doubler Circuit with Trimmable Current Control; 35 pages Shutt et al.
U.S. Appl. No. 10/272; "Digital Configurable Macro Architecture; " Snyder; 36 pages.
USPTO Non-Final Rejection for 09/975,115 dated Oct. 9, 2008; 34 pages.
USPTO Final Rejection for 09/975,115 dated May 12, 2008; 33 pages.
USPTO Non-Final Rejection for 09/975,115 dated Jan. 7, 2008; 30 pages.
USPTO Non-Final Rejection for U.S. Appl. No. 09/975,115 dated Jul. 31, 2007; 28 pages.
USPTO Final Rejection for U.S. Appl. No. 09/975,115 dated Feb. 21, 2007; 25 pages.
USPTO Non-Final Rejection for 09/975,115 dated Oct. 31, 2006; 19 pages.
USPTO Final Rejection for U.S. Appl. No. 09/975,115 dated Jun. 23, 2006; 20 pages.
USPTO Non-Final Rejection for U.S. Appl. No. 09/975,115 dated Jan. 11, 2006; 15 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Feb. 11, 2005; 86 pages.
UPTO Final Rejection for U.S. Appl. No. 09/975,338 dated Jan. 21, 2008; 21 pages.
USPTO Non-Final Rejection for U.S. Appl. No. 09/975,338 dated Aug. 14, 2007; 19 pages.
USPTO Final Rejection for U.S. Appl. No. 09/975,338 dated Feb. 27, 2007; 23 pages.
USPTO Non-Final Rejection for U.S. Appl. No. 09/975,338 dated Sep. 6, 2006; 11 pages.
USPTO Advisory Action for U.S. Appl. No. 09/975,338 dated May 15, 2006; 4 pages.
USPTO Final Rejection for U.S. Appl. No. 09/975,338 dated Jan. 18, 2006; 12 pages.
USPTO Non-Final Rejection for U.S. Appl. No. 09/975,338 dated Apr. 5, 2005; 13 pages.
USPTO Notice of Allowance for U.S. Appl. No. 10/001,477 dated May 8, 2009; 6 pages.
U.S. Appl. No. 09/207,912: "Circuit(s), Architecture and Method(s) for Operating and/or Tuning a Ring Oscillator:" Mar; 23 pages.
USPTO Non-Final Rejection for U.S. Appl. No. 10/113,065 dated May 20, 2005; 14 pages.
USPTO Final Rejection for U.S. Appl. No. 10/113,065 dated Oct. 26, 2005; 17 pages.
USPTO Notice of Allowance for U.S. Appl. No. 10/113,065 dated Apr. 6, 2006; 8 pages.
USPTO Non-Final Rejection for U.S. Appl. No. 09/998,834 dated Sep. 20, 2004; 11 pages.
USPTO Notice of Allowance for U.S. Appl. No. 09/998,834 dated May 19, 2005; 7 pages.
USPTO Non-Final Rejection for 09/998,859 dated May 15, 2003; 6 pages.
USPTO Final Rejection for U.S. Appl. No. 09/998,859 dated Nov. 19, 2003; 5 pages.
USPTO Non-Final Rejection for U.S. Appl. No. 09/998,859 dated Nov. 4, 2004; 6 pages.
USPTO Notice of Allowance for U.S. Appl. No. 09/975,105 dated Dec. 4, 2004; 4 pages.
USPTO Final Rejection for U.S. Appl. No. 09/975,105 dated Jul. 13, 2006; 7 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
U.S. Appl. No. 09/943,062: "Apparatus and Method for Programmable Power Management in a Programmable Analog Circuit Block;" Mar; 46 pages.
U.S. Appl. No. 101238,966: "Method for Parameterizing a User Module;" Perrin; 41 pages.
USPTO Notice of Allowance for U.S. Appl. No. 10/324,455 dated Feb. 12, 2004; 4 pages.
USPTO Non-Final Rejection for U.S. Appl. No. 10/324,455 dated Nov. 6, 2003; 4 pages.
USPTO Non-Final rejection for 10/324,455 dated Aug. 21, 2003; 4 pages.
USPTo Notice of Allowance for U.S. Appl. No. 09/998,859 dated mar. 14, 2005; 6 pages.
Goodenough, F. "Analog Counterparts of Fpgas Ease System Design" Electronic Design, Penton Publishing, Cleveland, Oh, US vol. 42, No. 21, 10114/94; 10 pages.
Harbaum, T. et al. "Design of a Flexible Coprocessor Unit" Proceedings of the Euromicro Conference, XX XX, Sep. 1999; 10 pages.
USPTO U.S. Appl. No. 09/924,734: "Programmable Microcontroller (PSoC) Architecture (Mixed Analog/Digital)"; Snyder et al., filed on Aug. 7, 2001; 28 pages.
USPTO U.S. Appl. No. 09/909,045: "Digital Configurable Macro Architecture," Warren Snyder, filed on Jul. 18, 2001; 37 pages.
USPTO U.S. Appl. No. 09/909,109: "Configuring Digital Functions in a Digital Configurable Macro Architecture," Warren Snyder, filed on Jul. 18, 2001; 38 pages.
USPTO U.S. Appl. No. 09/909,04: "A Programmable Analog System Architecture," Monte Mar, filed on 07/18/01; 60 pages.

USPTO U.S. Appl. No. 09/930,021: "Programmable Methodology and Architecture for a Programmable Analog System"; Mar et al., filed on Aug. 14, 2001; 87 pages.
USPTO U.S. Appl. No. 09/969,311: "Method for Synchronizing and Resetting Clock Signals Supplied to Multiple Programmable Analog Blocks," Bert Sullam, filed on 10/01/01; 57 pages.
Uspto U.S. Appl. No. 09/875,599 : "Method and Apparatus for Programming a Flash Memory," Warren Snyder, filed on Jun. 5, 2001; 23 pages.
USPTO U.S. Appl. No. 09/975,115 : "In-System Chip Emulator Architecture," Snyder et al., filed on Oct. 10, 2001; 38 pages.
USPTO U.S. Appl. No. 09/953,423: "A Configurable Input/Output Interface for a Microcontroller," Warren Snyder, filed on Sep. 14, 2001; 28 pages.
USPTO U.S. Appl. No. 09/893,050 : "Multiple Use of Microcontroller Pad," Kutz et al., filed on Jun. 26, 2001; 21 pages.
USPTO U.S. Appl. No. 09/929,891: "Programming Architecture for a Programmable Analog System," Mar et al., filed on Aug. 14, 2001; 82 pages.
USPTO U.S. Appl. No. 09/969,313: "Architecture for Synchronizing and Resetting Clock Signals Supplied to Multiple Analog Programmable Analog Blocks," Bert Sullam, filed on Oct. 0, 2001; 50 pages.
USPTO U.S. Appl. No. 09/935,454: "Method and Apparatus for Local and Global Power Management in a Programmable Analog Circuit," Monte Mar, filed on Aug. 22, 2001; 1 Page.
USPTO U.S. Appl. No. 11/125,554 : "A Method for a Efficient Supply to a Microcontroller," Kutz et al., filed on May 09, 2005; 1 page.
USPTO Non-Final Rejection for 09/998,859dated May 28, 2003; 6 pages.
USPTO U.S. Appl. No. 09/975,105: "Host to Fpga Interface in an In-Circuit Emulation System;" Nemecek; filed Oct. 10, 2001; 44 pages.
USPTO U.S. Appl. No. 11/273,708: "Capacitance Sensor Using Relaxation Oscillators," Snyder at al., filed on Nov. 14, 2005; 33 pages.
USPTO Non-Final Rejection for U.S. Appl. No. 11/273,708 dated Mar. 19, 2007; 16 pages.
USPTO Final Rejection for U.S. Appl. No. 11/273,708 dated Jul. 5, 2007; 8 pages.
USPTO Notice of Allowance for U.S. Appl. No. 11/273,708 dated Aug. 9, 2007; 4 pages.
USPTO U.S. Appl. No. 11/337,272: "Successive Approximate Capacitance Measurement Circuit;" Warren Snyder, filed on Jan. 20, 2006 29 pages.
USPTO Requirement for Restriction/Election for U.S. Appl. No. 11/337,272 dated Sep. 11, 2006; 5 pages.
USPTO Non-Final Rejection for U.S. Appl. No. 11/337,272 dated Oct. 24, 2006; 9 pages.
USPTO Final Rejection for U.S. Appl. No. 11/337,272 dated Feb. 2, 2007; 11 pages.
USPTO Advisory Action for U.S. Appl. No. 11/337,272 dated Apr. 3, 2007; 3 pages.
USPTO Non-Final Rejection for U.S. Appl. No. 11/337,272 dated May 17, 2007; 11 pages.
USPTO Notice of Allowance for U.S. Appl. No. 11/337,272 dated Aug. 15, 2007; 9 pages.
USPTO U.S. Appl. No. 11/983,291: "Successive Approximate Capacitance Measurement Circuit," Warren Snyder, filed on Nov. 07, 2007; 26 pages.
USPTO Non-Final rejection for U.S. Appl. No. 11/983,291 dated Mar. 9, 2009; 9 pages.
USPTO U.S. Appl. No. 11/698,660: "Configurable Bus,"Kutz et al., filed on Jan. 25, 2007; 35 pages.
USPTO Non-Final Rejection for U.S. Appl. No. 11/698,660 dated Dec. 2, 2008; 12 pages.
USPTO Final Rejection for U.S. Appl. No. 11/698,660 dated May 28, 2009; 12 pages.
USPTO Appl. No. 11/709,866: "Input/Output Multiplexer Bus," Dennis Sequine, filed on Feb. 21, 2007; 33 pages.
USPTO Non-Final Rejection for U.S. Appl. No. 11/709,866 dated Nov. 7, 2008; 14 pages.
USPTO Notice of Allowance for U.S. Appl. No. 11/709,866 dated Apr. 4, 2007; 8 pages.
Sedra et al., "Microelectronic Circuits," 3rd Edition, Oxford University Press; 20 pp. Li.
Van Ess, David; "Simulating a 555 Timer with PSoC," Cypress Semiconductor Corporation, Application Note AN2286, May 19, 2005; 10 pages.
Cypress Semiconductor Corporation, "Fan Controller CG6457AM and CG6462AM," PSoC Mixed Signal Array Preliminary Data Sheet; May 24, 2005; 25 pages
Cypress Semiconductor Corporation, "PSoC Mixed-Signal Controllers," Production Description; <http://www.cypress. com/portal/server; retrieved on Sep. 27, 2005; 2 pages.
Cypress Semiconductor Corporation, "CY8C21x34 Data Sheet," Csr User Module, CSR V.1.0; Oct. 6, 2005; 36 pages.
Chapweske, Adam; "The Ps/2 Mouse Interface," Ps/2 Mouse Interfacing, 2001; 11 pages.
Cypress Semiconductor Corporation, "Cypress Introduces PSoC(Tm)-Based Capacitive Touch Sensor Solution," Cypress Press Release; May 31, 2005; <http://www.cypress.com/portal/server>; retrieved on Feb. 5, 2007; 4 pp. L.
Seguine, Ryan; "Layout Guidelines for PSoC CapSense," Cypress Semiconductor Corporation, Application Note AN2292; Jul. 22, 2005; 13 pages.
Lee, Mark; "EMC Design Considerations for PSoC CapSense Applications," Cypress Semiconductor Corporation, Application Note AN2318; Sep. 16, 2005; 6 pages.
Cypress Semiconductor Corporation, "Release Notes srn017," Jan., 24, 2007; 3 pages.
Cypress Semiconductor Corporation, "PSoC CY8C20x34 Technical Reference Manual (Trm)," PSoC CY8C20x34 Trm, Version 1.0, 2006; 220 pages.
USPTO Appl. No. 11/166,622: "Touch wake for electronic devices," Beard et al., filed on Jun. 23, 2005; 22 pages.
International Written Opinion of the International Searching Authority for International Application No. PCT/ US2006/09572 dated Jan. 10, 2008; 5 pages.
International Search Report for International Application No. PCT/ US2006/09572 dated Jan. 10, 2008; 2 pages.
USPTO Notice of Allowance for U.S. Appl No. 10/024,093 dated Sep. 10, 2002; 7 pages.
USPTO Appl. No. 10/024,093: "Configurable Memory for Programmable Logic Circuits," Lacey et al., filed on Dec. 18, 2001; 25 pages.
USPTO Appl. No. 11/088,028: "Method and Circuit for Rapid Alignment of Signals," Moyal et al., filed on Nov. 13, 2007; 34 pages.
USPT Notice of Allowance for U.S. Appl. No. 11/088,028 dated Jul. 2, 2007; 6 pages.
USPT Notice of Allowance for U.S. Appl. No. 11/088,028 dated Jan. 26, 2006; 6 pages.
USPT Non-Final Rejection for U.S. Appl. No. 11/088,028 dated Jun. 16, 2006; 8 pages.
USPTO Appl. No. 11/985,340: "Method and Circuit for Rapid Alignment of Signals," Moyal et al., filed on Nov. 13, 2007; 34 pages.
USPTO Notice of Allowance for U.S. Appl. No. 11/985,340 dated Jun. 2, 2009; 7 pages.
USPTO Requirement for restriction for U.S. Appl. No. date Mar. 16, 2009; 7 pages.
Km Hopkins, "Definition;" 01/1611997; <http://www.cs.sfu.ca/cs/people/GradStudent.html>; 1 page.
Ebeling et al., "Validating Vlsi Circuit Layout by Wirelist Comparison;" Sept. 1983; in proceedings of the IEEE International Conference on Computer Aided Design (Iccad-83); 2 pp. El.
USPTO Notice of Allowance for U.S. Appl. No. 11/986,338 dated May 7, 2009; 1 page.
Ohlrich et al., "Sub-Gemini: identifying Subcircuits using a Fast Subgraph Isomorphism Algorithm;" Jun. 1993; in proceedings of the 30th IEEE/Acm Design Automation Conference; 7 pages.
Ebling, "Gemini Ii: a Second Generation Layout Validation Program;" 1988; in proceedings of the IEEE international Conference on Computer Aided Design (1CCAD-88); 4 pp. .
U.S. Appl. No. 11/965,291: "Universal Digital Block Interconnection and Channel Routing," Snyder et al., filed on 12127/2007; 31 pages.

U.S. Appl. No. 12/356,468: "System and Method for Dynamically Generating a Configuration Datasheet," Anderson et al.; filed on 01120/2009; 27 pages.

International Search Report from the International Search Authority for International U.S. Appl. No. PCT/US08/60680 dated Aug. 15, 2008; 4 pages.

USPTO Notice of Allowance for U.S. Appl. No. 09/475,879 dated Oct. 22, 2004; 7 pages.

USPTO Advisory Action for U.S. Appl. No. 09/475,879 dated Mar. 4, 2002; 3 pages.

USPTO Advisory Action for U.S. Appl. No. 09/475,879 dated Dec. 31, 2001; 3 pages.

USPTO Final Rejection for U.S. Appl. No. 09/475,879. dated Oct. 11, 2001; 10 pages.

USPTO Non-Final Rejection for Appl. No. 09/475,879 dated Mar. 8, 2001; 6 pages.

U.S. Appl. No. 09/475,879: "Programmable Logic Device," Lacey et al.; filed on Dec. 30, 1999; 50 pages.

U.S. Appl. No. 09/475,808: "Configurable Memory for Programmable Logic Circuits," Lacey et al.; 24 pages Dec. 30, 1999.

USPTO Non-Final Rejection for U.S. Appl. No. 09/475,808 dated Jun. 6, 2001; 8 pages.

USPTO Notice of Allowance for U.S. Appl. No. 09/475,808) dated Nov. 6, 2001; 8 pages.

U.S. Appl. No. 10/137,497: "Reconfigurable Testing System and Method," Pleis et al.; filed on May 1, 2002; 40 pages.

USPTO Non-Final Rejection for U.S. Appl. No. 10/137,497 dated Nov. 5, 2004; 17 pages.

USPTO Final Rejection for U.S. Appl. No. 101137,497 dated May 5, 2005; 13 pages.

USPTO Non-Final Rejection for U.S. Appl. No. 10/137,497 dated Sep. 22, 2005; 21 pages.

USPTO Final Rejection for U.S. Appl. No. 10/137,497 dated Mar. 13, 2006; 15 pages.

USPTO Non-Final Rejection for U.S. Appl. No. 10/137,497 dated Aug. 2, 2006; 21 pages.

USPTO Notice of Allowance for U.S. Appl. No. 10/137,497 dated Jan. 24, 2007; 12 pages.

USPTO Notice of Allowance for U.S. Appl. No. 10/137,497 dated jul. 20, 2007; 4 pages.

U.S. Appl. No. 10/653,050: "Method and System for Programming a Memory Device," Snyder et al,; filed on Aug. 29, 2003; 69 pages.

USPTO Non-Final Rejection for U.S. Appl. No. 10/653,050 dated Apr. 6, 2004; 7 pages.

U.S. Appl. No. 10/172,670: "Method and System for Programming a Memory Device, " Synder et al.; filed on Jun. 13, 2002; 66 pages.

U.S. Appl. No. 11/986,338: Reconfigurable Testing System and Method, Pleis et al., filed on Nov. 20, 2007; 41 pages.

USPTO Notice of Allowance for U.S. Appl. No. 11/965,291 dated May 5, 2009; 7 pages.

USPTO Non-Final Rejection for U.S. Appl. No. 11/965,291 dated Dec. 17, 2008; 8 pages.

U.S. Appl. No. 10/002,726: "Method and Apparatus for Generating Microcontroller Configuration Information," Ogami et al., filed on Oct. 24, 2001; 54 pages.

USPTO Notice of Allowance for U.S. Appl. No. 10/002,726 dated Feb. 6, 2007; 7 pages.

USPTO Non-Final Rejection for U.S. Appl. No. 10/002,726 dated Aug. 28, 2006; 10 pages.

USPTO Final Rejection for U.S. Appl. No. 10/002,726 dated Mar. 27, 2006; 8 pages.

USPTO Final Rejection for U.S. Appl. No. 10/002,726 dated Nov. 30, 2005; 10 pages.

USPTO Non-Final Rejection for U.S. Appl. No. 10/002,726 dated Jun. 10, 2005; 10 pages.

USPTO Non-Final Rejection for U.S. Appl. No. 10/002,726 dated Dec. 13, 2004; 7 pages.

U.S. Appl. No. 11/818,005: "Techniques for Generating Microcontroller Configuration information," Ogami et al., filed on Jun. 12, 2007; 61 pages.

USPTO Requirement for Restriction/Election for U.S. Appl. No. 11/818,005 dated Jul. 14, 2009; 5 pages.

USPTO Notice of Allowance for U.S. Appl. No. 10/238,966 dated Aug. 5, 2009; 5 pages.

USPTO Notice of Allowance for U.S. Appl. No. 10/033,027 dated Sep. 2, 2009; 4 pages.

USPTO Non-Final Rejection for U.S Appl. No. 10/001,478 dated Aug. 4, 2009; 17 pages.

USPTO Advisory Action for U.S. Appl. No. 10/001,478 dated Jun. 30, 2009; 3 pages.

USPTO Final Rejection for U.S. Appl. No. 10/001,478 dated Apr. 20, 2009; 16 pages.

USPTO Notice of Allowance for U.S. Appl. No. 10/002,217 dated Sep. 17, 2009; 6 pages.

USPTO Notice of Allowance for U.S. Appl. No. 10/002,217 dated Jun. 8, 2009; 8 pages.

USPTO Notice of Allowance for U.S. Appl. No. 10/001,477 dated Dec. 4, 2009; 7 pages.

USPTO Notice of Allowance for U.S. Appl. No. 10/001,477 dated Aug. 26, 2009; 6 pages.

USPTO Ex Parte Quayle Action for U.S. Appl. No. 09/975,115 dated Aug. 20, 2009; 7 pages.

USPTO Non-Final Rejection for U.S. Appl. No. 09/994,601 dated Jul. 9, 2009; 11 pages.

USPTO Non-Final Rejection for U.S. Appl. No. 11/818,005 dated Nov. 23, 2009; 8 pages.

USPTO Requirement for Restriction/Election for U.S. Appl. No. 11/818,005 dated 07/1412009; 5 pages.

USPTO Advisory Action for U.S. Appl. No. 09/989,778 dated Jun. 17, 2009; 3 pages.

USPTO Notice of Allowance for U.S. Appl. No. 09/994,600 dated Aug. 25, 2009; 4 pages.

USPTO Notice of Allowance for Appl. No. 09/994,600 dated Apr. 3, 2009; 5 pages.

USPTO Notice of Allowance for U.S. Appl. No. 09/989,762 dated Oct. 30, 2009; 6 pages.

USPTO Notice of Allowance for U.S. Appl. No. 09/989,762 dated Jul. 16, 2009; 6 pages.

USPTO Non-Final Rejection for U.S. Appl. No. 09/998,848 dated May 12, 2009; 16 pages.

USPTO Non-Final Rejection for U.S. Appl. No. 09/989,767 dated May 12, 2009; 21 pages.

USPTO Final Rejection for U.S. Appl. No. 091989,771 dated Nov. 25, 2009; 12 pages.

USPTO Notice of Allowance for U.S. Appl. No. 09/989,765 dated Sep. 3, 2009; 7 pages.

USPTO Non-Final Rejection for U.S. Appl. No. 09/989,782 dated Oct. 27, 2009; 9 pages.

Uspto Final Rejection for Application No. 09/989,782 dated May 15, 2009; 10 pages.

Uspto Notice of Allowance for Application No. 11/986,338 dated Oct. 19, 2009; 4 pages.

Uspto Notice of Allowance for Application No. 09/989,777 dated Aug. 6, 2009; 8 pages.

Uspto Notice of Allowance for Application No. 10/008,096 dated Oct. 21, 2009; 6 pages.

USPTO Notice of Allowance for U.S. Appl. No. 10/008,096 dated Jun. 5, 2009; 12 pages.

USPTO Notice for Allowance for U.S. Appl. No. 11/985,340 dated Nov. 9, 2009; 7 pages.

USPTO Advisory Action for U.S. Appl. No. 11/201,627 dated Sep. 21, 2009; 3 pages.

Uspto Final Rejection for Application No. 11/201,627 dated Jul. 07, 2009; 19 pages.

Uspto Miscellaneous Action for Application No. 11/201,922 dated Oct. 1, 2009; 2 pages.

Uspto Non-Final Rejection for Application No. 11/200,619 dated Jun. 17, 2009; 12 pages.

Uspto Non-Final Rejection for U.S. Appl. No. 11/166,622 dated Sep. 29, 2009; 11 pages.

Uspto Advisory Action for U.S. Appl. No. 111166,622 dated May 27, 2009; 3 pages.

Uspto Final Rejection for U.S. Appl. No. 11/166,622 dated Mar. 10, 2009; 11 pages.

Uspto Notice of Allowance for U.S. Appl. No. 12/218,404 dated Nov. 3, 2009; 8 pages.
Uspto Notice of Allowance for U.S. Appl. No. 12/218,404 dated Jul. 10, 2009; 7 pages.
Uspto Notice of Allowance for U.S. Appl. No. 11/709,866 dated Aug. 4, 2009; 7 pages.
Uspto Non-Final Rejection for U.S. Appl. No. 11/698,660 dated Oct. 7, 2009; 12 pages.
Uspto Advisory Action for U.S. Appl. No. 11/698,660 dated Jul. 31, 2009; 3 pages.
Uspto Notice of Allowance for U.S. Appl. No. 11/983,291 dated Oct. 22, 2009; 7 pages.
Uspto Final Rejection for U.S. Appl. No. 11/983,291 dated Aug. 12, 2009; 10 pages.
Uspto Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
USPTO Advisory Action for U.S. Appl. No. 11/850,260 dated Nov. 2, 2009, 3 pages.
USPTO Final Rejection for U.S. Appl. No. 11/850,260 dated Aug. 21, 2009; 9 pages.
USPTO Final Rejection for U.S. Appl. No. 09/989,767 dated Dec. 7, 2009; 22 pages.
USPTO Non-Final Rejection for U.S. Appl. No. 11/865,672 dated Jul. 17, 2009; 6 pages.
USPTO Non-Final Rejection for U.S. Appl. No. 11/859,547 dated Oct. 1, 2009; 9 pages.
USPTO Non-Final Rejection for U.S. Appl. No. 11/967,243 dated Sep. 17, 2009; 9 pages.
USPTO Non-Final Rejection for U.S. Appl. No. 11/967,240 dated Jun. 10, 2009; 7 pages.
USPTO Non-Final Rejection for U.S. Appl. No. 11/857,947 dated Mar. 30, 2009; 18 pages.
USPTO Non-Final Rejection for U.S. Appl. No. 12/104,672 dated Aug. 26, 2009; 11 pages.
USPTO Non-Final Rejection for U.S. Appl. No. 12/060,128 dated Apr. 29, 2009; 11 pages.
International Search Report of the International Searching Authority for International U.S. Appl. No. PCT/ US08160695 (CD2007132) dated Jul. 22, 2009; 3 pages.
Written Opinion of the International Searching Authority for International U.S. Appl. No. PCT/US08/60695 (CD2007132) dated Jul. 22, 2009; 6 pages.
Azim et al., "A Custom Dsp Chip to Implement a Robot Motion Controller Proceedings of the IEEE Custom Integrated Circuits Conference," May 1988, pp. 8.7.1-8.7.5; 6 pages.
Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
International Search Report of the International Searching Authority for International U.S. Appl. No. PCT/US08/60696 dated Sep. 22, 2008; 2 pp.
International Search Report of the International Searching Authority for International U.S. Appl. No. PCT/US08/60698 dated Sep. 5, 2008; 2 pages.
Shahbahrami et al., "Matrix Register File and Extended Subwords: Two Techniques for Embedded Media Processors," ACM, May 2005; 9 pages.
Jung at al., "A Register File with Transposed Access Mode," 2000, IEEE; 2 pages.
International Search Report of the international Searching Authority for international U.S. Appl. No. PCT/US08/60681 dated Sep. 12, 2008; 2 pages.
Written opinion of the International Seraching Authority for International Application No. PCT/US08/60681 dated Sep. 12, 2008; 4 pages.
USPTO notice of Allowance for U.S. Appl. No. 11/965,677 dated Sep. 10, 2009; 6 pages.
USPTO Non-Final Rejection for U.S. Appl. No. 110/965,677 dated Mar. 10, 2009; 10 pages.
Written Opinion of the International seraching Authority for International Appl. No. PCT/US08/60696 dated Sep. 22, 2008; 4 pages.
Uspto Final Rejection for U.S. Appl. No. 11/698,660 dated Feb. 16, 2010; 14 pages.
Uspto Notice of Allowance for U.S. Appl. No. 091989,765 dated Dec. 22, 2009; 8 pages.
Uspto Notice of Allowance for U.S. Appl. No. 09/994,600 dated Jan. 4, 2010; 4 pages.
Uspto Notice of Allowance for U.S. Appl. No. 10/002,217 dated Jan. 11, 2010; 7 pages.
Uspto Notice of Allowance for U.S. Appl. no. 09/989,777 dated Jan. 15, 2010; 8 pages.
Uspto Notice of Allowance for U.S. Appl. No. 11/965,291 dated Jan. 13, 2010; 4 pages.
Uspto Notice of Allowance for U.S. Appl. No. 09/975,115 dated Jan. 29, 2010; 9 pages.
Uspto Notice of Allowance for U.S. Appl. No. 10/238,966 dated Feb. 1, 2010; 4 pages.
Uspto Final Rejection for U.S. Appl. No. 09/994,601 dated Jan. 5, 2010; 13 pages.
Uspto Non-Final Rejection for U.S. Appl. No. 09/998,848 dated Dec. 10, 2009; 16 pages.
Uspto Notice of Allowance for U.S. Appl. No. 10/008,096 dated Feb. 1, 2010; 6 pages.
Uspto Non-Final Rejection for U.S. Appl. No. 11/201,627 dated Dec. 24, 2009; 22 pages.
Uspto Final Rejection for U.S. Appl. No. 11/200,619 dated Jan. 04, 2010; 18 pages.
Uspto Non-Final Rejection for U.S. Appl. No. 11/644,100 dated Dec. 16, 2009; 13 pages.
Uspto Non-Final Rejection for U.S. Appl. No. 11/850,260 dated Jan. 14, 2010; 8 pages.
Uspto Notice of Allowance for U.S. Appl. No. 10/033,027 dated Feb. 18, 2010; 4 pages.
Uspto Non-Final Rejection for U.S. Appl. No. 10/133,581 dated Feb. 24, 2006; 11 pages.
Uspto Notice of Allowance for U.S. Appl. No. 11/986,338 dated Feb. 16, 2010; 4 pages.
Uspto Non-Final Rejection for U.S. Appl. No. 12/136,557 dated Mar. 15, 2010; 10 pages.
Uspto Notice of Allowance for U.S. Appl. No. 11/965,677 dated Feb. 12, 2010; 4 pages.
Uspto Notice of Allowance for U.S. Appl. No. 11/985,340 dated Feb. 19, 2010; 8 pages.
Uspto Notice of Allowance for U.S. Appl. No. 12/218,404 dated Feb. 16, 2010; 7 pages.
USPTO Notice of Allowance for Application No. 11/709,866dated Feb. 16, 2010; 7 pages.
USPTO Non-Final Rejection for Application No. 10/133,581 dated Aug. 12, 2005; 12 pages.
USPTO Notice of Allowance for Application No. 10/133,581 dated Mar. 5, 2010; 9 pages.
USPTO Non-Final Rejectiopn for U.S. Appl. No. 10/133,581 dated Sep. 1, 2009; 18 pages.
USPTO Final Rejection for Application No. 10/133,581 dated May 11, 2009; 21 pages.
USPTO Non-Final Rejection for U.S. Appl. No. 10/133,581 dated Nov. 26, 2008; 20 pages.
USPTO Final Rejection for Application No. 10/133,581 dated Jun. 11, 2008; 14 pages.
USPTO Non-Final Rejection for Application No. 10/133,581 dated Nov. 27, 2007; 15 pages.
USPTO Final Rejection for Application No. 10/133,581 dated Jul. 13, 2007; 15 pages.
USPTO Non-Final Rejection for Application No. 10/133,581 dated Jan. 10, 2007; 14 pages.
USPTO Final Rejection for U.S. Appl. No. 10/133,581 dated Aug. 10, 2006; 13 pages.
Uspto Notice of Allowance for U.S. Appl. No. 10/001,477 dated Mar. 23, 2010; 6 pages.
Uspto Notice of Allowance for U.S. Appl. No. 09/989,765 dated Mar. 31, 2010; 8 pages.

Uspto Notice of Allowance for U.S. Appl. No. 12/104,672 dated Jan. 11, 2010; 7 pages.

Uspto Non-Final Rejection for U.S. Appl. No. 11/799,439 dated Nov. 2, 2007; 7 pages.

Uspto Non-Final Rejection for U.S. Appl. No. 11/799,439 dated May 29, 2008; 8 pages.

Uspto Final Rejection for U.S. Appl. No. 11/799,439 dated Dec. 18, 2008; 6 pages.

Uspto Notice of Allowance for U.S. Appl. No. 11/799,439 dated Jun. 25, 2009; 6 pages.

Uspto Notice of Allowance for U.S. Appl. No. 11/799,439 dated Feb. 5, 2010; 4 pages.

Uspto Notice of Allowance for U.S. Appl. No. 10/256,829 dated May 10, 2010; 4 pages.

Uspto Non-Final Rejection for U.S. Appl. No. 10/256,829 dated Oct. 26, 2009; 8 pages.

Uspto Final Rejection for U.S. Appl. No. 10/256,829 dated Jun. 23, 2009; 8 pages.

Uspto Non-Final Rejection for U.S. Appl. No. 10/256,829 dated Jan. 07, 2009; 7 pages.

Uspto Non-Final Rejection for U.S. Appl. No. 10/256,829 dated Jun. 26, 2008; 11 pages.

Uspto Notice of Allowance for U.S. Appl. No. 10/256,829 dated Oct. 29, 2007; 6 pages.

Uspto Final Rejection for U.S. Appl. No. 10/256,829 dated Jun. 01, 2007; 16 pages.

USPTO Non-Final Rejection for U.S. Appl. No. 10/256,829 dated Nov. 2, 2006; 13 pages.

USPTO Non-Final Rejection for U.S. Appl. No. 10/256,829 dated May 3, 2006; 16 pages.

USPTO Final Rejection for U.S. Appl. No. 10/256,829 dated Jan. 27, 2006; 24 pages.

USPTO Non-Final Rejection for U.S. Appl. No. 10/256,829 dated Jul. 28, 2005; 14 pages.

USPTO Notice of Allowance for U.S. Appl. No. 09/989,817 dated May 9, 2005; 6 pages.

USPTO Non-Final Rejection for U.S. Appl. No. 09/989,817 dated Jan. 12, 2005; 5 pages.

USPTO Non-Final Rejection for U.S. Appl. No. 09/989,817 dated Jun. 8, 2004; 7 pages.

USPTO Notice of Allowance for U.S. Appl. No. 10/327,207 dated Jun. 11, 2007; 4 pages.

USPTO Notice of Allowance for U.S. Appl. No. 10/327,207 dated Dec. 26, 2006; 5 pages.

USPTO Non-Final Rejection for U.S. Appl. No. 10/327,207 dated Jul. 21, 2006; 12 pages.

USPTO Final Rejection for U.S. Appl. No. 10/327,207 dated Mar. 2, 2006; 13 pages.

USPTO Non-Final Rejection for Application No. 10/327,207 dated Sep. 20, 2005; 11 pages.

USPTO Miscellaneous Action for U.S.Appl. No. 10/327,207) dated May 13, 2003; 1 page.

USPTO Notice of Allowance for U.S. Appl. No. 09/989,570 dated May 19, 2005; 4 pages.

USPTO Non-Final Rejection for U.S. Appl. No. 09/989,570 dated Jan. 26, 2005; 9 pages.

USPTO Notice of Allowance for U.S. Appl. No. 09/989,570 dated Sep. 10, 2004; 8 pages.

USPTO Non-Final Rejection for U.S. Appl. No. 09/989,570 dated Mar. 25, 2004; 8 pages.

USPTO Non-Final Rejection for U.S. Appl. No. 09/989,570 dated Oct. 7, 2003; 6 pages.

USPTO Advisory Action for U.S. Appl. No. 09/989,570dated Aug. 14, 2003; 3 pages.

USPTO Final Rejection for Application No. 09/989,570 dated May 30, 2003; 9 pages.

USPTO Non-Final Rejection for U.S. Appl. No. 09/989,570dated Jan. 2, 2003; 7 pages.

USPTO Notice of Allowance for U.S. Appl. No. 09/989,571 dated Sep. 13, 2005; 6 pages.

USPTO Non-Final Rejection for U.S. Appl. No. 09/989,571 dated May 23, 2005; 8 pages.

USPTO Final Rejection for U.S. Appl. No. 09/989,571 dated Jan. 26, 2005; 11 pages.

USPTO Non-Final Rejection for U.S. Appl. No. 09/989,571 dated Jul. 12, 2004; 9 pages.

M. Moods Mano, "Computer System Architecture," 1982, Prentice-Hall, 2nd Edition, pp. 261-264 and 435-440; 14 pages.

Dirk Killat, "A One-Chip Solution for Electronic Ballasts in Fluorescent Lamps," Power Electronics, <http:// powerelectronics.com/mag/power_onechip_solution_electronic/>, dated Mar. 1, 2004, accessed Sep. 13, 2005; 4 pages.

Fred Eady, "PSOC 101," Circuit Cellar, Aug. 2004, accessed Sep. 13, 2005, <http://www.circuitcellar.com/library/ print10804/eady169/2.htm>; 4 pages.

USPTO Notice of Allowance for U.S. Appl. No. 10/803,030 dated Jan. 8, 2007; 6 pages.

USPTO Non-Final Rejection for Appl. No. 10/803,030 dated Jun. 8, 2005; 4 pages.

U.S. Appl. No. 12/058,586: "System and Method for Monitoring a Target Device," Ogami et al., filed on Mar. 28, 2008; 41 pages.

U.S. Appl. No. 12/058,534: "System and Method for Controlling a Target Device," Ogami et al., filed on Mar. 28, 2008; 40 pages.

U.S. Appl. No. 12/004,833: "Systems and Methods for Dynamically Reconfiguring a Programmable System on a Chip," Ogami et al., filed on Dec. 21, 2007; 40 pages.

U.S. Appl. No. 12/058,569: "Configuration of Programmable IC Design Elements," Best et al., filed on Mar. 28, 2008; 19 pages.

U.S. Appl. No. 12/057,149: "Power Management Architecture, Method and Configuration System," Kenneth Ogami, filed on Mar. 27, 2008; 34 pages.

U.S. Appl. No. 12/765,400: "Autonomous Control in a Programmable System," Sullam et al., filed on Apr. 22, 2010; 30 pages.

International Search Report for International Application No. PCT/US10/33626 mailed Jun. 24, 2010; 3 pages.

The Written Opinion of the International Search Report for International Application No. PCT/US10/33626 mailed Jun. 24, 2010; 5 pages.

USPTO Non-Final Rejection for U.S. Appl. No. 12/060,176 dated Mar. 30, 2010; 22 pages.

John Mangino, "Using DMA with High Performance Peripherals to Maximize System Performance," 2007, Texas Instruments, pp. 1-23; 23 pages.

Balough et al., "White Paper: Comparing IP Integration Approaches for FPGA Implementation," Feb. 2007, Version 1.1, Altera, pp. 1-7; 7 pages.

A.F. Harvey, "DMA Fundamentals on Various PC Platforms," 2001, 2004, National Instruments Corporation, pp. 1-19; 19 pages.

Vixel, "InSpeed SOC 320 Embedded Storage Switch," 2003, Vixel, pp. 1-5; 5 pages.

USPTO Notice of Allowance for U.S. Appl. No. 09/943,062 dated Jun. 29, 2010; 4 pages.

USPTO Miscellaneous Action for U.S. Appl. No. 10/113,581 dated Jun. 23, 2010; 6 pages.

USPTO Miscellaneous Action for U.S. Appl. No. 10/001,478 dated Feb. 23, 2010; 5 pages.

USPTO Notice of Allowance for U.S. Appl. No. 10/001,478 dated Jun. 2, 2010; 11 pages.

USPTO Notice of Allowance for U.S. Appl. No. 11/985,340 dated Jun. 9, 2010; 8 pages.

USPTO Notice of Allowance for U.S. Appl. No. 11/850,260 dated Jul. 2, 2010; 8 pages.

USPTO Notice of Allowance for U.S. Appl. No. 12/060,128 dated Oct. 19, 2009; 8 pages.

USPTO Non-Final Rejection for U.S. Appl. No. 09/975,338 dated Apr. 30, 2010; 2 pages.

USPTO Advisory Action for Application No. 11/818,005 dated Jul. 30, 2010; 3 pages.

USPTO Non-Final Rejection for Application No. 12/132,527 dated Apr. 29, 2010; 7 pages.

USPTO Advisory Action for Application No. 11/201,627 dated Aug. 5, 2010; 3 pages.

USPTO Final Rejection for Application No. 11/201,627 dated May 24, 2010; 26 pages.

USPTO Non-Final Rejection for Application No. 11/166,622 dated Jun. 22, 2010; 11 pages.
USPTO Final Rejection for Application No. 11/166,622 dated Mar. 18, 2010; 12 pages.
USPTO Non-Final Rejection for Application No. 11/698,660 dated May 21, 2010; 15 pages.
USPTO Advisory Action for Application No. 11/644,100 dated Jul. 21, 2010; 3 pages.
USPTO Final Rejection for Application No. 11/644,100 dated May 19, 2010; 13 pages.
USPTO Final Rejection for Application No. 11/865,672 dated Dec. 30, 2010; 6 pages.
USPTO Final Rejection for Application No. 11/857,947 dated Oct. 14, 2009; 22 pages.
USPTO Non-Final Rejection for U.S. Appl. No. 11/857,947 dated Feb. 3, 2010; 23 pages.
USPTO Non-Final Rejection for U.S. Appl. No. 11/857,947 dated Jul. 21, 2010; 15 pages.
USPTO Non-Final Rejection for U.S. Appl. No. 12/058,569 dated Aug. 2, 2010; 9 pages.
USPTO Final Rejection for U.S. Appl. No. 11/968,145 dated Aug. 2, 2010; 6 pages.
USPTO Non-Final Rejection for U.S. Appl. No. 11/968,145 dated Mar. 4, 2010; 11 pages.
USPTO Non-Final Rejection for U.S. Appl. No. 12/104,678 dated Jul. 2, 2010; 8 pages.

* cited by examiner

US 7,844,437 B1

SYSTEM AND METHOD FOR PERFORMING NEXT PLACEMENTS AND PRUNING OF DISALLOWED PLACEMENTS FOR PROGRAMMING AN INTEGRATED CIRCUIT

RELATED APPLICATIONS

U.S. patent application Ser. No. 10/033,027, entitled "PROGRAMMABLE MICROCONTROLLER ARCHITECTURE," filed on Oct. 22, 2001, and with inventor Warren Snyder is hereby incorporated by reference.

FIELD OF THE INVENTION

The invention relates generally to the field of chip design software applications, more particularly to a system and method for placing resources within a chip.

BACKGROUND OF THE INVENTION

It is often useful to utilize chip design application software to layout and plan new chips. This chip design application software is typically configured to aide the user in keeping track of resource requirements of particular modules. Furthermore, chip design application software also allows users to assign chip resources to particular modules.

However, chip design software applications typically have minimal graphical support. They usually are not capable of supplying the user with a graphical display representing a current status of the layout of the resources on a chip. Chip designers are typically required to manually and textually track their layout decisions with minimal graphical support. Further, typical software packages do not give graphical representations of possible placement of resources for unplaced user modules. Additionally, typical software packages also do not provide automated possible placements for user module resources.

Using the conventional art, a chip designer examines the vacant hardware resources and manually determines which hardware resources can be used for which user modules. This task involves manually determining the set of resources available in a hardware block and comparing them to the resources needed for a user module. This manual test is very technically complex and user-prone. Further, because possible placements require a great deal of manual effort, optimization through iteration trial and error is typically never accomplished.

SUMMARY OF THE INVENTION

It is useful to provide a chip designer with a chip design application software that provides the chip designer with an automated placement of user module resource onto the chip given constraints of the chip resources and the requirements of the user module resources. For example, having a placement of resources for a user module automatically be performed without low level programming by a user would be useful. Further, being able offer alternate placement possibilities for resources of user modules would also be beneficial.

A system and method are described for graphically displaying modules and resources within a chip design software application. The system and method provide a data driven model for matching the hardware resource requirements for an associated user module and the available hardware resources on an underlying chip. In this way, possible placements of a user module can be inferred from the data descriptions of the hardware resources and the user modules. In one embodiment, the data descriptions are formatted using XML data. Databases are utilized to describe the hardware resource requirements which are dictated by the particular user module and the available hardware resources of a particular chip. The user module descriptive database can be updated in response to additional user modules being added or changes to the hardware resource requirements of existing user modules. The hardware description database can be updated in response to additional chips being added. Further, the graphical interface relates both a user module and the possible hardware resource. This graphical interface utilizes highlights of both the module and the associated resource in patterns, grayscales, or colors to graphically illustrate the relationship between the module and the associated resource.

User modules may require multiple hardware blocks to implement. In some cases, user modules may require special ports or hardware which will limit the number of hardware blocks that can be used for their implementation. The process of mapping hardware blocks to a user module, such that the user module is realized within the microcontroller, is called "user module placement."

Embodiments of the present invention relate to an automatic process that determines the possible placements of a user module based on (1) its XML user module description and (2) the hardware description of the underlying chip. The potential placement positions are automatically inferred based on the XML input data. Therefore, the placement process of the present invention is data driven from this viewpoint.

In one example, when the next placement icon is selected, a potential placement position is computed based on the XML input data. The placement is shown in a graphical hardware layout diagram by highlighting the hardware blocks involved. By clicking the next placement icon, a new placement is then computed and displayed. Placements that are incompatible with the user module requirements are automatically pruned out. In one embodiment, all positions are shown to the user, sequentially, each time the next placement icon is selected. However, if a potential placement involves a hardware block that has already been used (e.g., by another placed user module), then in these cases the placement icon is grayed out indicating that this placement is only valid if the resources were vacant. This allows the user to see all possible placements.

An advantage is that the placement process is data driven based on the XML descriptions of the user modules and hardware. The placements that are computed are inferred based on these descriptions.

More specifically, an embodiment of the present invention is drawn to a computer implemented method of determining hardware resources for an electronic design comprising: a) selecting an electronic design represented as a user module; b) accessing a data description of resources required for the user module; c) accessing data descriptions of a plurality of programmable resources of an electronic device; and d) comparing the data description of the user module with the data descriptions of the plurality of programmable resources to automatically determine potential placement options of the user module among the plurality of programmable resources.

Embodiments are also directed to a method as described above and further comprising: displaying on a graphical user interface, a first potential placement of the potential placement options; and in response to a user selecting a next placement icon, displaying on the graphical user interface, a second potential placement of the potential placement options, wherein potential placement options are displayed using visual attributes and wherein the electronic device is a programmable microcontroller device.

Embodiments include the above and wherein the user module requires one or more programmable resource to place and wherein the plurality of programmable resources comprise a plurality of analog programmable resources and a plurality of digital programmable resources.

Embodiments also include the above and wherein the data descriptions are created in XML.

Other aspects and advantages of the invention will become apparent from the following detailed description, taken in conjunction with the accompanying drawings, and illustrated by way of example of the principles of the invention.

DETAILED DESCRIPTION

Specific reference is made in detail to the embodiments of the invention, examples of which are illustrated in the accompanying drawings. While the invention is described in conjunction with the embodiments, it will be understood that the embodiments are not intended to limit the scope of the invention. The various embodiments are intended to illustrate the invention in different applications. Further, specific details are set forth in the embodiments for exemplary purposes and are not intended to limit the scope of the invention. In other instances, well-known methods, procedures, and components have not been described in detail as not to unnecessarily obscure aspects of the invention.

Figure 1:
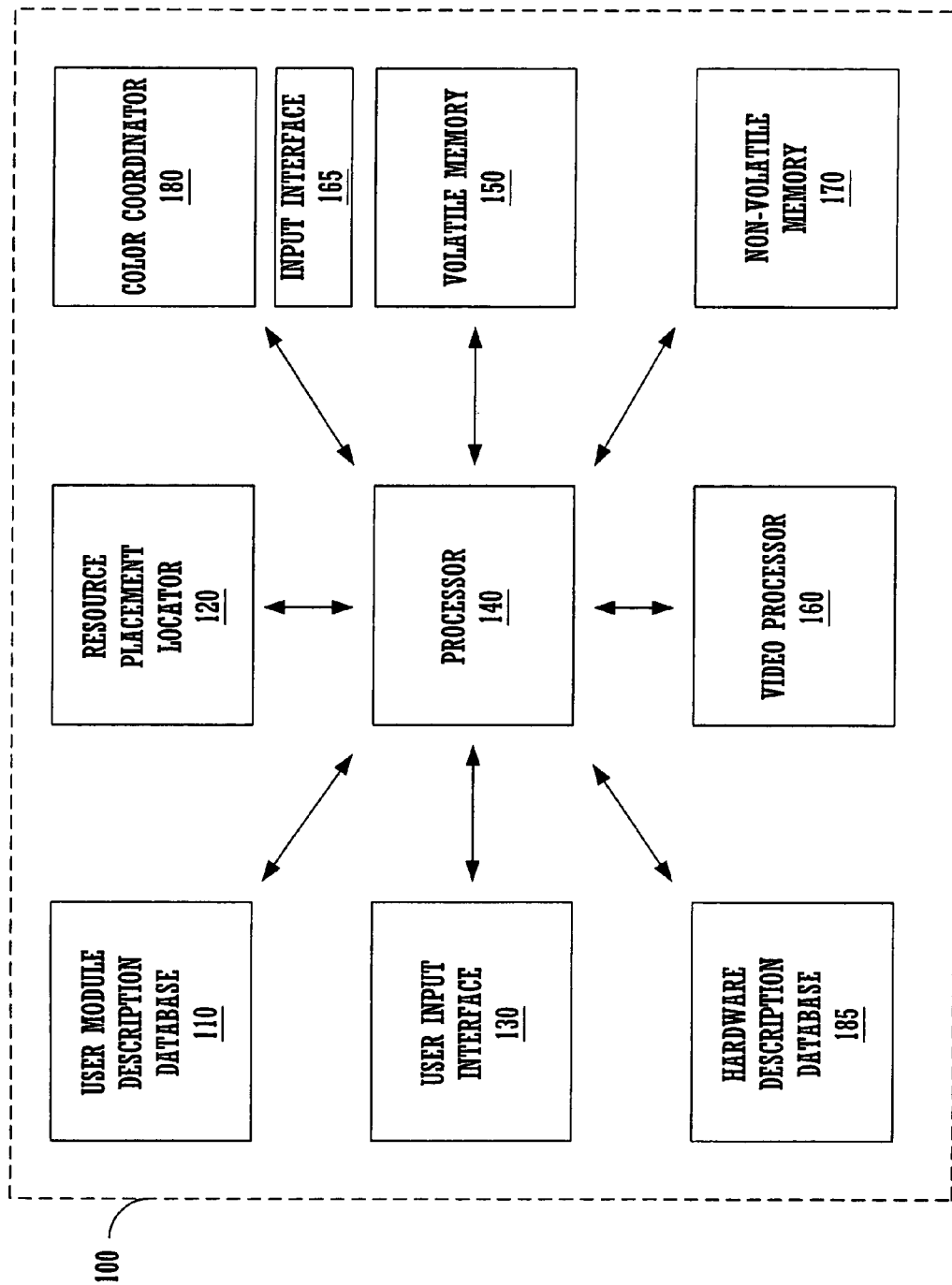
FIG. 1 illustrates a system for coding modules and associated resource(s) in accordance with the invention.

With reference to FIG. 1, a system 100 for utilizing a data driven model for matching the hardware resource requirements for an associated user module and the available hardware resources on an underlying chip is shown. Further, the system 100 graphically illustrates alternative possible placements for user module resources and automatically generates alternative placements for user module resources based on the requirements of the user module and the resource availability on the underlying chip. The system 100 operates within a chip design application to automatically generate possible placements for user module resources based on the requirements of the user module and the resource availability on the chip. Further, the system 100 also operates to graphically display the correlation between an unplaced module and multiple alternate possible resources associated with the unplaced module. In one embodiment, the graphical correlation between the unplaced module and the possible resources associated with the unplaced module are displayed by use of a corresponding color within the design application.

The system 100 includes a processor 140, a user input interface 130 (e.g., cursor control device and keyboard), volatile memory 150, a video processor 160, and non-volatile memory 170. The input interface 130, the volatile memory 150, the video processor 160, and the non-volatile memory 170 are connected to the processor 140. The input interface 130, the processor 140, the volatile memory 150, the video processor 160, and the non-volatile memory 170 are components that are readily found in personal computer systems.

The system 100 further includes a user module description database 110, a resource placement locator 120, a color coordinator 180, and a hardware description database 185, which are also connected to the processor 140. The components 110, 120, 180, and 185 are merely illustrated in FIG. 1 as one embodiment of the system 100. Although the components 110, 120, 180, and 185 are illustrated in FIG. 1 as separate components of the system 100, two or more of these components may be integrated, thus decreasing the number of components in the system 100. Similarly, the components 110, 120, 180, and 185 may also be separated, thus increasing the number of components within the system 100. The components 110, 120, 180, and 185 may be implemented in any combination of hardware, firmware and software.

In one embodiment, the system 100 helps users more accurately and efficiently design chip layouts. The system 100 automatically finds potential placements of resources which fulfill the requirements of the associated user module.

The system 100 can iterate through multiple potential placement possibilities for resources, thus giving the user of the system 100 multiple choices for resource placement.

Further, the system 100 also graphically displays relationships between the user module and the potential placement locations for the resources. The system 100 can also graphically display locations that are currently occupied by another user module but otherwise could have been a potential placement location.

In one embodiment, the system 100 is configured to support microcontroller design. In another embodiment, the system 100 is configured to support programmable microcontroller design. In yet another embodiment, the system 100 supports general chip design.

The input interface 165 provides a means for the system 100 to receive user input which may include selection of various user module and resources and command sequences. The input interface 165 may be a USB port, a serial port, Ethernet port, or any other interface port configured to transmit electronic data to the system 100.

The video processor 160 provides graphical output from the system 100. The video processor 160 is configured to display color coded user modules and corresponding resources.

The user module description database 110 contains descriptions of the required hardware resources needed by a particular user module. This information may be stored using XML data. In addition to a list of hardware resources that are needed, the user module description database 110 also stores the specific configuration requirements of the needed hardware resources. Some of the description of the required hardware resources contains detailed configuration parameters such as pin restrictions, resource dependencies, speed requirements, and the like. For example, due to communication requirements between hardware resources, these hardware resources may need to be located in close proximity to each other. Another example, due to performance requirements, certain hardware resources may need to be located in close proximity to each other.

In one embodiment, the user module description database 110 contains descriptions of hardware resources within a user module. The user module description database 110 can include the hardware resource requirements of many different user modules. In this embodiment, the user module description database 110 would be applicable across a plurality of underlying chips. The contents of the user module description database 110 can be updated based on changes to the resource requirements of the user module or the introduction of new user modules not currently contained within the user module description database 110. In one embodiment, the user module description database 110 is updated from an outside source. The updated data can be routed through the input interface 130. In one embodiment, the information within the user module description database 110 can also be stored within the volatile memory 150 and/or the non-volatile memory 170.

In one embodiment, the user module description database 110 is implemented in XML. In another embodiment, the user module description database 110 is implemented in any other mark-up language.

The hardware description database 185 contains descriptions of hardware resources within the underlying chip. These descriptions includes various attributes of the hardware resources such as the functionality of the resources, the interconnectivity between these resources, the operating parameters of the resources, the pin layouts of the resources, and the like.

In one embodiment, the hardware description database 185 contains descriptions of hardware resources for multiple underlying chips. In this embodiment, the hardware description database 185 would be applicable across a plurality of underlying chips. The contents of the hardware description database 185 can be updated based on changes to the resources within the underlying chip or the introduction of new chips not currently contained within the hardware description database 185. In one embodiment, the hardware description database 185 is updated from an outside source. The updated data can be routed through the input interface 130. In one embodiment, the information within the hardware description database 185 can also be stored within the volatile memory 150 and/or the non-volatile memory 170.

In one embodiment, each instance of a change in utilized resources within the underlying chip triggers an update within the hardware description database 185. For example, when a hardware resource changes from being utilized to being available because the associated placed user module become "unplaced", then the hardware description database 185 is updated with the newly available hardware resources. Likewise, when a hardware resource changes from being available to being utilized because the associated user module is "placed", then the hardware description database 185 is updated with the newly unavailable hardware resources.

In one embodiment, the hardware description database 185 is implemented in XML. In another embodiment, the hardware description database 185 is implemented in any general database format which is compatible with the database engine used.

The resource placement locator 120 locates available hardware resources on an underlying chip that would be suitable for realizing an unplaced module. The module, or user module is a circuit design. In one embodiment, the resource placement locator 120 is configured to accept the hardware resource requirements for the unplaced module from the user module description database 110 and to search for a resource from the available resources that would satisfy these requirements from the hardware description database 185. The resource placement locator 120 can utilize the information describing the hardware resource requirements of a user module and find a suitable match based on that information. Hardware resources on the underlying chip which are incompatible with the user module are automatically disregarded and pruned out from the selection of suitable resources.

In one embodiment, the hardware resources that are currently utilized by another user module which would otherwise be suitable for a current user module are grayed out indicating that placement of these resources would only be valid if the resources were vacant. In another embodiment, occupied hardware resources would not be highlighted and would be disregarded and pruned.

In another embodiment, the resource placement locator 120 sequentially searches for possible resource configurations from the available resources. For example, the resource placement locator 120 can be configured to find a first set of resources which fulfill the requirements for the unplaced module. Next, the resource placement locator 120 can be configured to sequentially find a second set of resources that are different from the first set of resources which also fulfill the requirements for the unplaced module.

The color coordinator 180 graphically matches the module and the associated corresponding resources. In one embodiment, the color coordinator 180 color codes the module and the associated corresponding resources. In one embodiment, the color coordinator 180 is configured to select a unique color to display both an unplaced module and a possible set of available resources corresponding to the requirements of the unplaced module. In another embodiment, the color coordinator 180 is configured to select a unique color to display an unplaced module and another unique color to display a fixed resource and another unique color to display a next placement resource.

In one embodiment, matching colors can be utilized. In another embodiment, matching grayscales also can be utilized. In yet another embodiment, matching patterns can also be utilized.

Figure 2A:
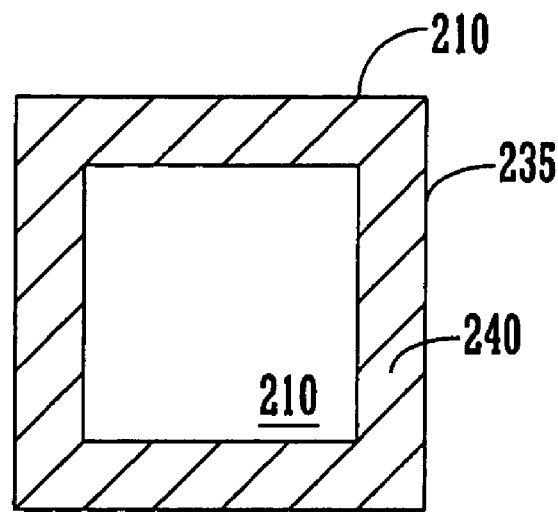
FIGS. 2A, 2B, and 2C illustrate various embodiments for color coding modules and associated resources in accordance with the invention.
Figure 2A:
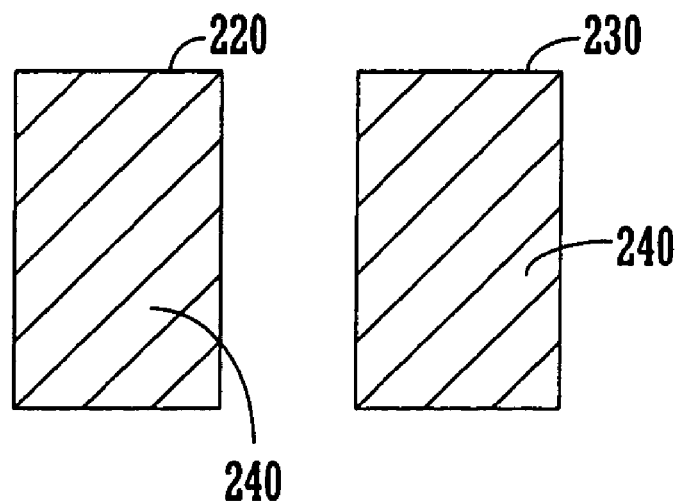
Figure 2B:
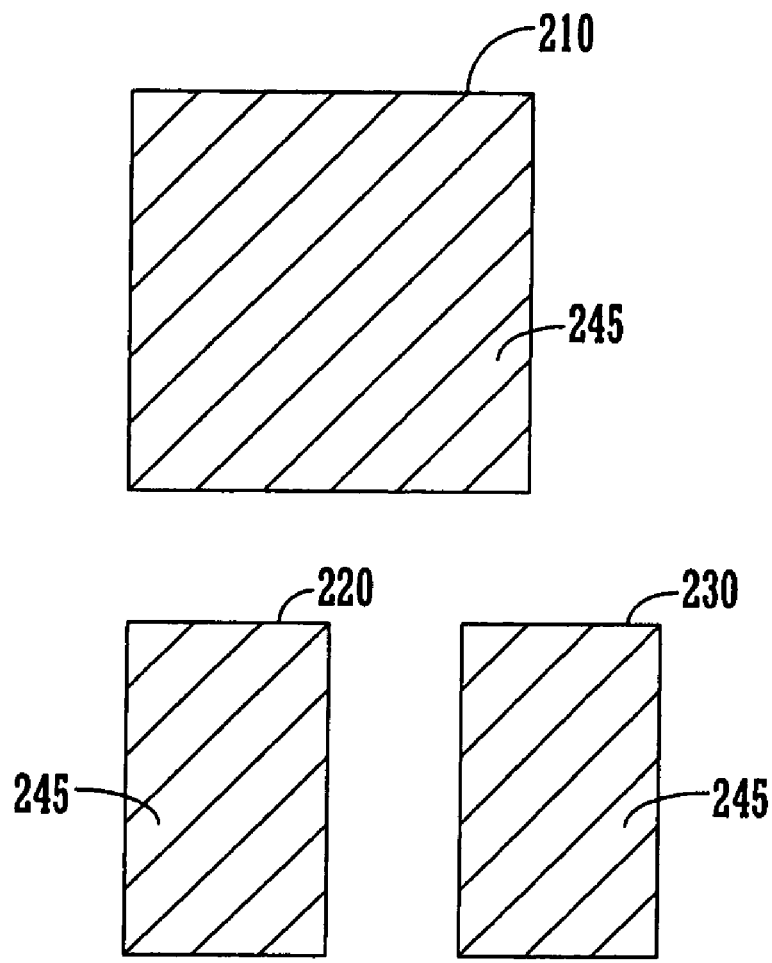
Figure 2C:
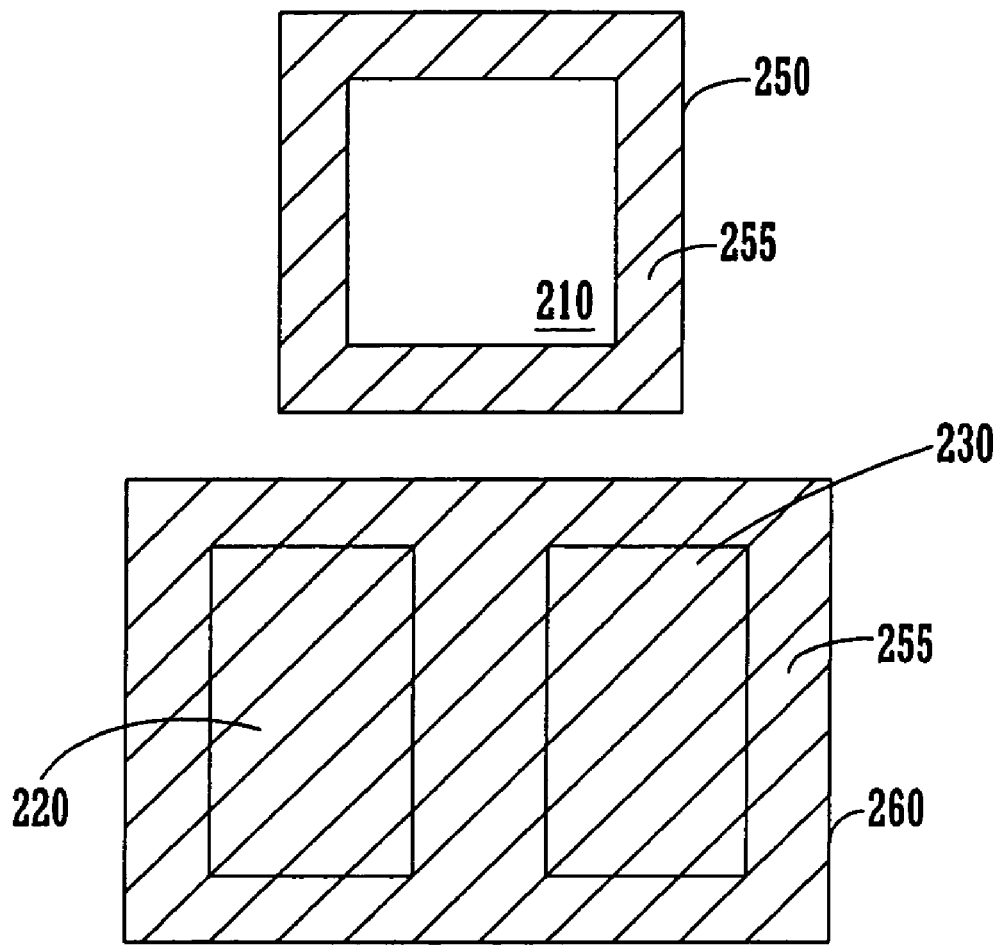

FIGS. 2A, 2B, and 2C each illustrate one embodiment of the color coordinator 180 displaying a unique color that corresponds with a module and resources which correspond with the module. For the sake of clarity, common element numbers are utilized to represent similar items to avoid unnecessary confusion. For example, a module 210 and the corresponding resources 220 and 230 are utilized in FIGS. 2A, 2B, and 2C to merely illustrate the different embodiments of color coding the module 210 with the corresponding resources 220 and 230. Additional modules and resources can be displayed simultaneously.

In FIG. 2A, a ring 235 appears around an icon representation of the module 210. In one embodiment, the ring 235 is displayed filled in with a cross-hatched pattern 240 to represent a unique color. However, in other embodiments, different shading techniques may be utilized. The resources 220 and 230 are also filled in with the cross-hatched pattern 240. The same cross-hatched pattern 240 within the ring 235 and within the corresponding resources 220 and 230 visually indicate that the module 210 corresponds to the resources 220 and 230.

In FIG. 2B, the module icon 210 is displayed filled in with a cross-hatched pattern 245 to represent a unique color. However, in other embodiments, different shading techniques may be utilized. The resources 220 and 230 are also filled in with the cross-hatched pattern 245. The same cross-hatched pattern 245 within the module 210 and within the corresponding resources 220 and 230 visually indicate that the module 210 corresponds to the resources 220 and 230.

In FIG. 2C, a ring 250 appears around the module icon 210. In one embodiment, the ring 250 is displayed filled in with a cross-hatched pattern 255 to represent a unique color. However, in other embodiments, different shading techniques may be utilized. An area 260 is also filled in with the cross-hatched pattern 255. The area 260 includes the resources 220 and 230. The same cross-hatched pattern 255 within the ring 250 and within the area 260 visually indicate that the module 210 corresponds to the resources 220 and 230.

Figure 3:
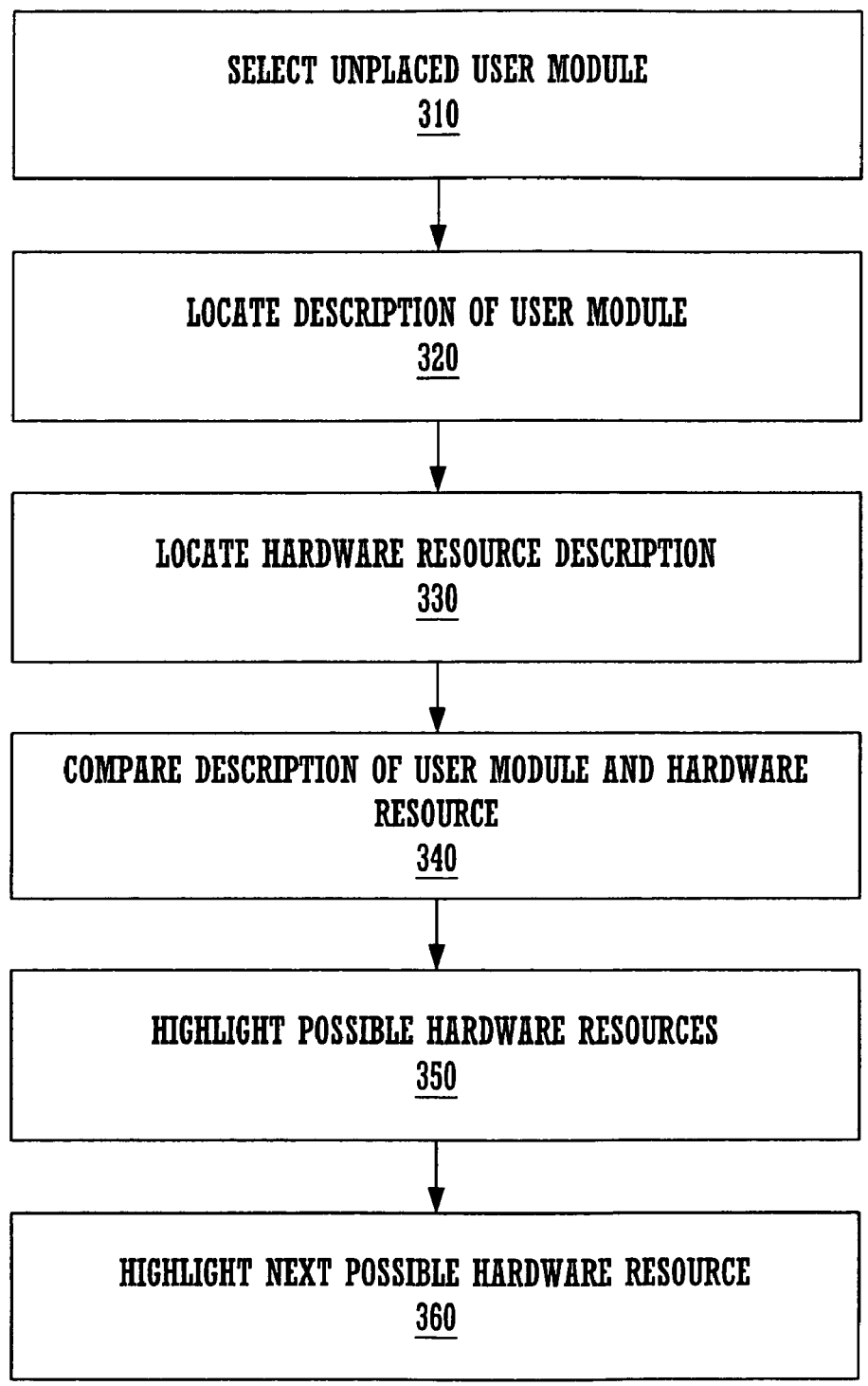
FIG. 3 illustrates a process flow diagram of one embodiment of the invention.

FIG. 3 illustrates a process flow diagram in accordance with one embodiment of the invention. The functional blocks are not to be construed as limiting the number of functional blocks within the process flow diagrams nor to be construed as a requirement for every functional block. The blocks may be performed in a different sequence without departing from the spirit of the invention. Further, blocks may be deleted, added or combined without departing from the spirit of the invention.

FIG. 3 illustrates one embodiment showing the selection of an unplaced module and the viable options of possible resources which meet the requirement of the unplaced module. In Block 310, an unplaced module is selected.

In Block 320, a description of the required hardware resources associated with the selected unplaced module are located. In one embodiment, the function within the Block 320 can be performed by the user module description database 110 (FIG. 1).

In Block 330, a description of the underlying hardware resources within the underlying chip are located. In one embodiment, the function within the Block 330 can be performed by the hardware description database 185 (FIG. 1).

In Block 340, a comparison between the description of the required hardware resources associated with the selected unplaced module and the description of the hardware resources belonging to the underlying chip occur. The result of this comparison is a group of possible hardware resources that satisfy the requirements of the selected unplaced module. In one embodiment, the function within the Block 340 can be performed by the resource placement locator 120 (FIG. 1).

For instance, if a user module requires a special port, then any hardware resource block not having the port is automatically pruned out of the list by performing the database comparison function of Step 340. Furthermore, if a user module requires multiple hardware resources that need to be adjacent, then any set of hardware resources not meeting this requirement will be automatically pruned out of consideration. In one embodiment, occupied hardware resources are also pruned out. In another embodiment, they are left in to give the user maximum potential placement information. The pruning process is data driven according to the XML databases which are compared to determine the list of possible placement options.

By automatically selecting the possible placements, and automatically pruning the disallowed placements, the user need only click the next placement icon to view the potential placements available to select the optimal placement location for a user module.

In Block 350, the hardware resources of the underlying chip which satisfy the requirements of the selected unplaced module are highlighted. In one embodiment, the hardware resources that are currently utilized by another user module which would otherwise be suitable for a current user module are grayed out indicating that placement of these resources would only be valid if the resources were vacant. In Block 360, the next set of hardware resources of the underlying chip which satisfy the requirements of the selected unplaced module are highlighted.

Figure 4:
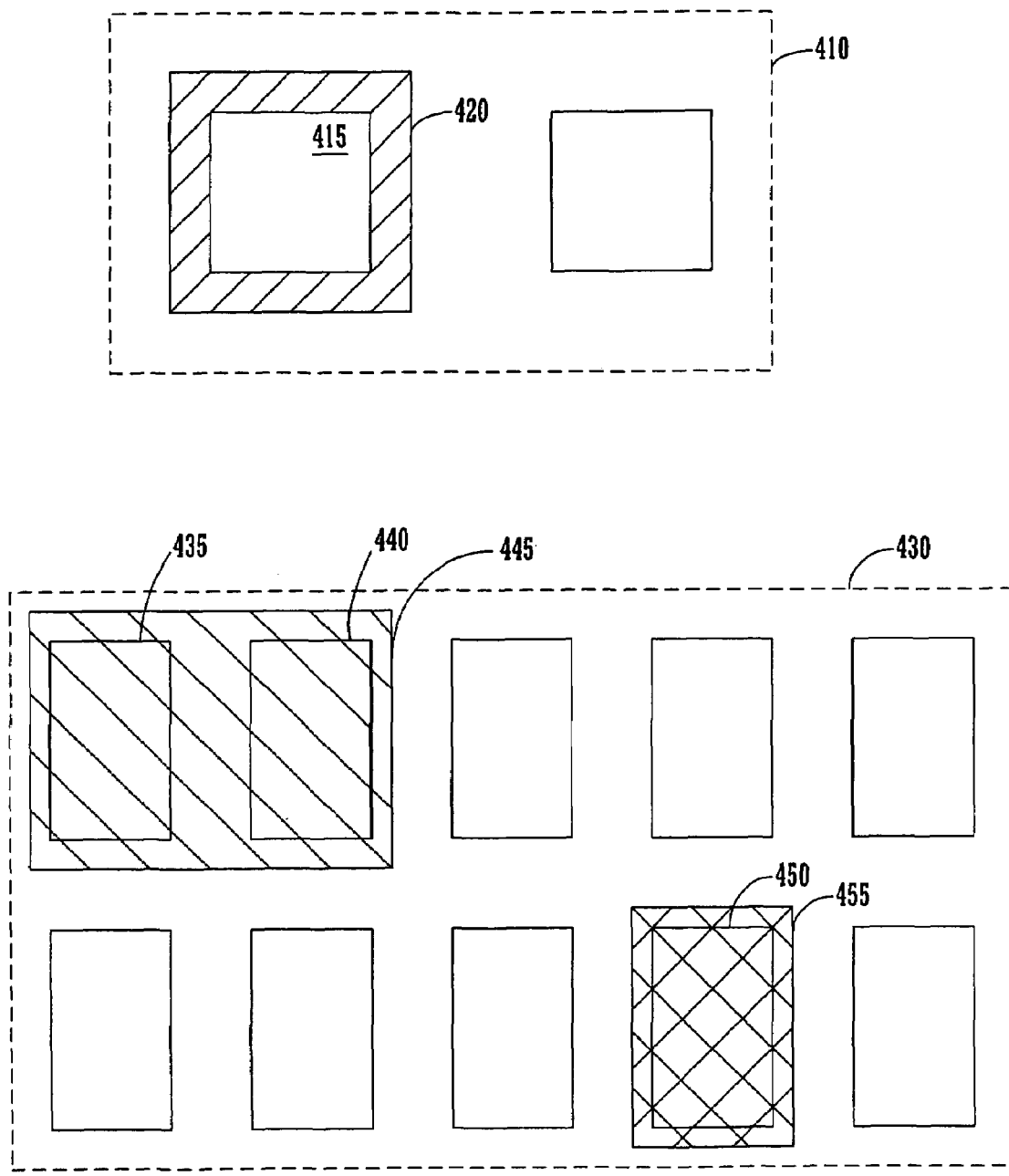
FIG. 4 illustrates a display screen from one embodiment of the invention.

FIG. 4 illustrates one embodiment of a display screen showing a group of modules and a group of resources. For example, a module grouping 410 and a resource grouping 430 are utilized in FIG. 4 to merely illustrate a graphical representation of the general layout of the plurality of modules and resources. Additional modules and resources can be displayed simultaneously.

In one embodiment, FIG. 4 illustrates a highlighted module 415 within the module grouping 410. The highlighted module 415 is shown with a ring 420 surrounding the module 415. The ring 420 is shown with a first cross-hatched pattern. The highlighted module 415 graphically illustrates that this particular module is selected from the module grouping 410.

Resources 435, 440, and 450 are shown highlighted and correspond to the module 415. The resources 435, 440, and 450 are shown within the resource grouping 430. The resources 435 and 440 are also shown highlighted with a second cross-hatched pattern 445. The resource 450 is shown highlighted with a third cross-hatched pattern 455.

In one embodiment, the resources 435 and 440 are decoupled from the resource 450 as illustrated by the second cross-hatched pattern 445 and the third cross-hatched pattern 455, respectively. In one embodiment, the resources 435 and 440 are coupled together and placed as a group.

In one embodiment, the second cross-hatched pattern 445 graphically represent the area covered by the unfixed resources, and the third cross-hatched pattern 455 graphically represents the area covered by the fixed resources. Accordingly, in this embodiment, the resources 435 and 440 are initially unfixed, and the resource 450 is initially fixed. However, the resources 435 and 440 can become fixed resources at any time by finalizing placement of the resources 435, 440, and 450 of the module 415 or by selecting the resource 450 as the unfixed resource.

In operation, as a next placement is requested, the resources 435 and 440 are iterated to a next available position for placement. The second cross-hatched pattern 445 follows the resources 435 and 440 to their next location. If a next placement is requested again, the resources 435 and 440 would be iterated again to the next available position as long as the resources 435 and 440 are unfixed. At any time during this process, the resources 435 and 440 can have their placements finalized by either finalizing placement for the resources 435, 440, and 450 or by selecting the resource 450 as the unfixed resource.

In another embodiment, there can be more or fewer resources associated with the second and third cross-hatched patterns 445 and 455. There can also be more than one group of fixed resources. The second and third cross-hatched patterns 445 and 455 and their associated resources are shown for exemplary purposes.

Next Placement Iterator Example

Figure 5A:
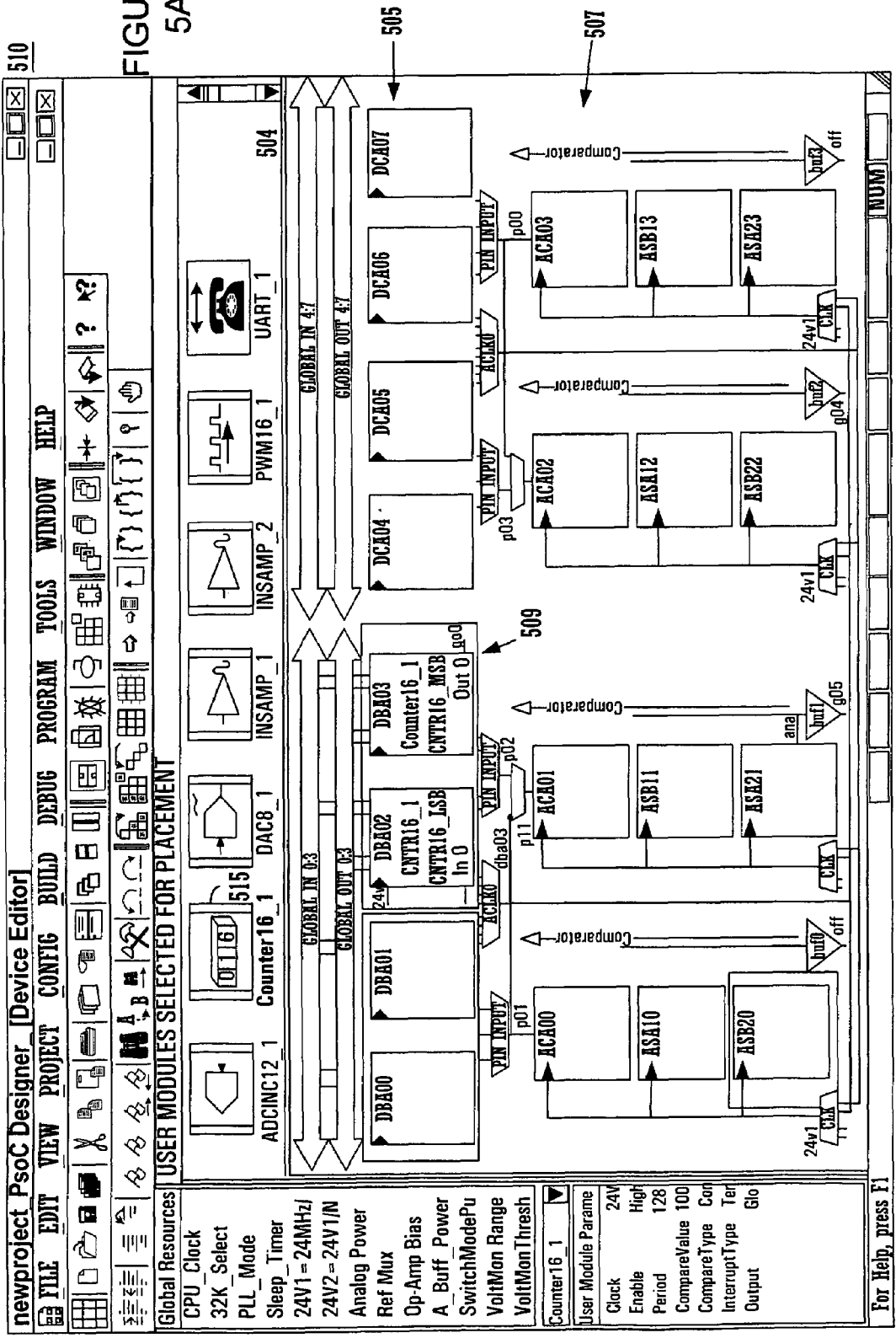
FIG. 5A illustrates an exemplary screen diagram of a next placement iteration procedure of an embodiment of the present invention where one user module is placed.

FIG. 5A illustrates an example computer screen diagram 510 of a next placement iterator process in accordance with one embodiment of the present invention. In accordance with the graphical user interface, the digital resources (here, eight) are shown in an upper horizontal row 505 and the analog resources (here, twelve) are shown in a lower situated matrix 507. A selection bar 505 comprises user module icons that can be selected. The user module icon 515 ("counter") is currently selected. The allocated resources 509 that are designated to implement user module 515 are also highlighted. In this embodiment, the color ring that surrounds user module icon 515 is color coded to the allocated resources 509. Therefore, this user module 515 is currently placed. The remaining user module icons of the selection bar 504 remain unplaced.

Figure 5B:
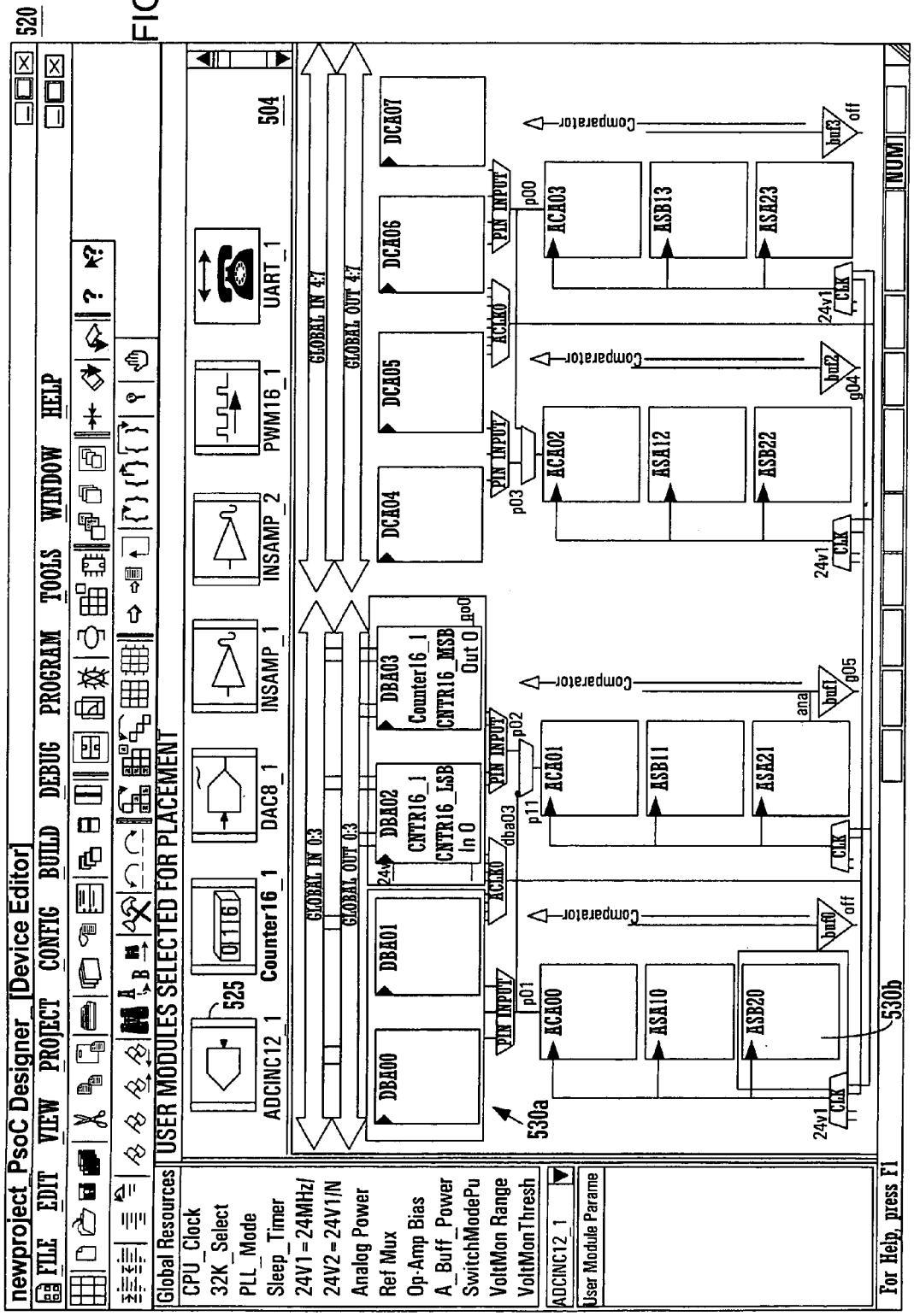
FIG. 5B illustrates an exemplary screen diagram of a next placement iteration procedure of an embodiment of the present invention where a subject user module is selected and showing an initial possible placement designation for the subject user module.

FIG. 5B illustrates an example computer screen diagram 520 of the next placement iterator process in accordance with one embodiment of the present invention where the user selects an unplaced user module icon 525 (the "ADCINC"). Since the module 525 is unplaced, it does not have an associated color ring. Upon selection of the user module icon 525, an initial possible placement for this design is displayed. The initial possible placement includes two digital resources (blocks) 530a and one analog resource 530b. In the embodiment shown, only vacant blocks were selected as the initial placement, however, in another embodiment, the computer could also designate a used block as a potential placement option for user module 525. Of course, a block would have to be made vacant before it could be used for user module 525.

Figure 5C:
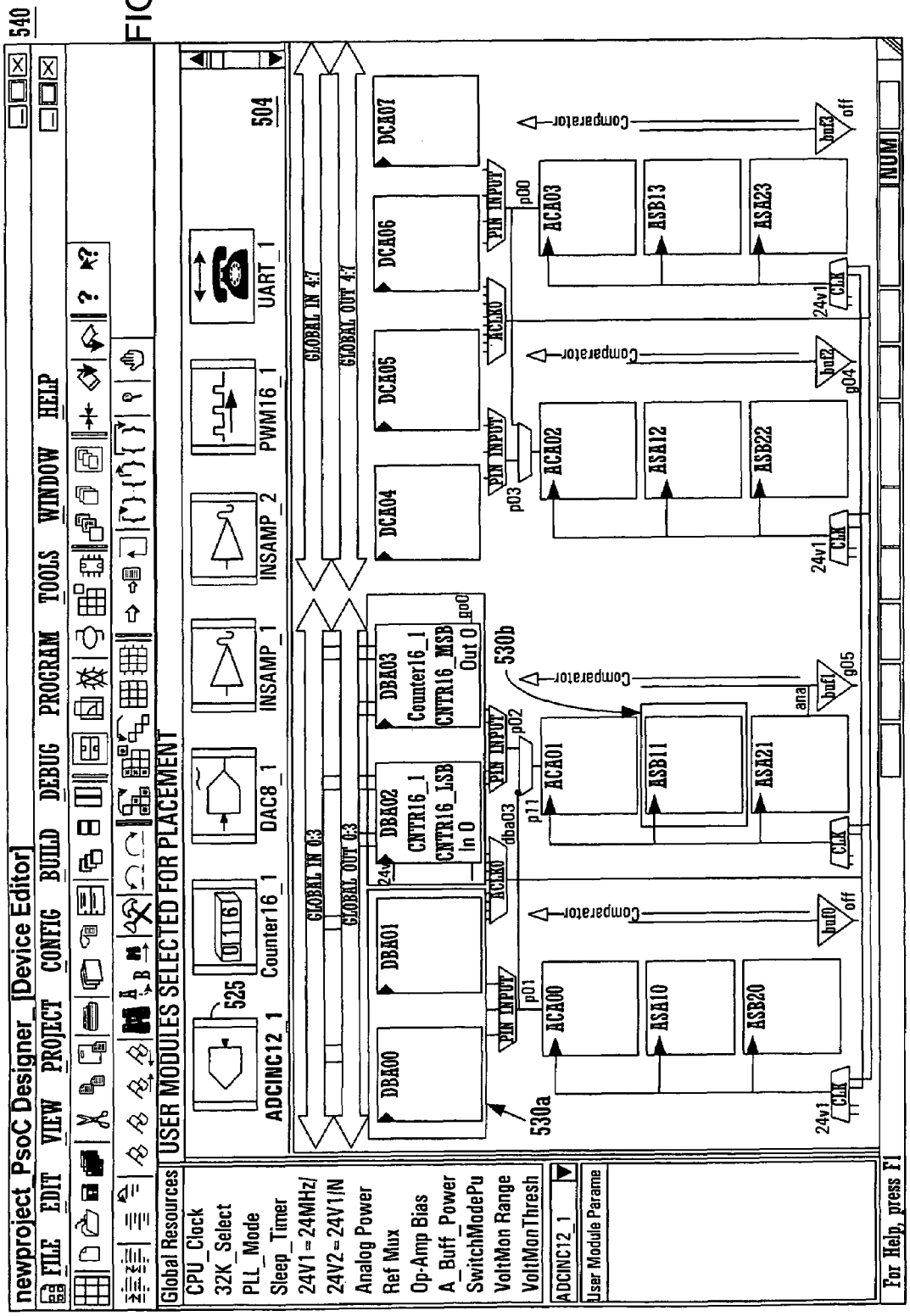
FIG. 5C illustrates an exemplary screen diagram of a next placement iteration procedure of an embodiment of the present invention where a subject user module is selected and the digital portion of the initial placement is maintained while the analog portion is iterated to a next placement (second).

FIG. 5C illustrates an example computer screen diagram 530 of the next placement iterator process in accordance with one embodiment of the present invention where the user invokes a next placement iteration for module icon 525 (the "ADCINC"). In particular, the user uses the cursor control device to select resource 530b. This causes the cross hatching behind the analog resource 530b to change colors from the cross hatching behind the digital resources 520a. Once selected, the user clicks the "next placement" icon 590, this causes the analog resource to move from its initial location in FIG. 5B to its new location in FIG. 5C. FIG. 5C therefore illustrates a second possible placement for the selected user module 525. By selecting the analog resource 530b before pressing the next placement icon 590, the user decoupled the placement of the digital versus analog resources. In other words, the digital resources 530a remained fixed from FIG. 5B to FIG. 5C.

Figure 5D:
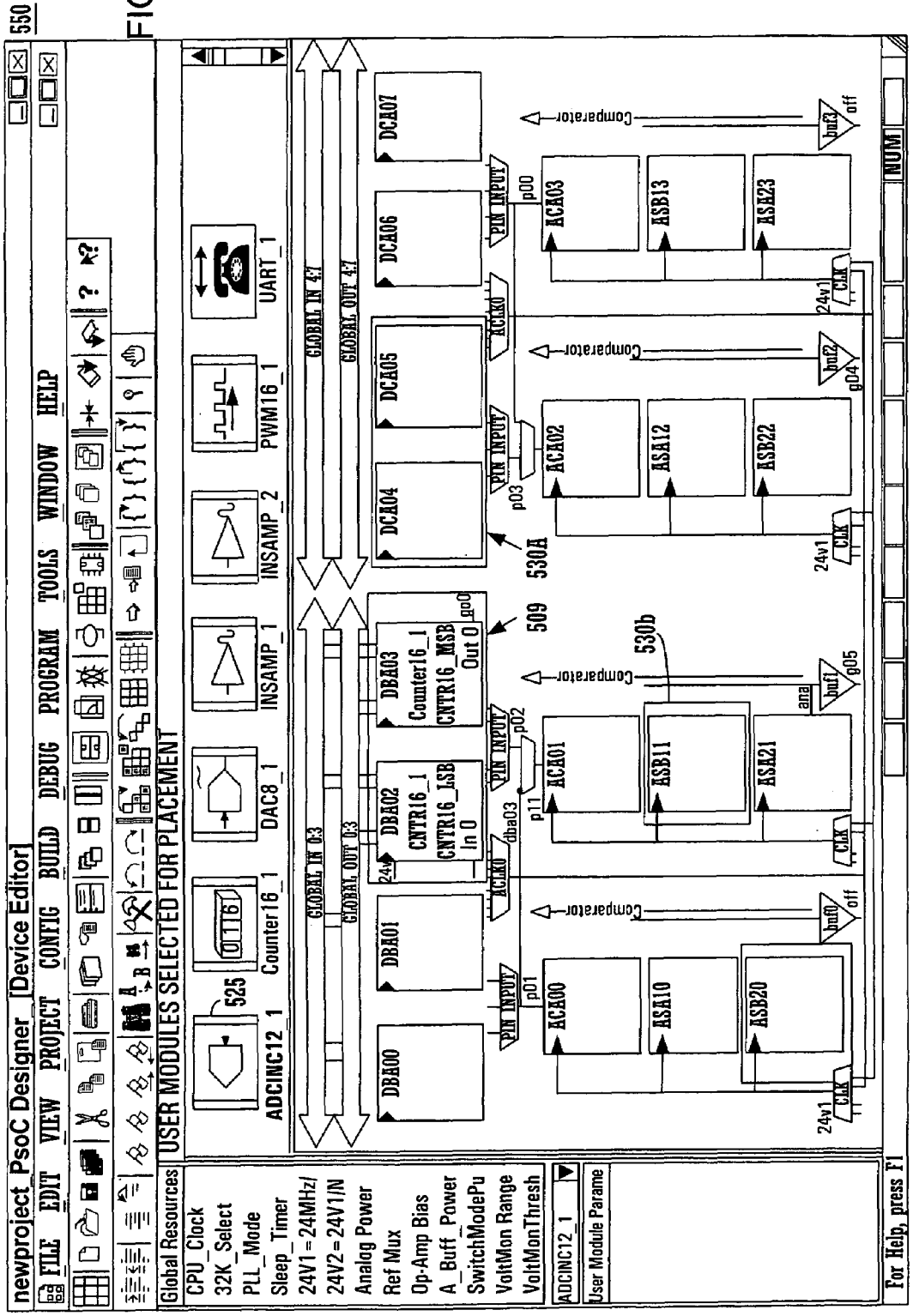
FIG. 5D illustrates an exemplary screen diagram of a next placement iteration procedure of an embodiment of the present invention where a subject user module is selected and the analog portion of the second placement is maintained while the digital portion is iterated to a next placement (third).

FIG. 5D illustrates an example computer screen diagram 540 of the next placement iterator process in accordance with one embodiment of the present invention where the user invokes a next placement iteration for module icon 525 (the "ADCINC"). In particular, the user uses the cursor control device to select digital resource 530a. This causes the cross hatching behind the digital resources 530a to change colors from the cross hatching behind the analog resource 520b. Once selected, the user clicks the "next placement" icon 590, this causes the digital resource 530a to move from its initial location in FIG. 5B to position 509 (an occupied position). The user clicks the icon 590 again thereby causing the digital resource 530a to appear in its position as shown in FIG. 5D. FIG. 5D therefore illustrates a third possible placement for the selected user module 525. By selecting the digital resource 530a before pressing the next placement icon 590, the user decoupled the placement of the digital versus analog resources. In other words, the analog resource 530b remained fixed from FIG. 5C to FIG. 5D.

Figure 5E:
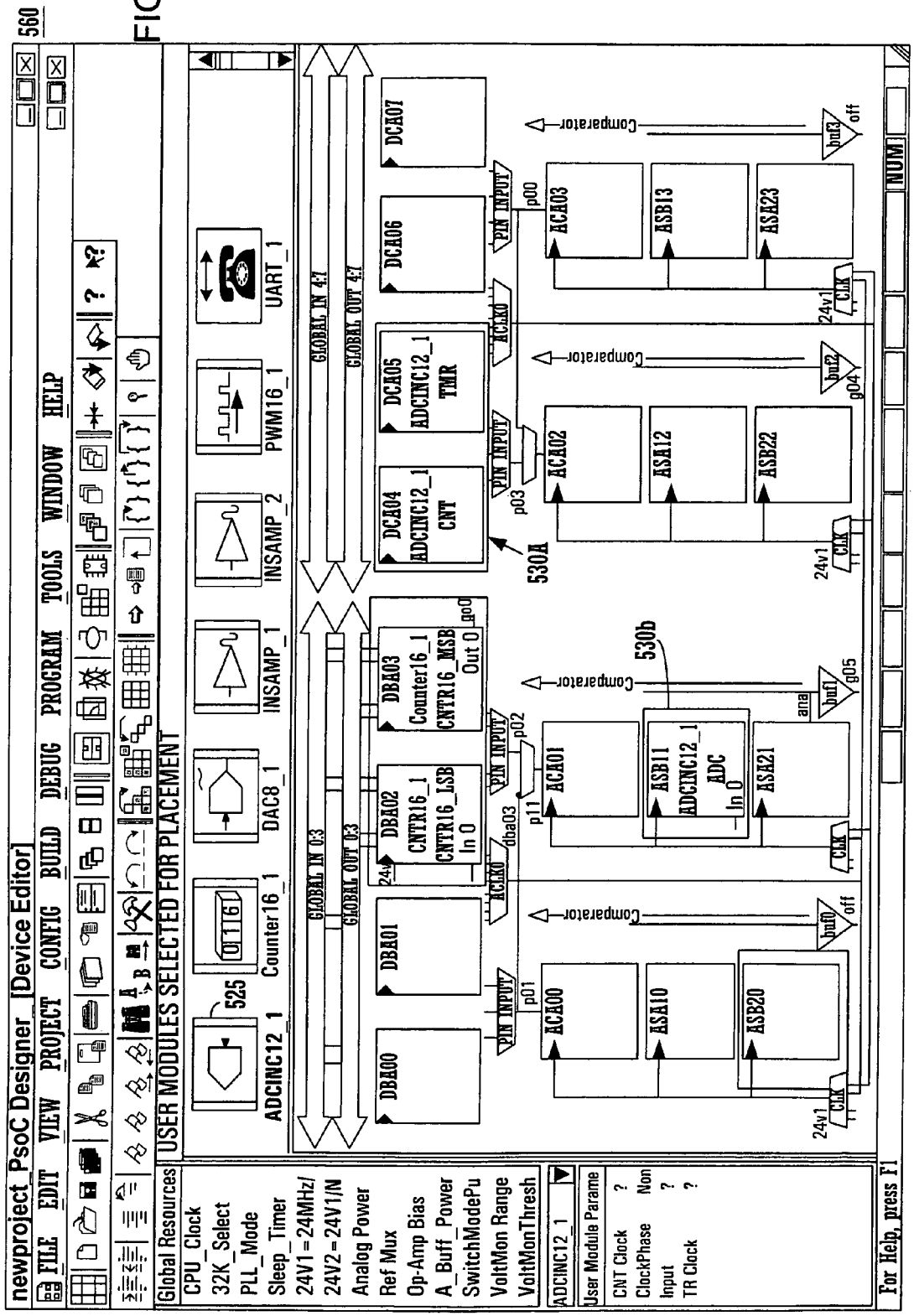
FIG. 5E illustrates an exemplary screen diagram of a next placement iteration procedure of an embodiment of the present invention where a subject user module is placed using the third placement of FIG. 5D.

FIG. 5E illustrates an example computer screen diagram 560 of the next placement iterator process in accordance with one embodiment of the present invention where the user then places the user module 525. In accordance with the graphical user interface, the user then selects the "place user module" icon 595 and the user module 525 becomes placed using the last possible placement. In accordance with placing, a color ring appears around the module icon 525. Further, the hardware resources 530 appear in a matching color and they now have labels ("ADCINC . . . ") that correspond to the placed icon 525.

By decoupling the digital from the analog resources during the next placement iteration process, the present invention reduces the number of possible placements that have to be cycled through by the user before the desired placement is found.

The foregoing descriptions of specific embodiments of the invention have been presented for purposes of illustration and description. They are not intended to be exhaustive or to limit the invention to the precise embodiments disclosed, and naturally many modifications and variations are possible in light of the above teaching. The embodiments were chosen and described in order to explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A computer implemented method of matching a selectable user module with plurality of programmable hardware resources associated with a programmable integrated circuit comprising:

displaying said selectable user module, wherein said user module is a representation of a configuration of a programmable circuit for implementation on said programmable integrated circuit;

displaying said plurality of programmable hardware resources associated with a programmable integrated circuit;

in response to a selection of said selectable user module, comparing a description of a hardware resource requirement of said selectable user module with a description of said plurality of programmable hardware resources associated with said programmable integrated circuit;

in response to said comparing, determining a plurality of allowed programmable hardware resources of the programmable integrated circuit satisfying the hardware resource requirement of said programmable circuit each allowed programmable hardware resource for implementing said programmable circuit of said selectable user module; and graphically depicting a first allowed programmable hardware resource of said plurality of allowed programmable hardware resources within said displayed plurality of programmable hardware resources wherein said first allowed programmable hardware resource graphically associated with said selectable user module.

2. The method according to claim 1 wherein the description of the hardware resource requirement of said selectable user module is represented as XML data.

3. The method according to claim 1 wherein the description of the plurality of programmable hardware resources are represented as XML data.

4. The method according to claim 1 wherein said graphically depicting said first allowed programmable hardware resource comprises visually highlighting said first allowed programmable hardware resource within said displayed plurality of programmable hardware resources.

5. The method according to claim 1 further comprising graphically depicting a second allowed programmable resource of said plurality of allowed programmable hardware resources within said displayed plurality of programmable hardware resources.

6. The method according to claim 1 further comprising identifying a plurality of disallowed programmable hardware resources associated with said programmable integrated circuit wherein the disallowed resources represents unavailable resources associated with said programmable integrated circuit that otherwise satisfies the hardware resource requirement of said selectable user module.

7. The method according to claim 6 further comprising graphically depicting the plurality of disallowed programmable hardware resource using said graphical user interface.

8. The method according to claim 5 wherein said graphically depicting said second allowed programmable resource comprises highlighting said second allowed programmable resource within said displayed plurality of programmable hardware resources.

9. The method according to claim 1 further comprising updating the description of the hardware resource requirements of said selectable user module.

10. The method according to claim 9 wherein said updating is performed in response to changes in a hardware resource requirement of said selectable user module.

11. The method according to claim 1 further comprising adding an additional selectable user module to the description of the hardware resource requirement of said selectable user module.

12. The method according to claim 1 further comprising updating the description of the plurality of programmable hardware resources associated with said programmable integrated circuit.

13. The method according to claim 12 further comprising adding an additional chip description to the description of the plurality of programmable hardware resources associated with said programmable integrated circuit.

14. An apparatus comprising:
a user module description database containing a description of a hardware resource requirement of a user module;
a hardware description database coupled to the user module description database and containing a description of a pre-existing hardware resource of a programmable integrated circuit;
a resource placement locator coupled to the user module description database and configured to compare the description of the hardware resource requirement of the user module with the description of the pre-existing hardware resource of the programmable integrated circuit; and
software for generating data to be displayed, said data depicting hardware resources of said programmable integrated circuit and depicting a plurality of allowed hardware resources of said programmable integrated circuit, wherein each of said plurality of allowed hardware resources satisfies the hardware resource requirement for implementing said programmable circuit of said user module, and wherein said data graphically depicts at least one of said plurality of allowed hardware resources with said hardware resources of said programmable integrated circuit and said data is further operable to graphically associate said one of said plurality of allowed hardware resources of said programmable integrated circuit to said user module.

15. The apparatus according to claim 14 wherein the user module description database is represented as XML data.

16. The apparatus according to claim 14 wherein said data further graphically depicts another allowed programmable resource of said plurality of allowed programmable hardware resources within said hardware resources of said programmable integrated circuit.

17. A computer implemented method of determining hardware resources for an electronic design comprising:
displaying a plurality of pre-existing programmable hardware resources associated with a programmable electronic device;
selecting an electronic design represented as a user module of predefined functionality implementable on said programmable electronic device;
in response to said selecting, accessing a data description of hardware resources required for implementing said user module on said programmable electronic device;
accessing data descriptions of said plurality of pre-existing programmable hardware resources of said programmable electronic device on which to implement said user module;
comparing said data description of said user module with said data descriptions of said plurality of pre-existing programmable hardware resources to determine a plurality of allowed programmable hardware resources that satisfies a hardware resource requirement of said programmable electronic device for implementing a programmable circuit of said user module, and wherein a first allowed programmable hardware resource of said plurality of allowed programmable hardware resources is graphically depicted with said displayed plurality of programmable hardware resources and wherein said comparing automatically determines potential placement options of said user module on said programmable electronic device, wherein each potential placement option is operable to implement said user module; and
in response to said comparing, graphically associating said selected user module to said first allowed programmable hardware resource of said plurality of allowed programmable hardware resources.

18. A method as described in claim 17 further comprising:
displaying on a graphical user interface, a first potential placement of said potential placement options by graphically depicting said first allowed programmable hardware resource; and
in response to a user selecting a next placement icon, displaying on said graphical user interface, a second potential placement of said potential placement options by graphically depicting a second allowed programmable hardware resource of said plurality of allowed programmable hardware resources.

19. A method as described in claim 18 wherein potential placement options are displayed using visual attributes and wherein said programmable electronic device is a programmable microcontroller device.

20. A method as described in claim 17 wherein said user module requires one pre-existing programmable hardware resource to place.

21. A method as described in claim 17 wherein said user module requires two pre-existing programmable hardware resources to place.

22. A method as described in claim 17 wherein said plurality of pre-existing programmable hardware resources comprise a plurality of pre-existing analog programmable hardware resources and a plurality of pre-existing digital programmable hardware resources.

23. A method as described in claim 17 wherein said comparing automatically prunes out pre-existing programmable hardware resources that do not satisfy requirements of said user module.

24. A method as described in claim 17 wherein said data descriptions are created in XML.

25. A computer system comprising a processor coupled to a bus and a memory coupled to said bus and containing instructions that implement a method of determining hardware resources for an electronic design comprising:
  displaying a plurality of pre-existing programmable hardware resources associated with a programmable electronic device;
  selecting an electronic design represented as a user module of predefined functionality implementable on said programmable electronic device;
  in response to said selecting, accessing a data description of hardware resources required for implementing said user module on said programmable electronic device;
  accessing data descriptions of a plurality of pre-existing programmable hardware resources of said programmable electronic device on which to implement said user module;
  comparing said data description of said user module with said data descriptions of said plurality of pre-existing programmable hardware resources to determine a plurality of allowed programmable hardware resources that satisfies a hardware resource requirement of said programmable electronic device for implementing a programmable circuit of said user module; and
  graphically depicting a first allowed programmable hardware resource said plurality of allowed programmable hardware resources with said displayed plurality of programmable hardware resources and wherein said comparing automatically determines potential placement options of said user module on said programmable electronic device, wherein each potential placement option is operable to implement said user module; and
  in response to said comparing, graphically associating said selected user module to said first allowed programmable hardware resource of said plurality of allowed programmable hardware resources.

26. A computer system as described in claim 25 wherein said method further comprises:
  displaying on a graphical user interface, a first potential placement of said potential placement options by graphically depicting said first allowed programmable hardware resource; and
  in response to a user selecting a next placement icon, displaying on said graphical user interface, a second potential placement of said potential placement options by graphically depicting a second allowed programmable hardware resource of said plurality of allowed programmable hardware resources.

27. A computer system as described in claim 26 wherein potential placement options are displayed using visual attributes and wherein said programmable electronic device is a programmable microcontroller device.

28. A computer system as described in claim 25 wherein said user module requires one pre-existing programmable hardware resource to place.

29. A computer system as described in claim 25 wherein said user module requires two pre-existing programmable hardware resources to place.

30. A computer system as described in claim 25 wherein said plurality of pre-existing programmable hardware resources comprise a plurality of pre-existing analog programmable hardware resources and a plurality of pre-existing digital programmable hardware resources.

31. A computer system as described in claim 25 wherein said comparing automatically prunes out pre-existing programmable hardware resources that do not satisfy requirements of said user module.

32. A computer system as described in claim 25 wherein said data descriptions are created in XML.

* * * * *